(12) United States Patent
Sonoda et al.

(10) Patent No.: US 10,009,565 B2
(45) Date of Patent: Jun. 26, 2018

(54) CURRENT/VOLTAGE CONVERSION CIRCUIT AND IMAGING APPARATUS

(71) Applicant: Sony Corporation, Tokyo (JP)

(72) Inventors: Takahiro Sonoda, Kanagawa (JP); Atsushi Suzuki, Kanagawa (JP)

(73) Assignee: Sony Corporation, Tokyo (JP)

(*) Notice: Subject to any disclaimer, the term of this patent is extended or adjusted under 35 U.S.C. 154(b) by 453 days.

(21) Appl. No.: 14/421,043

(22) PCT Filed: Aug. 8, 2013

(86) PCT No.: PCT/JP2013/071537
§ 371 (c)(1),
(2) Date: Feb. 11, 2015

(87) PCT Pub. No.: WO2014/030551
PCT Pub. Date: Feb. 27, 2014

(65) Prior Publication Data
US 2015/0244962 A1 Aug. 27, 2015

(30) Foreign Application Priority Data
Aug. 23, 2012 (JP) ................................ 2012-183940

(51) Int. Cl.
*H01J 40/14* (2006.01)
*H04N 5/3745* (2011.01)
(Continued)

(52) U.S. Cl.
CPC ........... *H04N 5/37455* (2013.01); *G01T 1/17* (2013.01); *G01T 1/2018* (2013.01);
(Continued)

(58) Field of Classification Search
CPC ......... G01J 1/44; G01J 1/46; G01J 2001/4406
(Continued)

(56) References Cited

U.S. PATENT DOCUMENTS

| 5,233,180 A | 8/1993 | Tsuruta et al. |
| 7,408,143 B2 * | 8/2008 | Yokoyama ................ H03F 3/08 250/201.5 |

(Continued)

FOREIGN PATENT DOCUMENTS

| CN | 1662040 A | 8/2005 |
| EP | 1 569 278 A2 | 8/2005 |

(Continued)

OTHER PUBLICATIONS

Extended European Search Report dated Jul. 8, 2016 for corresponding European Application No. 13 831 304.4.

(Continued)

*Primary Examiner* — Kevin Pyo
(74) *Attorney, Agent, or Firm* — Michael Best & Friedrich LLP

(57) ABSTRACT

An imaging apparatus 10 includes an imaging panel 11 formed by arranging imaging element units 20 included in one pixel or a plurality of pixels, in a two-dimensional matrix form. Each of the imaging element units 20 includes an imaging element 30 which converts an incident electromagnetic wave to a current, and a current/voltage conversion circuit 40A which converts the current from the imaging element to a voltage.

11 Claims, 49 Drawing Sheets

(51) Int. Cl.
   *G01T 1/20*    (2006.01)
   *H01L 27/146*  (2006.01)
   *H04N 5/369*   (2011.01)
   *G01T 1/17*    (2006.01)
   *H04N 5/378*   (2011.01)

(52) U.S. Cl.
   CPC .. *H01L 27/14612* (2013.01); *H01L 27/14661* (2013.01); *H04N 5/3698* (2013.01); *H04N 5/378* (2013.01); *H04N 5/3745* (2013.01)

(58) Field of Classification Search
   USPC ............ 250/214 R, 214 A, 214 SW, 214 LS, 250/208.1
   See application file for complete search history.

(56) References Cited

U.S. PATENT DOCUMENTS

2005/0218299 A1    10/2005   Olsen et al.
   2006/0249659 A1*   11/2006   Takano .................. H04N 3/155
                                                         250/214 R
   2008/0073548 A1    3/2008    Denton et al.
   2011/0108704 A1*   5/2011    Kim ...................... H04N 9/045
                                                         250/208.1

FOREIGN PATENT DOCUMENTS

JP    2004-125532 A      4/2004
   JP    2009-219538 A      10/2009
   JP    2010-098621        4/2010
   WO    WO-00/55919 A1     9/2000
   WO    WO-2004/019609 A2  3/2004

OTHER PUBLICATIONS

Murari, Kartikeya, et al., "A CMOS In-Pixel CTIA High-Sensitivity Fluorescence Imager" IEEE Transactions on Biomedical Circuits and Systems, vol. 5, No. 5, Oct. 2011, pp. 449 to 458.

Kleinfelder, Stuart, et al., "High-Speed CMOS Image Sensor Circuits With In Situ Frame Storage" IEEE Transactions on Nuclear Science, vol. 51, No. 4, Aug. 2004, pp. 1648 to 1656.

Chinese Office Action dated May 17, 2017 for corresponding Chinese Application No. 201380043759.1.

* cited by examiner

FIG. 2A    [STEP-100] (START)
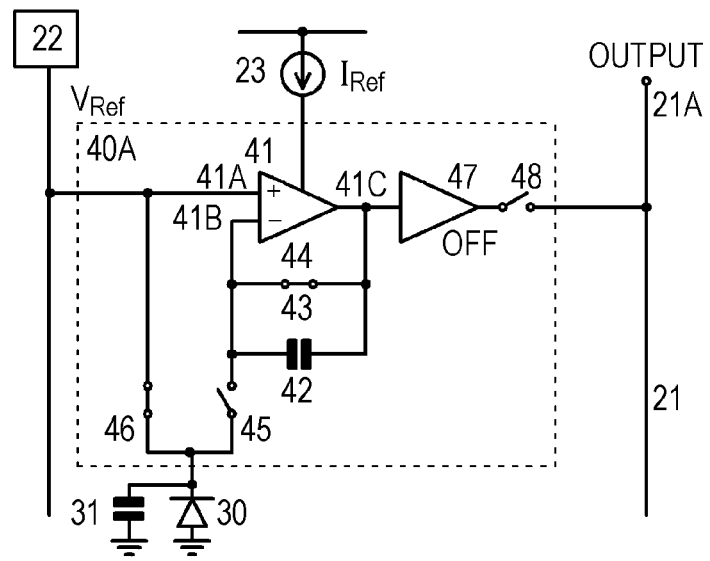
FIG. 2B    [STEP-100] (END)
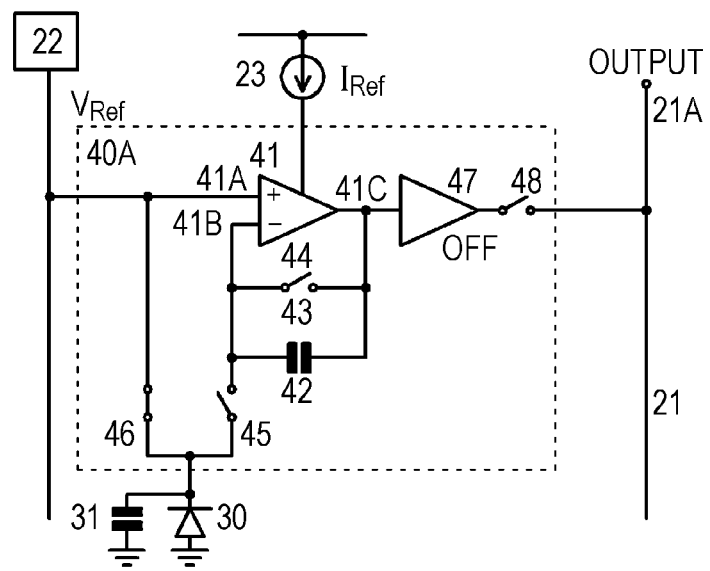

FIG. 3A  [STEP-110]
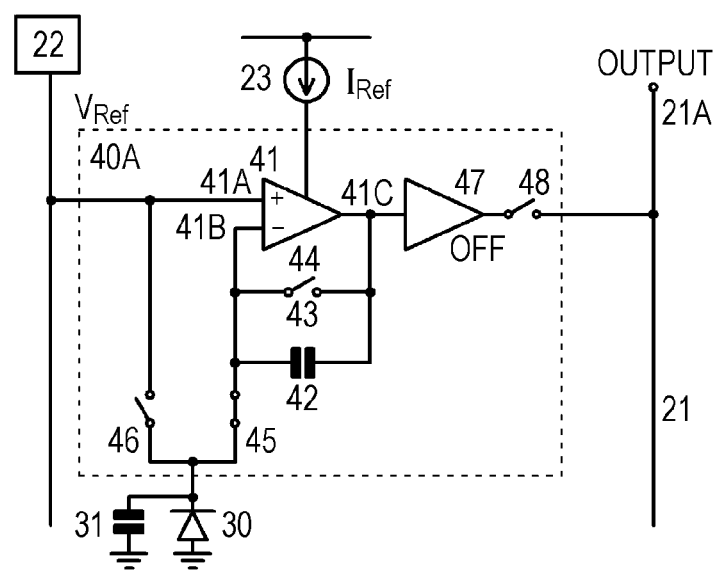
FIG. 3B  [STEP-120]
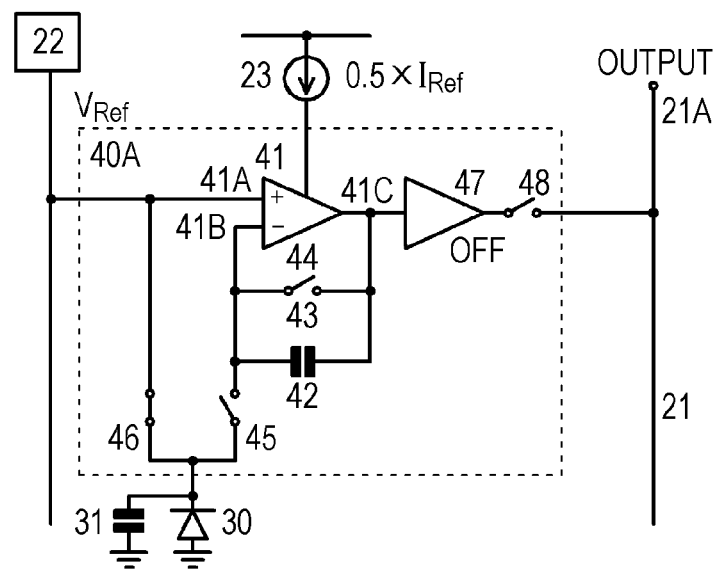

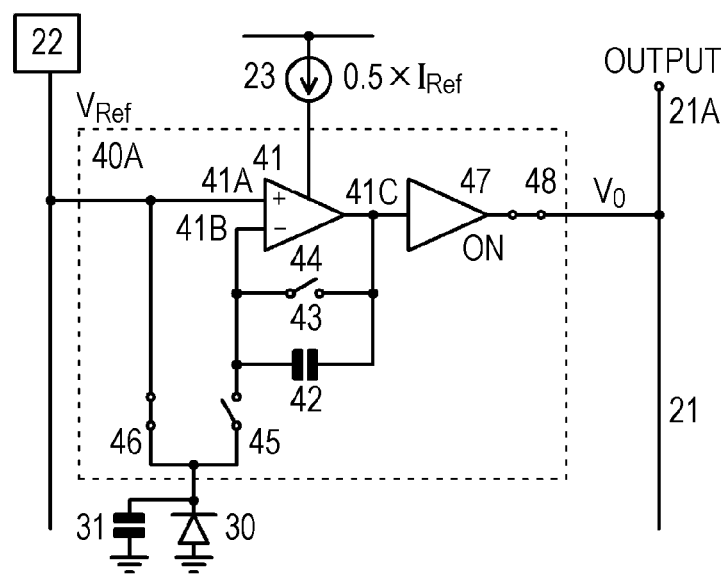
FIG. 4A  [STEP-130]
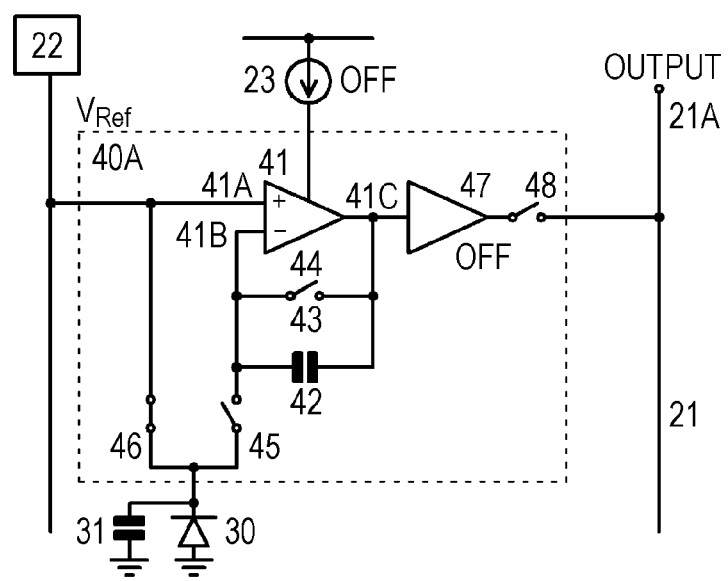
FIG. 4B  [STEP-140]

FIG. 9A        [STEP-300] (START)
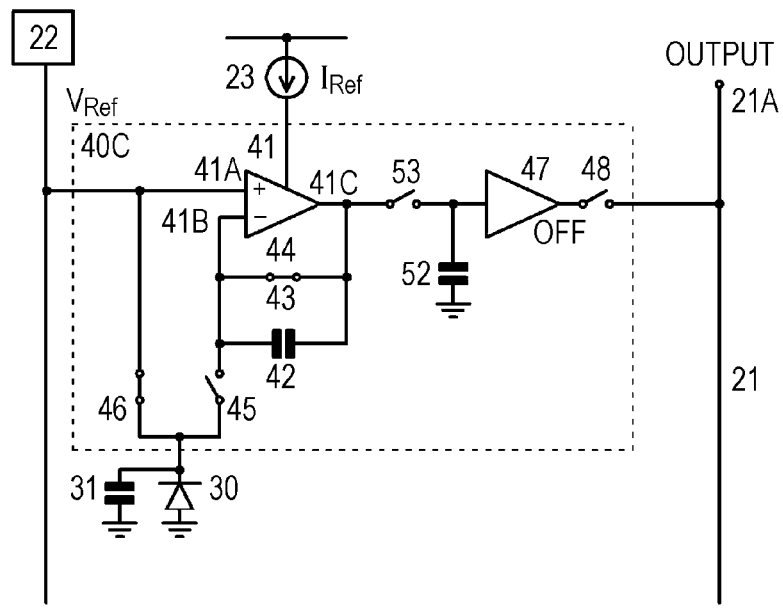
FIG. 9B        [STEP-300] (END)
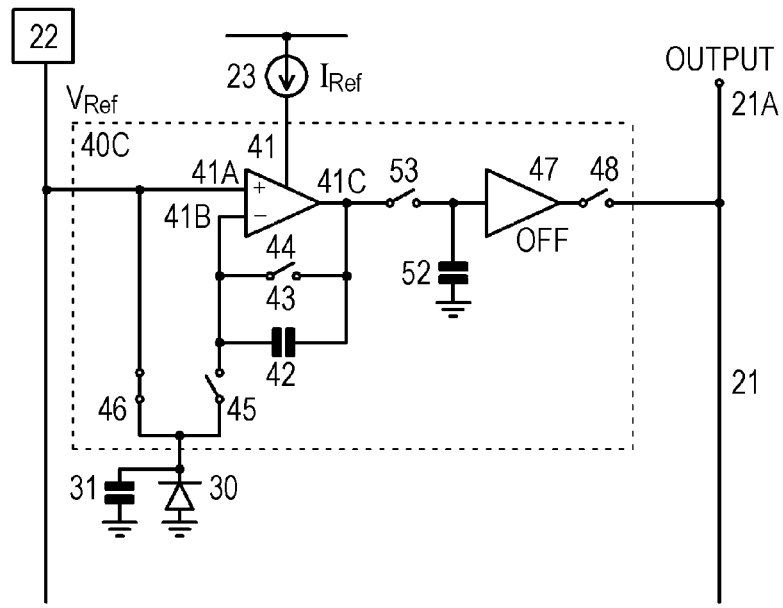

FIG. 10A  [STEP-310]
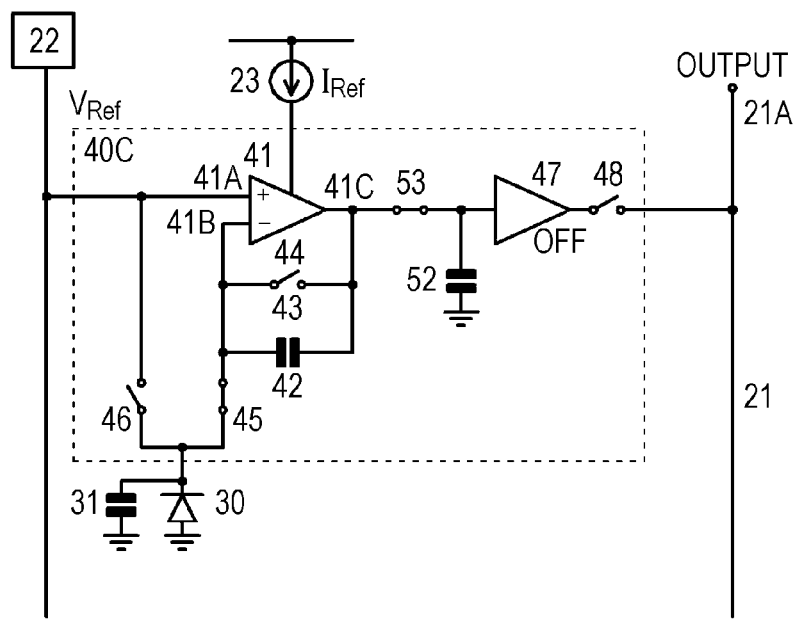
FIG. 10B  [STEP-320]
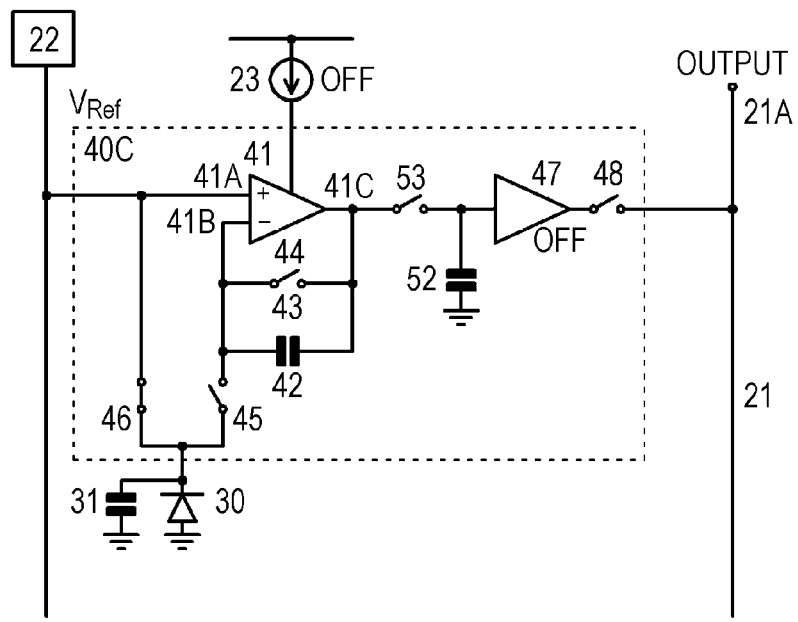

FIG. 11A [STEP-330]
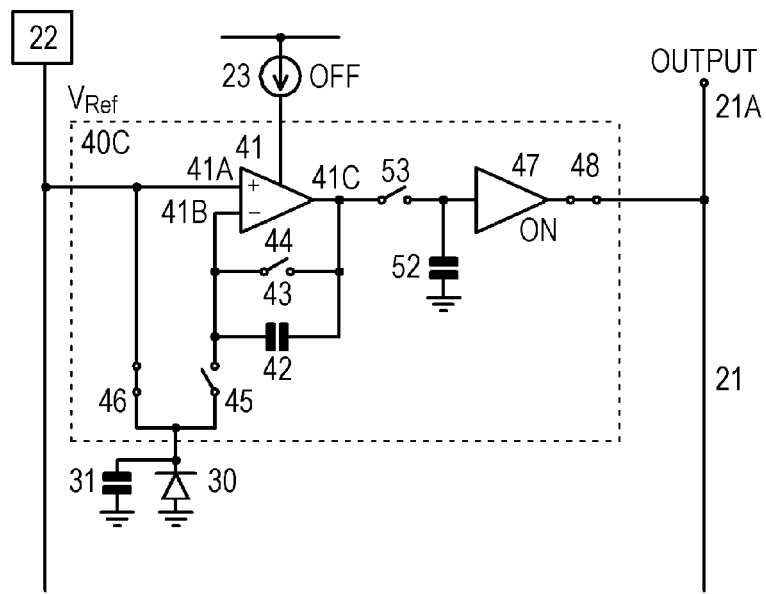
FIG. 11B [STEP-340]
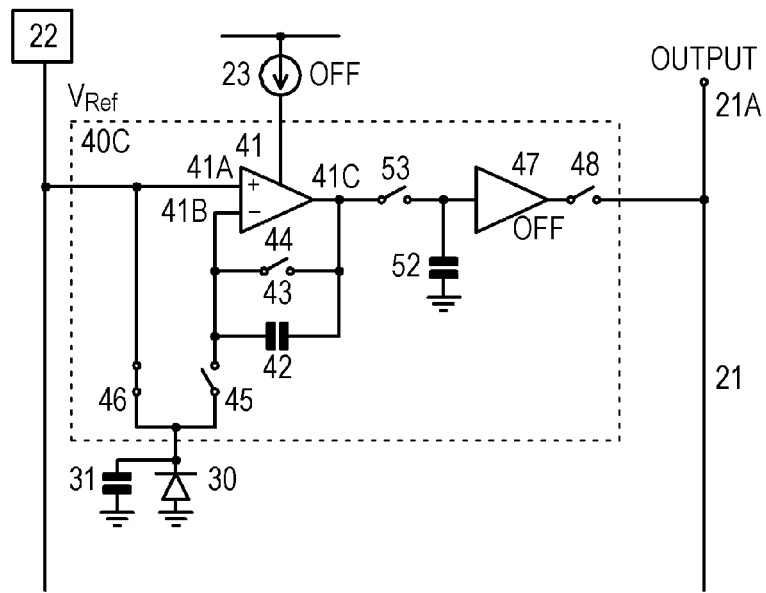

[STEP-400]

[STEP-410]

[STEP-420]

[STEP-430]

[STEP-440]

[STEP-450]

[STEP-460]

FIG. 24A [STEP-500]
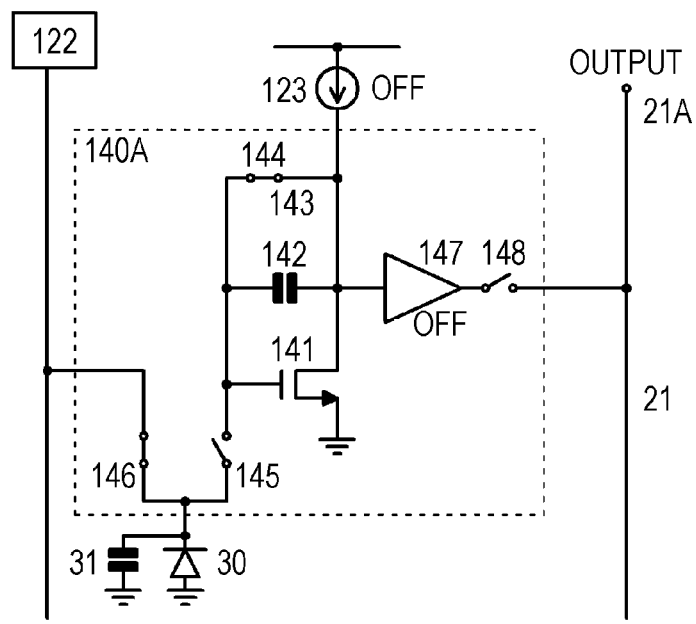
FIG. 24B [STEP-510]
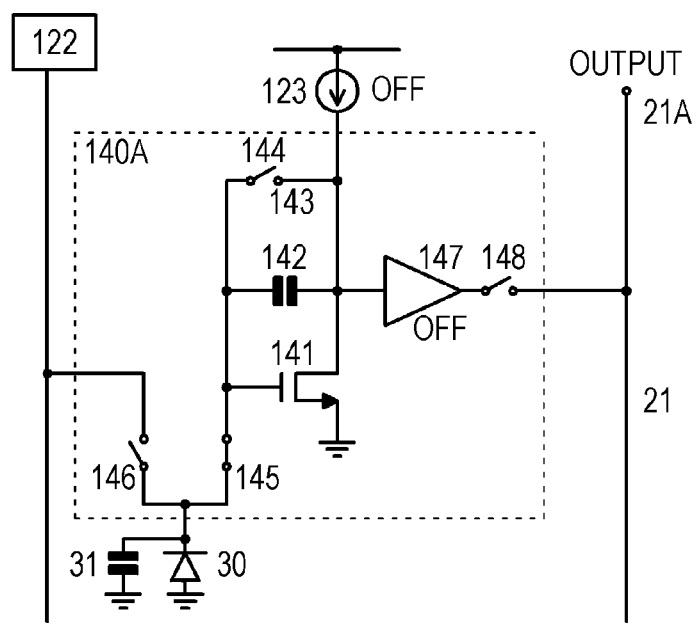

FIG. 25A  [STEP-520]
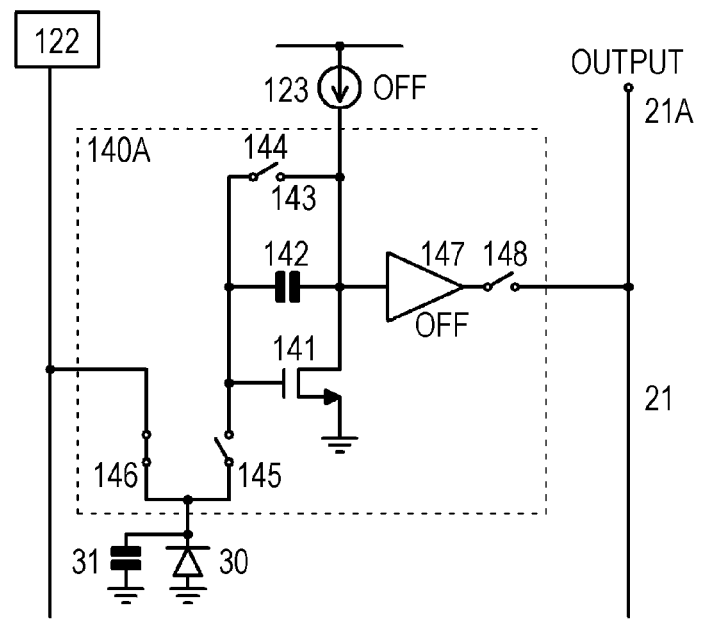
FIG. 25B  [STEP-530]
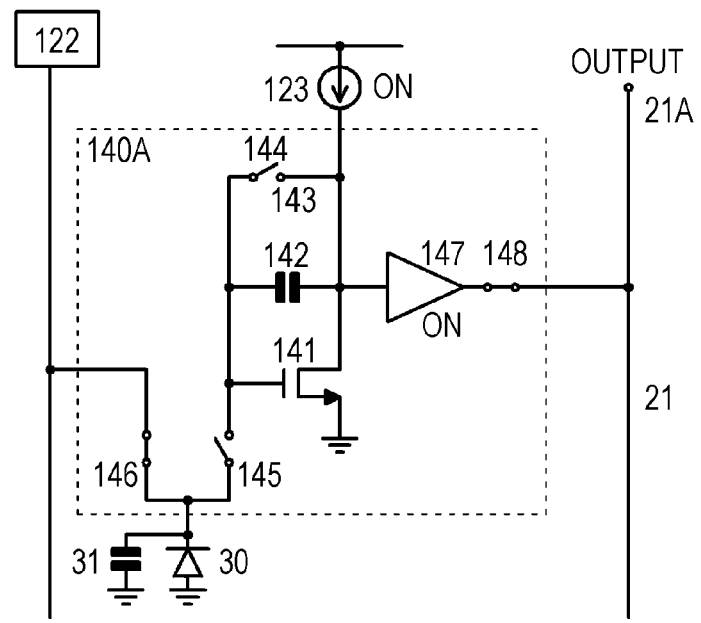

[STEP-540]

FIG. 28A [STEP-600]
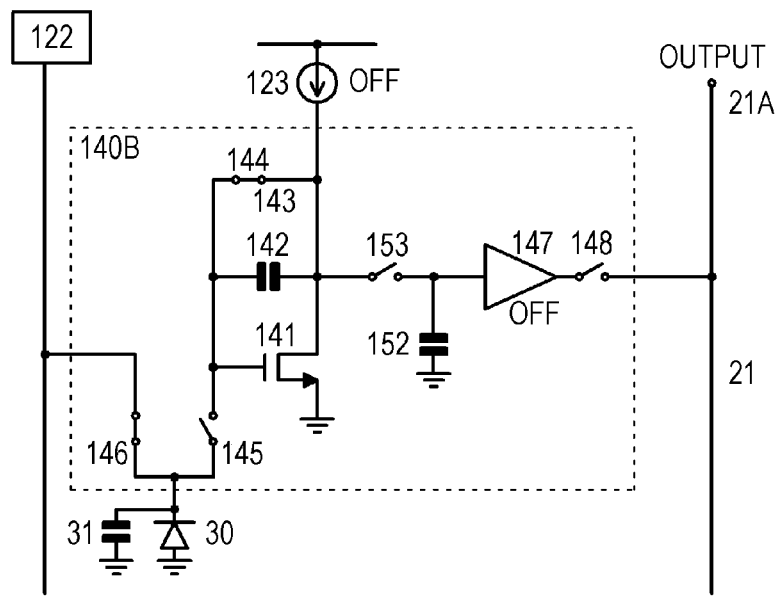
FIG. 28B [STEP-610]
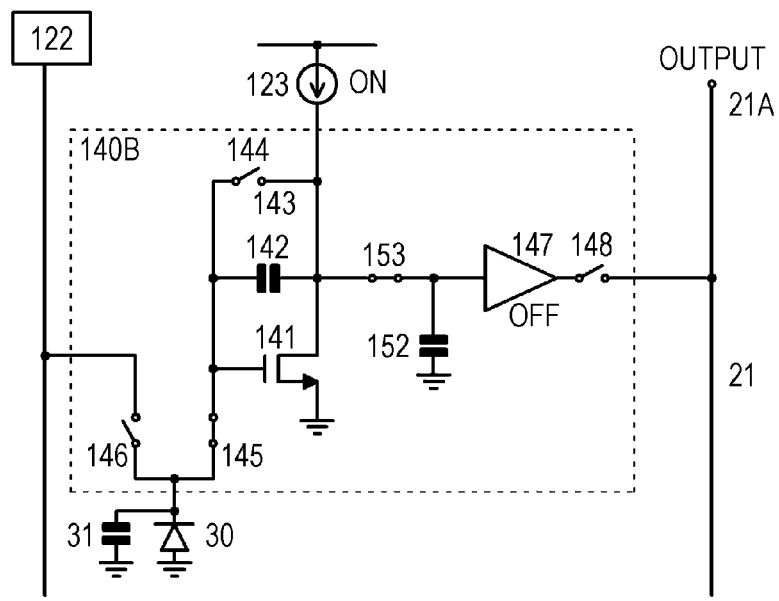

FIG. 29A  [STEP-620]
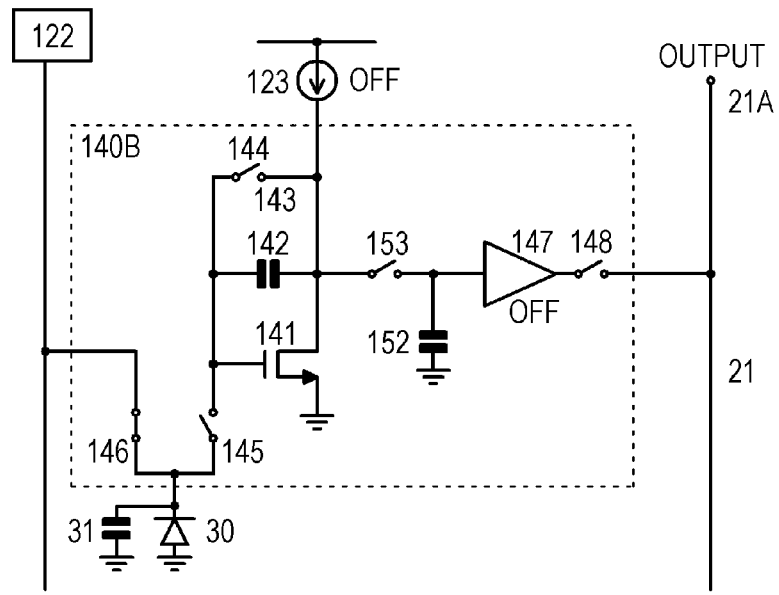
FIG. 29B  [STEP-630]
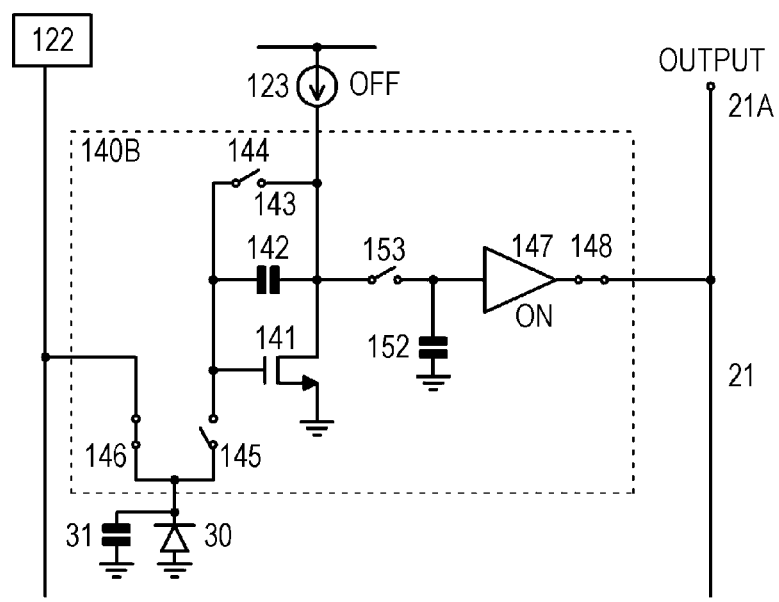

[STEP-640]

[STEP-700]

[STEP-710]

[STEP-720]

[STEP-730]

[STEP-740]

[STEP-750]

[STEP-760]

CURRENT/VOLTAGE CONVERSION CIRCUIT AND IMAGING APPARATUS

TECHNICAL FIELD

The present disclosure relates to a current/voltage conversion circuit, and an imaging apparatus including such a current/voltage conversion circuit. More specifically, the present disclosure relates to a current/voltage conversion circuit that can be applied to an X-ray flat panel detector, and an imaging apparatus (X-ray flat panel detector) including such a current/voltage conversion circuit.

BACKGROUND ART

It is possible to recognize the internal state of a living body or a substance by irradiating the living body or the substance with X-rays and detecting and visualizing transmitted X-rays on the basis of the transmitted X-ray imaging technique. In the transmitted X-ray imaging technique, a photographic plate or a photograph film is used to detect the transmitted X-rays. In recent years, however, development of an X-ray flat panel detector has been advanced energetically (see, for example, Japanese Patent Application Laid-Open No. 2010-098621). As for the X-ray flat panel detector, there are a direct conversion system in which X-rays are converted directly to an electric signal and an indirect conversion system in which X-rays are converted to an optical signal and then converted to an electric signal. In either of the systems, filmless imaging can be implemented and it becomes possible to conduct picture quality improvement and diagnosis supporting. Furthermore, there is an advantage that, for example, electronic filing and networking are facilitated, and utilization in various fields is expected.

An equivalent circuit diagram of an example of imaging elements and a current/voltage conversion circuit included in an X-ray flat panel detector is shown in FIG. 50. Here, a plurality of (M×N) imaging elements 230 arranged in X and Y directions in a two-dimensional matrix form convert incident X-rays to a current directly (direct conversion system) or indirectly (indirect conversion system). A plurality of (M) imaging elements 230 arranged in the X direction are connected to one current/voltage conversion circuit 240 via switch circuits 232 and a row wiring line 233. The current/voltage conversion circuit 240 converts a current from each imaging element to a voltage in order. In FIG. 50, reference numeral 231 denotes parasitic capacitance (capacitance value: $C_{pd}$) the imaging element 230 has. The current/voltage conversion circuit 240 is a well-known current/voltage conversion circuit (a kind of integral circuit) including an operational amplifier 241, a capacitor section 242 (capacitance value $C_{int}$), and a short-circuiting circuit 243 having a reset switch circuit 244. A reference voltage $V_{Ref}$ is input to a non-inverting input section of the operational amplifier 241. Furthermore, an inverting input section of the operational amplifier 241 is connected to the row wiring line 233. The capacitor section 242 and the short-circuiting circuit 243 are connected in parallel, and connected to an inverting input section and an output section of the operational amplifier 241.

When starting the current/voltage conversion circuit 240, the switch circuit 232 is brought into an off state and the reset switch circuit 244 is brought into an on state, and thereby potential across the capacitor section 242 is set equal to $V_{Ref}$. Then, the reset switch circuit 244 is brought into an off state, and X-rays are incident on the imaging element 230. The imaging element 230 converts an incident electromagnetic wave to a current. This current is stored in the parasitic capacitance 231 as charge $Q_{in}$. When the switch circuit 232 is brought into an on state, the charge $Q_{in}$ stored in the parasitic capacitance 231 is transferred to the capacitor section 242 in the current/voltage conversion circuit 240 via the row wiring line 233. Denoting an output voltage which is output from the current/voltage conversion circuit 240 by $V_O$, finally $V_O = Q_{in}/C_{int}$ is obtained.

CITATION LIST

Patent Document

Patent Document 1: Japanese Patent Application Laid-Open No. 2010-098621

SUMMARY OF THE INVENTION

Problems to be Solved by the Invention

Note that, in the conventional imaging elements 230 and current/voltage conversion circuit 240 illustrated in FIG. 50, a plurality of (M) imaging elements 230 arranged in the X direction are connected to one current/voltage conversion circuit 240 via the row wiring line 233. Therefore, parasitic capacitance $C_{line}$ of the row wiring line 233 becomes large in proportion to the number (M) of the imaging elements. Noise in a voltage signal which is output from the current/voltage conversion circuit 240 is amplified to $[1+(C_{line}+\Sigma C_{pd-m})/C_{int}]$ times. In the conventional system in which the parasitic capacitance $C_{line}$ of the row wiring line 233 is large, it is difficult to obtain a high S/N ratio. Note that, "$\Sigma C_{pd-m}$" means the sum total of the parasitic capacitances 231 of the M imaging elements 230. Furthermore, since the wiring length of the row wiring line 233 which are high in sensitivity is long, there is also a problem of weakness to external disturbance.

Therefore, an object of the present disclosure is to provide a current/voltage conversion circuit that can give a high S/N ratio and that is strong to external disturbance, and an imaging apparatus including such a current/voltage conversion circuit.

Solutions to Problems

An imaging apparatus according to the present disclosure for achieving the object includes an imaging panel formed by arranging imaging element units included in one pixel or a plurality of pixels, in a two-dimensional matrix form, and each of the imaging element units includes:

an imaging element configured to convert an incident electromagnetic wave to a current; and a current/voltage conversion circuit configured to convert the current from the imaging element to a voltage.

A current/voltage conversion circuit according to a first aspect of the present disclosure for achieving the object is a current/voltage conversion circuit connected to an imaging element configured to convert an incident electromagnetic wave to a current, and configured to convert the current from the imaging element to a voltage, the current/voltage conversion circuit including:

an operational amplifier including an output section connected to an output section of the current/voltage conversion circuit, and including a first input section and a second input section;

a capacitor section connected at a first end of the operational amplifier to the output section of the operational amplifier and at a second end thereof to the second input section of the operational amplifier; and a first switch circuit and a second switch circuit configured to operate complementarily, the first input section of the operational amplifier being connected to a first power supply, and an output section of the imaging element being connected to the second end of the capacitor section via the first switch circuit and connected to a second power supply via the second switch circuit. Note that, "a first switch circuit and a second switch circuit operate complementarily" means that the second switch circuit is brought into an off state when the first switch circuit is in an on state and the second switch circuit is brought into an on state when the first switch circuit is in an off state. The same holds true in the ensuing description as well.

A current/voltage conversion circuit according to a second aspect of the present disclosure for achieving the object is a current/voltage conversion circuit connected to an imaging element configured to convert an incident electromagnetic wave to a current, and configured to convert the current from the imaging element to a voltage, the current/voltage conversion circuit including:

a field effect transistor;

a capacitor section; and a first switch circuit and a second switch circuit configured to operate complementarily, a first end of the capacitor section being connected to a one source/drain region of the field effect transistor, a second end of the capacitor section being connected to a gate electrode of the field effect transistor, the one source/drain region of the field effect transistor being connected to a first power supply and an output section of the current/voltage conversion circuit, and an output section of the imaging element being connected to the second end of the capacitor section via the first switch circuit and connected to a second power supply via the second switch circuit.

Effects of the Invention

Each imaging element unit in an imaging panel according to the present disclosure includes one imaging element and one current/voltage conversion circuit. Furthermore, a current/voltage conversion circuit according to a first aspect or a second aspect of the present disclosure is provided in correspondence with one imaging element. Unlike a conventional technique in which one current/voltage conversion circuit is provided for a plurality of imaging elements, therefore, a problem such as noise in a voltage signal which is output from the current/voltage conversion circuit caused by a row wiring line does not occur. As a result, a high S/N ratio can be obtained, and reduction of the irradiation quantity of the electromagnetic wave can be attempted. In addition, it is possible to provide an imaging element unit which is strong against external disturbance as well.

BRIEF DESCRIPTION OF DRAWINGS

FIGS. 2A and 2B are equivalent circuit diagrams for explaining an operation of an imaging element unit included in the imaging apparatus in Embodiment 1.

FIGS. 3A and 3B are equivalent circuit diagrams for explaining the operation of the imaging element unit included in the imaging apparatus in Embodiment 1 subsequent to FIG. 2B.

FIGS. 4A and 4B are equivalent circuit diagrams for explaining the operation of the imaging element unit included in the imaging apparatus in Embodiment 1 subsequent to FIG. 3B.

FIGS. 9A and 9B are equivalent circuit diagrams for explaining an operation of the imaging element unit included in the imaging apparatus in Embodiment 3.

FIGS. 10A and 10B are equivalent circuit diagrams for explaining the operation of the imaging element unit included in the imaging apparatus in Embodiment 3 subsequent to FIG. 9B.

FIGS. 11A and 11B are equivalent circuit diagrams for explaining the operation of the imaging element unit included in the imaging apparatus in Embodiment 3 subsequent to FIG. 10B.

FIGS. 24A and 24B are equivalent circuit diagrams for explaining an operation of an imaging element unit included in the imaging apparatus in Embodiment 5.

FIGS. 25A and 25B are equivalent circuit diagrams for explaining the operation of the imaging element unit included in the imaging apparatus in Embodiment 5 subsequent to FIG. 24B.

FIGS. 28A and 28B are equivalent circuit diagrams for explaining an operation of an imaging element unit included in the imaging apparatus in Embodiment 6.

FIGS. 29A and 29B are equivalent circuit diagrams for explaining the operation of the imaging element unit included in the imaging apparatus in Embodiment 6 subsequent to FIG. 28B.

MODE FOR CARRYING OUT THE INVENTION

Figure 1:
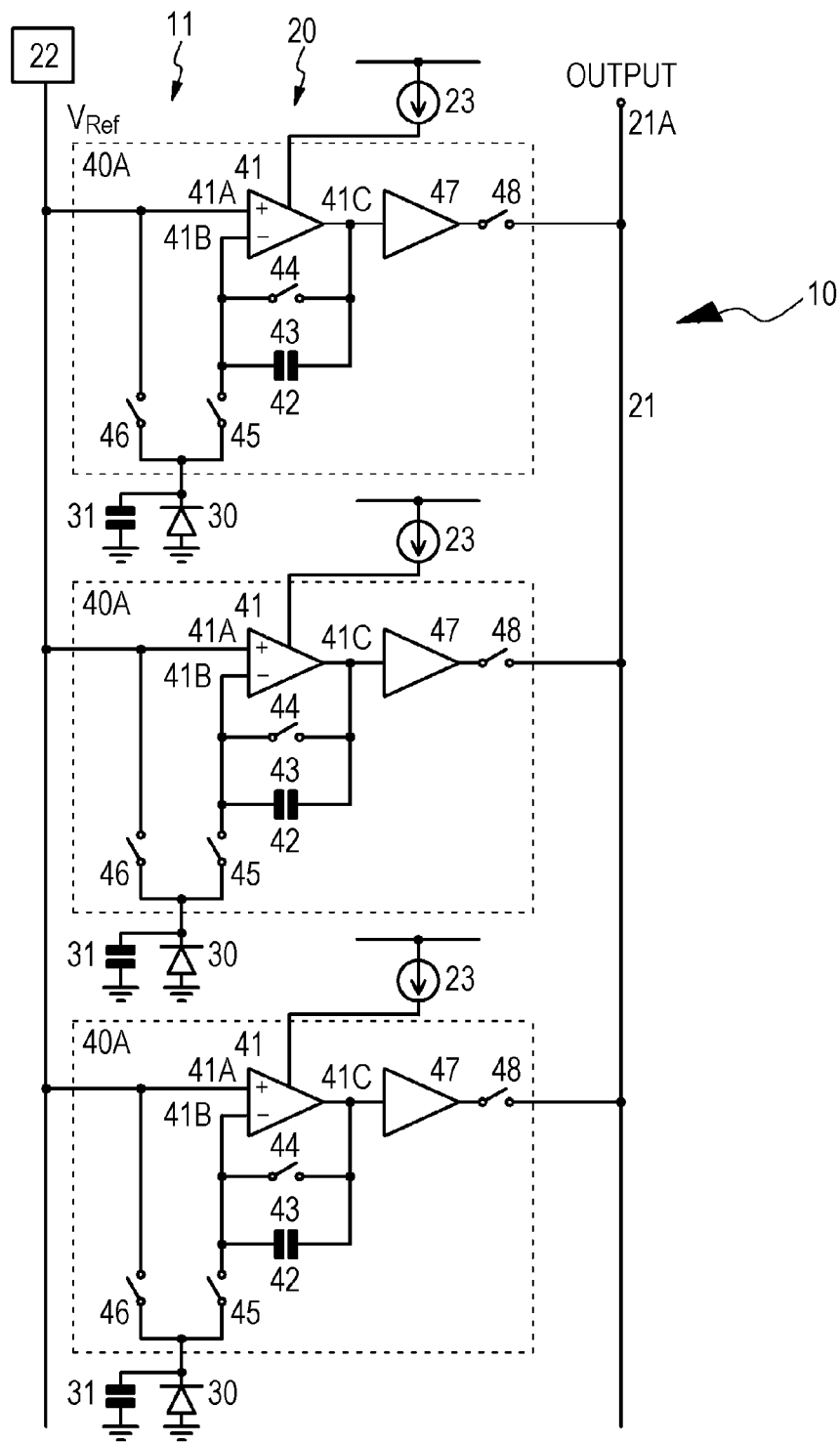
FIG. 1 is an equivalent circuit diagram of a portion of an imaging apparatus in Embodiment 1.

Hereafter, the present disclosure will be described on the basis of Embodiments with reference to the drawings. However, the present disclosure is not restricted to the Embodiments, but various numerical values and materials are examples. Note that, description follows the sequence described below.

1. Description concerning an imaging apparatus according to the present disclosure, a current/voltage conversion circuit according to a first aspect and a second aspect of the present disclosure, and the whole 2. Embodiment 1 (an imaging apparatus according to the present disclosure and a current/voltage conversion circuit according to the first aspect of the present disclosure)

3. Embodiment 2 (a modification of Embodiment 1)

4. Embodiment 3 (a different modification of Embodiment 1)

5. Embodiment 4 (a further different modification of Embodiment 1)

6. Embodiment 5 (an imaging apparatus according to the present disclosure and a current/voltage conversion circuit according to the second aspect of the present disclosure)

7. Embodiment 6 (a modification of Embodiment 5)

8. Embodiment 7 (a different modification of Embodiment 5)

9. Embodiment 8 (a modification of Embodiment 1 to Embodiment 7) and others

[Description Concerning an Imaging Apparatus According to the Present Disclosure, a Current/Voltage Conversion Circuit According to a First Aspect and a Second Aspect of the Present Disclosure, and the Whole]

An imaging apparatus according to the present disclosure may possibly include a current/voltage conversion circuit which includes an operational amplifier and a capacitor section, the operational amplifier which includes an output section connected to an output section of the current/voltage conversion circuit, and includes a first input section and a second input section, and a first end of the capacitor section which is connected to the output section of the operational amplifier, and a second end of the capacitor section which is connected to the second input section of the operational amplifier and an output section of the imaging element. Note that, the imaging apparatus according to the present disclosure having such a form is referred to as "imaging apparatus according to a first aspect of the present disclosure" for convenience in some cases. Here, the first input section corresponds to a non-inverting input section, and the second input section corresponds to an inverting input section. The same holds true in the above-described current/voltage conversion circuit according to the first aspect of the present disclosure.

It is possible to provide the imaging apparatus according to the first aspect of the present disclosure with the following form. The current/voltage conversion circuit further includes a short-circuiting circuit having a reset switch circuit, and the capacitor section is connected in parallel with the short-circuiting circuit.

It is possible to provide the imaging apparatus according to the first aspect of the present disclosure or the current/voltage conversion circuit according to the first aspect of the present disclosure including the favorable form with the following form. Charge is stored in the capacitor section by a current from an imaging element.

It is possible to provide the imaging apparatus according to the first aspect of the present disclosure or the current/voltage conversion circuit according to the first aspect of the present disclosure including the current/voltage conversion circuit which includes a plurality of capacitor sections and a changeover switch circuit, and each of the plurality of capacitor sections which is connected to the output section of the operational amplifier and the second input section of the operational amplifier via the changeover switch circuit. According to such a configuration, it is possible to change the sensitivity of the current/voltage conversion circuit with ease.

Furthermore, the imaging apparatus according to the first aspect of the present disclosure including the favorable form and configuration includes the current/voltage conversion circuit further including a first switch circuit and a second switch circuit, the first input section of the operational amplifier being connected to a first power supply, the output section of the imaging element being connected to the second end of the capacitor section via the first switch circuit and connected to a second power supply via the second switch circuit, and the first switch circuit and the second switch circuit operating complementarily. The imaging apparatus according to the first aspect of the present disclosure or the current/voltage conversion circuit according to the first aspect of the present disclosure having such a configuration further includes the current/voltage conversion circuit further including a second capacitor section and a third switch circuit which conducts same operation as the first switch circuit, and a first end of the second capacitor section being connected to the output section of the operational amplifier via the third switch circuit, alternatively the current/voltage conversion circuit further including a second capacitor section, a third switch circuit, a fourth switch circuit, a fifth switch circuit, and a sixth switch circuit, a first end of the second capacitor section being connected to the output section of the operational amplifier via the third switch circuit, a second end of the second capacitor section being connected to the second input section of the operational amplifier via the fourth switch circuit and connected to the first power supply via the fifth switch circuit, and the sixth switch circuit being connected between the second end of the capacitor section, and the first switch circuit and the second input section of the operational amplifier. Note that, in these configurations, charge based on the current from the imaging element is stored in the second capacitor section as well.

In addition, the imaging apparatus according to the first aspect of the present disclosure or the current/voltage conversion circuit according to the first aspect of the present disclosure including the favorable forms and configurations described heretofore includes the current/voltage conversion circuit further including a buffer circuit connected to the output section of the operational amplifier and the output section of the current/voltage conversion circuit. Specifically, an input section of the buffer circuit is connected to the output section of the operational amplifier, and an output section of the buffer circuit is connected to the output section of the current/voltage conversion circuit, and further connected to an output wiring line.

Alternatively the imaging apparatus according to the present disclosure includes the current/voltage conversion circuit including a field effect transistor and a capacitor section, a first end of the capacitor section being connected to a one source/drain region of the field effect transistor, and a second end of the capacitor section being connected to a gate electrode of the field effect transistor and an output section of the imaging element, and the one source/drain region of the field effect transistor being connected to a first power supply and an output section of the current/voltage conversion circuit. Note that, the imaging apparatus according to the present disclosure having such a form is referred to as "imaging apparatus according to a second aspect of the present disclosure" for convenience in some cases.

It is possible to provide the imaging apparatus according to the second aspect of the present disclosure with the following form. The current/voltage conversion circuit further includes a short-circuiting circuit having a reset switch circuit, and the capacitor section is connected in parallel with the short-circuiting circuit.

It is possible to provide the imaging apparatus according to the second aspect of the present disclosure or the current/voltage conversion circuit according to the second aspect of the present disclosure including the above-described favorable form with the following form. Charge is stored in the capacitor section by the current from the imaging element.

The imaging apparatus according to the second aspect of the present disclosure or the current/voltage conversion circuit according to the second aspect of the present disclosure including the above-described favorable form includes the current/voltage conversion circuit including a plurality of capacitor sections and a changeover switch circuit, and each of the plurality of capacitor sections being connected to the one source/drain region and the gate electrode of the field effect transistor via the changeover switch circuit. According to such a configuration, it is possible to change sensitivity of the current/voltage conversion circuit.

Furthermore, the imaging apparatus according to the second aspect of the present disclosure including the above-described form and configuration includes the current/voltage conversion circuit further including a first switch circuit and a second switch circuit, the output section of the imaging element being connected to the second end of the capacitor section via the first switch circuit and connected to a second power supply via the second switch circuit, and the first switch circuit and the second switch circuit operate complementarily. The imaging apparatus according to the second aspect of the present disclosure or the current/voltage conversion circuit according to the second aspect of the present disclosure having such a configuration further includes the current/voltage conversion circuit further including a second capacitor section and a third switch circuit which conducts same operation as the first switch circuit, and a first end of the second capacitor section being connected to the one source/drain region of the field effect transistor via the third switch circuit, alternatively, the current/voltage conversion circuit further including a second capacitor section, a third switch circuit, a fourth switch circuit, a fifth switch circuit, and a sixth switch circuit, a first end of the second capacitor section being connected to the one source/drain region of the field effect transistor via the third switch circuit, a second end of the second capacitor section being connected to the gate electrode of the field effect transistor via the fourth switch circuit and connected to a third power supply via the fifth switch circuit, and the sixth switch circuit being connected between the second end of the capacitor section, and the first switch circuit and the gate electrode of the field effect transistor. Note that, in these configurations, charge based upon the current from the imaging element is stored in the second capacitor section as well.

In addition, it is possible to provide the imaging apparatus according to the second aspect of the present disclosure or the current/voltage conversion circuit according to the second aspect of the present disclosure including the favorable form and configuration described heretofore with the following configuration. The current/voltage conversion circuit further includes a buffer circuit connected to the one source/drain region of the field effect transistor and the output section of the current/voltage conversion circuit. In other words, in an imaging panel formed by arranging M×N imaging element units in a two-dimensional matrix form, N output wiring lines are arranged, and M imaging element units are connected to each output wiring line.

In addition, it is possible to provide the imaging apparatus according to the first aspect or the second aspect of the present disclosure or the current/voltage conversion circuit according to the first aspect or the second aspect of the present disclosure including the favorable form and configuration described heretofore with a configuration that the imaging element unit is shaped integrally, that is, a configuration that the imaging element and the current/voltage conversion circuit are formed integrally.

In addition, it is possible to provide the imaging apparatus according to the first aspect or the second aspect of the present disclosure including the favorable form and configuration described heretofore with a form that a wiring layer including wiring lines is further included and each imaging element unit is connected to a wiring line formed in the wiring layer via solder bumps. Note that, in such a form, the wiring layer including wiring lines, the current/voltage conversion circuit, and the imaging element are laminated, for example, in this order, and the imaging element is disposed on the incidence side of the electromagnetic wave.

In the imaging panel formed by arranging M×N imaging element units in a two-dimensional matrix form, (4096, 4096), (3072, 3072), and (2048, 2048) can be exemplified as the value of (M, N). Furthermore, 43 cm×43 cm, 32 cm×32 cm, and 21 cm×21 cm can be exemplified as dimensions of an external shape of the imaging panel.

As described above, the imaging panel in the imaging apparatus according to the present disclosure is formed by arranging M×N imaging element units in the two-dimensional matrix form. N output wiring lines extending in an X direction are arranged, and M imaging element units are connected to each output wiring line. Furthermore, M drive wiring lines extending in a Y direction are arranged, and N imaging element units are connected to each drive wiring line. In other words, M drive wiring lines and N output wiring lines are arranged in a matrix form (lattice form) as a whole. Imaging element units are arranged in intersection regions of the drive wiring lines and the output wiring lines. The drive wiring lines are connected to a well-known drive circuit, and the output wiring lines are connected to a well-known signal processing circuit.

Note that, in a case where an imaging element unit includes a plurality of pixels, one imaging element unit may include $m_0$ pixels (where $m_0$ is an integer of at least 2 and $1 \times 10^3$ or less).

The imaging apparatus according to the first aspect or the second aspect of the present disclosure including the favorable form and configuration described heretofore may have a form in which an electromagnetic wave passes through a fluorescent material layer (scintillator layer) and incident on the imaging element or may have a form in which an electromagnetic wave is incident directly on the imaging element. In the former case, $CaWO_4$, $CdWO_4$, CsI:Tl, $Gd_2O_2S$:Tb, ZnS:Ag, and $(Gd, M, Eu)_2O_3$ can be exemplified as a fluorescent material included in the fluorescent material layer (scintillator layer). Here, "M" is a rare earth element. The electromagnetic wave (for example, specifically, X-rays) is converted to, for example, ultraviolet rays, visible light, and infrared rays in the range of 300 nm to 800 nm. Each imaging element unit in the imaging apparatus may have a lens to focus light passed through the fluorescent material layer (scintillator layer) and incident on the imaging element onto the imaging element. The imaging element may include, for example, a well-known photodiode. In the latter case, the imaging element may have an electromagnetic wave conversion layer including semiconductor crystal such as, for example, amorphous selenium semiconductor to cause an electromagnetic wave incident on the electromagnetic wave conversion layer to generate hole-electron pairs in the electromagnetic wave conversion layer and let a current flow.

Components themselves such as circuits and parts included in the imaging apparatus according to the present disclosure and the current/voltage conversion circuit according to the first aspect or the second aspect of the present disclosure described heretofore may be well-known circuits and parts. Components such as circuits and parts that drive the imaging apparatus or the imaging element unit may also be well-known circuits and parts.

Embodiment 1

Embodiment 1 relates to an imaging apparatus, more specifically relates to an imaging apparatus according to a first aspect of the present disclosure, and a current/voltage conversion circuit according to the first aspect of the present disclosure. An equivalent circuit diagram (an equivalent circuit diagram of three imaging element units connected to one output wiring line) of a portion of an imaging apparatus in Embodiment 1 is illustrated in FIG. 1. Note that, the current/voltage conversion circuit is equivalent to a charge/voltage conversion circuit.

An imaging apparatus (specifically, an X-ray flat panel detector) 10 in Embodiment 1 includes an imaging panel 11 in which imaging element units 20 each included in one pixel or a plurality of pixels (specifically in Embodiment 1, one pixel) are arranged in a two-dimensional matrix form (see, FIG. 39 as well), and each imaging element unit 20 includes (a) an imaging element 30 which converts an incident electromagnetic wave (specifically, X-rays) to a current (charge), and (b) a current/voltage conversion circuit 40A which converts a current (charge) from the imaging element 30 to a voltage. Note that, the X-ray flat plane detector and the general configuration and structure can be made the well-known configuration and structure.

The current/voltage conversion circuit 40A is a kind of integral circuit. The current/voltage conversion circuit 40A includes an operational amplifier 41 and a capacitor section 42, and further includes a short-circuiting circuit 43 having a reset switch circuit 44. Here, the operational amplifier 41 includes an output section 41C connected to an output section of the current/voltage conversion circuit 40A, a first input section (non-inverting input section) 41A, and a second input section (inverting input section) 41B. A first end of the capacitor section 42 is connected to the output section 41C of the operational amplifier 41, and a second end of the capacitor section 42 is connected to the second input section 41B of the operational amplifier 41 and an output section (cathode) of the imaging element 30. In addition, the capacitor section 42 is connected in parallel with the short-circuiting circuit 43.

The current/voltage conversion circuit 40A further includes a first switch circuit 45 and a second switch circuit 46.

The first input section 41A of the operational amplifier 41 is connected to a first power supply.

The output section of the imaging element 30 is connected to the second end of the capacitor section 42 via the first switch circuit 45 and connected to a second power supply via the second switch circuit 46.

The first switch circuit 45 and the second switch circuit 46 operate complementarily. Note that, when the first switch circuit 45 is in the on state, the second switch circuit 46 is brought into the off state. When the first switch circuit 45 is in the off state, the second switch circuit 46 is brought into the on state. In Embodiment 1 to Embodiment 4, the first power supply and the second power supply include same power supply 22. A reference voltage $V_{Ref}$ is output from the power supply 22.

Furthermore, the current/voltage conversion circuit 40A in Embodiment 1 is connected to the imaging element 30 which converts an incident electromagnetic wave (specifically, X-rays) to a current (charge). The current/voltage conversion circuit 40A in Embodiment 1 is a current/voltage conversion circuit which converts a current (charge) from the imaging element 30 to a voltage. The current/voltage conversion circuit 40A in Embodiment 1 includes (A) the operational amplifier 41 including the output section 41C connected to the output section of the current/voltage conversion circuit 40A, and the first input section 41A and the second input section 41B, (B) the capacitor section 42 connected at the first end to the output section 41C of the operational amplifier 41 and connected at the second end to the second input section 41B of the operational amplifier 41, and (C) the first switch circuit 45 and the second switch circuit 46 which operate complementarily.

The first input section 41A of the operational amplifier 41 is connected to a first power supply.

The output section of the imaging element 30 is connected to the second end of the capacitor section 42 via the first switch circuit 45, and connected to a second power supply via the second switch circuit 46. Note that, the current/voltage conversion circuit 40A further includes (D) the short-circuiting circuit 43 having the reset switch circuit 44.

The capacitor section 42 is connected in parallel with the short-circuiting circuit 43.

An incident electromagnetic wave is converted to a current by the imaging element 30. Charge is stored in the capacitor section 42 by the current from the imaging element 30. Furthermore, the current/voltage conversion circuit 40A further includes a buffer circuit 47 connected to the output section of the current/voltage conversion circuit 40A and the output section 41C of the operational amplifier 41. In other words, an input section of the buffer circuit 47 is connected to the output section 41C of the operational amplifier 41, and an output section of the buffer circuit 47 is connected to the output section of the current/voltage conversion circuit 40A via an output switch circuit 48, and in addition connected to an output wiring line 21. The operational amplifier 41 is driven by a power supply 23 for operational amplifier.

The output wiring line 21 is connected to an image processing section which is not illustrated. The image processing section includes, for example, an A/D conversion section, a signal processing section, and a display control section. The A/D conversion section converts a voltage signal to a digital signal. The signal processing section conducts signal processing on the digital signal. The display control section exercises display control on image information subjected to the signal processing. The image processing section can include, for example, a personal computer.

The imaging element unit 20 is integrally shaped. In other words, the imaging element 30 and the current/voltage conversion circuit 40A are integrally formed. Note that, a concrete configuration and a structure of the imaging element unit will be described in Embodiment 8. Furthermore, as for components themselves such as circuits and parts included in the imaging apparatus 10, the imaging element 30, and the current/voltage conversion circuit 40A, well-known circuits and parts can be used. As for components such as circuits and parts that drive the imaging apparatus 10 or the imaging element unit 20 as well, well-known circuits and parts can be used. Therefore, detailed description will be omitted.

Figure 5:
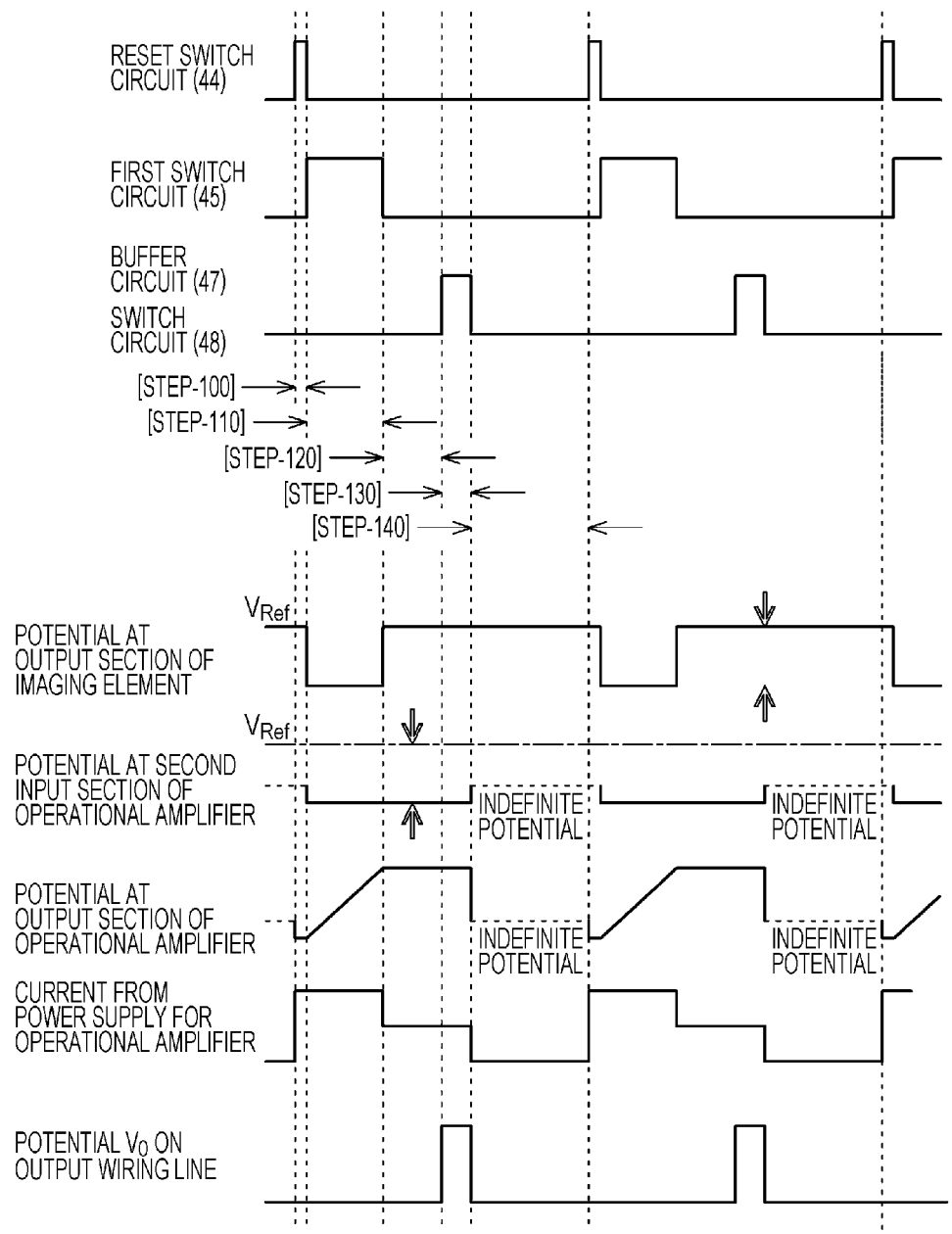
FIG. 5 is a diagram illustrating potentials at respective nodes in the imaging element unit included in the imaging apparatus in Embodiment 1.

Hereafter, operation of the imaging apparatus and the current/voltage conversion circuit in Embodiment 1 will be described with reference to FIG. 2A, FIG. 2B, FIG. 3A, FIG. 3B, FIG. 4A and FIG. 4B which are equivalent circuit diagrams of the current/voltage conversion circuit, FIG. 5 which illustrates potentials at respective nodes in the imaging element unit included in the imaging apparatus in Embodiment 1, and FIG. 6 which illustrates the sum total power dissipated in the M imaging element units connected to the output wiring line. Note that, in FIG. 5, FIG. 12, and FIG. 22, potentials sandwiched between white arrows correspond to an offset voltage of the operational amplifier 41.

[Step-100: Reset Mode]

First, initialization of the capacitor section 42 is conducted. Specifically, in a state in which a current $I_{Ref}$ from the power supply 23 for operational amplifier is supplied to the operational amplifier 41 and the operational amplifier 41 is driven, the reset switch circuit 44 is brought into the on state (see FIG. 2A). As a result, the capacitor section 42 is brought into a short-circuit state via the short-circuiting circuit 43 and the capacitor section 42 is reset. In other words, potential at each of ends of the capacitor section 42 becomes the reference voltage $V_{Ref}$. If a predetermined time elapses and resetting of the capacitor section 42 is completed, the reset switch circuit 44 is brought into the off state (see FIG. 2B). Note that, at [step-100], the imaging element 30 is disconnected from the current/voltage conversion circuit 40A and the output section (cathode) of the imaging element 30 is connected to the power supply 22 by bringing the first switch circuit 45 into the off state and bringing the second switch circuit 46 into the on state. Even if an electromagnetic wave (specifically, X-rays) is incident on the imaging element 30, therefore, charge is not stored in the capacitor section 42. Furthermore, the buffer circuit 47 is in an off state and the buffer circuit 47 is not driven, and the output switch circuit 48 is in an off state and the current/voltage conversion circuit 40A is disconnected from the output wiring line 21. [Step-100] to [Step-110] are conducted simultaneously in all imaging element units.

At [step-100], noise is generated in the second switch circuit 46. This noise is stored in parasitic capacitance 31 (capacitance value: $C_{pd}$) the imaging element 30 has, as charge ($=k \cdot T/C_{pd}$). Here, "k" is the Boltzmann constant, and "T" is the absolute temperature. At the time of start of the next [step-110], this charge ($k \cdot T/C_{pd}$) is increased by ($C_{pd}/C_{int}$) times and stored in the capacitor section 42. Note that, "$C_{int}$" is a capacitance value of the capacitor section 42.

[Step-110: Sampling Mode]

Then, the imaging element 30 is disconnected from the power supply 22, and the output section of the imaging element 30 is connected to the second input section 41B of the current/voltage conversion circuit 40A and the second end of the capacitor section 42 by bringing the first switch circuit 45 into the on state and bringing the second switch circuit 46 into the off state (see FIG. 3A). As a result, the incident electromagnetic wave is converted to a current by the imaging element 30, and charge is stored in the capacitor section 42 by the current from the imaging element 30.

At this [step-110], input referred noise $NZ_1$ generated by the operational amplifier 41 is increased by ($C_{pd}/C_{int}$) times and stored in the capacitor section 42.

[Step-120: Hold Mode]

At a time point when a predetermined time has elapsed, the imaging element 30 is disconnected from the current/voltage conversion circuit 40A and the output section (cathode) of the imaging element 30 is connected to the power supply 22 by bringing the first switch circuit 45 into the off state and bringing the second switch circuit 46 into the on state (see FIG. 3B). Even if an electromagnetic wave (specifically, X-rays) is incident on the imaging element 30, therefore, charge is not stored in the capacitor section 42. At this [step-120], for example, a current ($0.5 \times I_{Ref}$) from the power supply 23 for operational amplifier is supplied to the operational amplifier 41. As a result, the operational amplifier 41 can be driven, and it is possible to attempt to reduce the power dissipation in the whole of the current/voltage conversion circuit 40A. At [step-120], charge stored in the capacitor section 42 is held until [step-130] described below since [step-110] is completed.

[Step-120] and subsequent steps are conducted in the M imaging element units connected to the one output wiring line 21 extending in the X direction, in order. Specifically, M imaging element units 20 are connected to the output wiring line 21. An output voltage $V_O$ from a first imaging element unit 20, a second imaging element unit 20, a third imaging element unit 20, . . . , an m-th imaging element unit 20, an (m+1)-st imaging element unit 20, . . . , an M-th imaging element unit 20 in order is output to the output wiring line 21. Furthermore, in N output wiring lines 21, successive outputting of the output voltage $V_O$ to the output wiring line 21 is conducted. Furthermore, N imaging element units connected to one drive wiring line (not illustrated) extending in the Y direction are driven simultaneously.

At this [step-120], input referred noise generated by the operational amplifier 41 is included in input referred noise generated at [step-130] described below. Therefore, it is not necessary to consider the input referred noise at [step-120].

[Step-130: Output Mode]

If it is turn of the imaging element unit 20 to output, the buffer circuit 47 and the output switch circuit 48 are brought into the on state (see FIG. 4A). As a result, the current/voltage conversion circuit 40A is connected to the output wiring line 21, and an output voltage $V_O$ based upon charge stored in the capacitor section 42 is output to the output wiring line 21. In other words, the output voltage $V_O$ based upon the energy quantity of the incident electromagnetic wave is output to the output wiring line 21.

At this [step-130], input referred noise $NZ_2$ generated by the operational amplifier 41 and input referred noise $NZ_3$ generated by the buffer circuit 47 appear on an output terminal 21A of the output wiring line 21 via a low pass filter component of an output resistor of the buffer circuit 47 and parasitic capacitance of the output wiring line 21.

[Step-140: Sleep Mode]

Then, the buffer circuit 47 and the output switch circuit 48 are brought into the off state, and supply of the current from the power supply 23 for operational amplifier to the operational amplifier 41 is stopped (see FIG. 4B). At this [step-140], power dissipated in the imaging element unit 20 becomes approximately zero.

Noise $NZ_0$ in one operation period which is the sum total of noise in respective modes is given by Equation (1-1) below. Note that, α represents attenuation caused by a low pass filter component of the output resistor of the buffer circuit 47 and the parasitic capacitance of the output wiring line 21 at {step-130}, and there is a relation 0<α<<1.

$$NZ_0^2 = \qquad (1\text{-}1)$$
$$(k \cdot T / C_{pd}) \times (C_{pd} / C_{int})^2 + NZ_1^2 \times (C_{pd} / C_{int})^2 + (NZ_2^2 + NZ_3^2) \times \alpha^2$$

The input referred noise $NZ_1$ generated at [step-110] is noise in a state in which the operational amplifier 41 is driven with a current $I_{Ref}$. The input referred noise $NZ_2$ generated at [step-130] is noise in a state in which the operational amplifier 41 is driven with a current $0.5 \times I_{Ref}$. Therefore, a relation input referred noise $NZ_1$<input referred noise $NZ_2$ holds true. Here, it is supposed that $NZ_2 = \beta \times NZ_1$ In general, however, the greater part of noise generated in a MOS transistor circuit is inverse proportion to (current value)$^{1/2}$. Therefore, it is supposed that $1 < \beta < 2^{1/2}$ Equation (1-1) can be rewritten as follows.

$$NZ_0^2 = (k \cdot T / C_{pd}) \times (C_{pd} / C_{int})^2 + \qquad (1\text{-}2)$$
$$NZ_1^2 \times \{(C_{pd}/C_{int})^2 + \beta^2 \times \alpha^2\} + NZ_3^2 \times \alpha^2$$

If it is supposed here that $\alpha^2 \approx 0$, Equation (1-2) becomes following Equation (1-3).

$$NZ_0^2 = (k \cdot T/C_{pd}) \times (C_{pd}/C_{int})^2 + NZ_1^2 \times (C_{pd}/C_{int})^2 \quad (1\text{-}3)$$

In this way, it is found at [step-130] that noise occurrence is not aggravated even if the operational amplifier 41 is driven with the current of $0.5 \times I_{Ref}$. Therefore, power dissipated in the whole current/voltage conversion circuit 40A can be decreased without aggravating the noise occurrence. Note that, if noise occurrence can be allowed, it is also possible to drive the operational amplifier 41 with a current lower than $0.5 \times I_{Ref}$.

Figure 6:
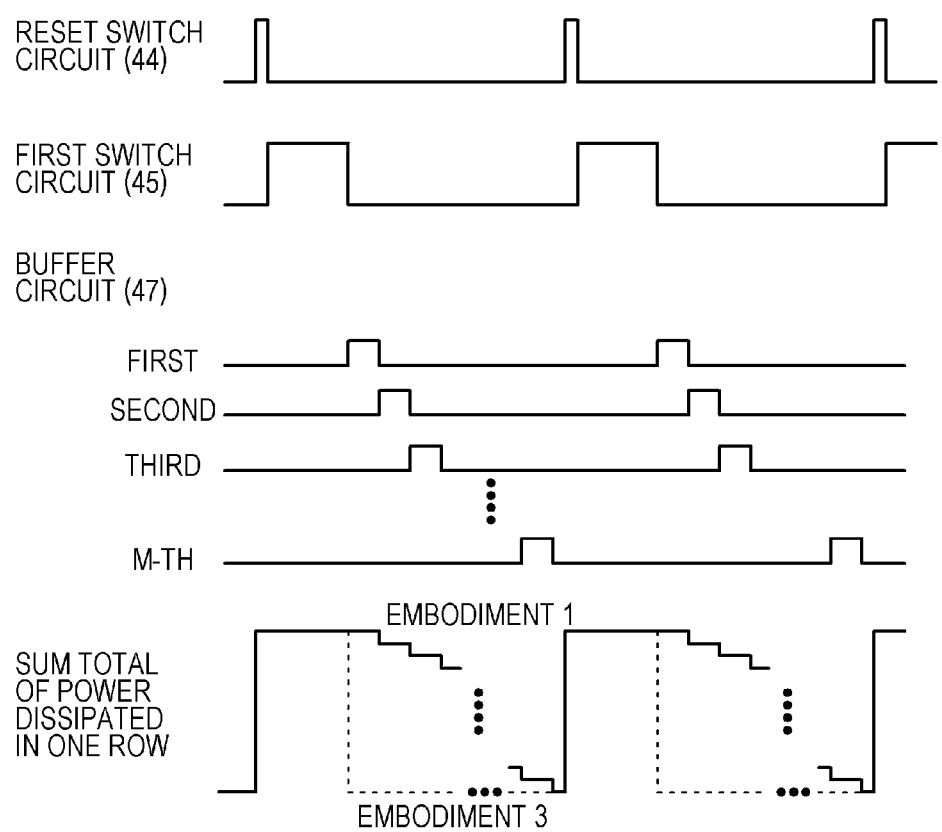
FIG. 6 is a diagram illustrating the sum total of power dissipated in M imaging element units included in imaging apparatuses in Embodiment 1 and Embodiment 3 connected to an output wiring line.

Furthermore, the sum total of power dissipated in the M imaging element units connected to the output wiring line and included in the imaging apparatus in Embodiment 1 is indicated by solid lines in FIG. 6. At [step-120] to [step-140] in which the M imaging element units operate in the order of the first imaging element unit 20, the second imaging element unit 20, the third imaging element unit 20, . . . , the m-th imaging element unit 20, the (m+1)-st imaging element unit 20, . . . , the M-th imaging element unit 20 successively after [step-100] and [step-110] common to the M imaging element units (that is, in which the M imaging elements operate simultaneously) are completed, the sum total of power dissipated in the M imaging element units is maximized when the first imaging element unit 20 operates at [step-120] to [step-140] and minimized when the M-th imaging element unit 20 operates at [step-120] to [step-140]. In other words, it is possible to attempt to reduce the sum total of power dissipated in the M imaging element units.

In addition, each imaging element unit in the imaging panel in Embodiment 1 includes one imaging element and one current/voltage conversion circuit. Furthermore, the current/voltage conversion circuit in Embodiment 1 is provided to correspond to one imaging element. Unlike the conventional technique, therefore, a problem such as noise occurrence in the current/voltage conversion circuit caused by a row wiring line does not occur. As a result, a high S/N ratio can be obtained, and reduction of the irradiation quantity of the electromagnetic wave (X-rays) can be attempted. In addition, it is possible to provide an imaging element unit which is strong against external disturbance as well.

Note that, if X-rays are incident on the imaging element 230 in the conventional current/voltage conversion circuit 240, the imaging element 230 converts the incident electromagnetic wave to a current, as described earlier. This current is stored in the parasitic capacitance 231 as charge $Q_{in}$. In a case where a bias voltage of a pn junction section in the imaging element 230 is 0 volt or less, the incident electromagnetic wave is not converted to a current. In the conventional current/voltage conversion circuit, therefore, a maximum value $Q_{in\text{-}max}$ of a stored charge quantity obtained by the imaging element 230 is limited to $$Q_{in\text{-}max} = C_{pd} \times V_{Ref}$$

In other words, the dynamic range of the input voltage to the operational amplifier 241 is limited by $V_{Ref}$. On the other hand, when the power supply voltage of the operational amplifier 241 is $V_{cc}$, the dynamic range of the output voltage from the operational amplifier 241 is limited by $(V_{cc}-V_{Ref})$. If the dynamic range of the input voltage to the operational amplifier 241 is increased by making the reference voltage $V_{Ref}$ a high value, therefore, the dynamic range of the output voltage from the operational amplifier 241 is decreased. There is a problem that it is difficult to obtain a suitable balance between the dynamic range of the input voltage to the operational amplifier 241 and the dynamic range of the output voltage from the operational amplifier 241.

Figure 50:
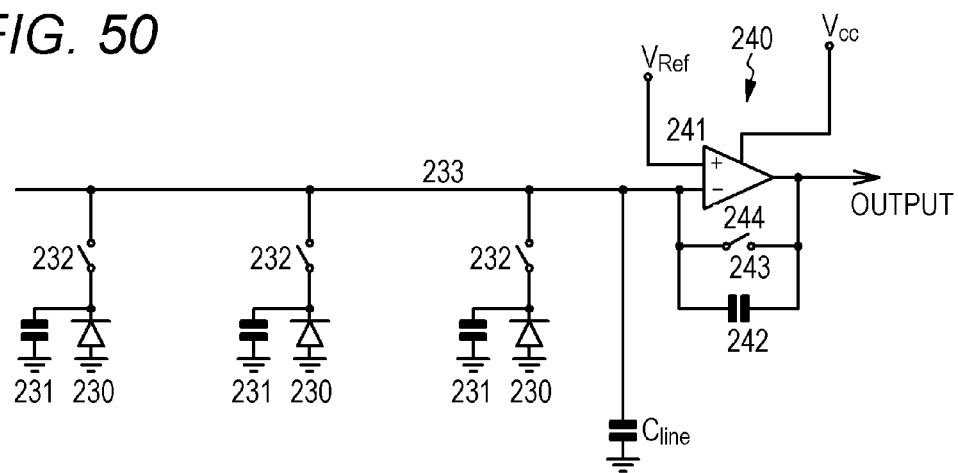
FIG. 50 is an equivalent circuit diagram of an example of an imaging element and a current/voltage conversion circuit included in a conventional X-ray flat panel detector.

Furthermore, in general, dark charge always occurs in the pn junction section of the imaging element even in a state in which the imaging element is not irradiated with X-rays. The dark charge is observed as an output offset voltage. It is possible to grasp the quantity of purely stored charge by subtracting the output offset voltage from the output voltage obtained when the imaging element is irradiated with X-rays. When the imaging element 230 in the conventional current/voltage conversion circuit illustrated in FIG. 50 is irradiated with X-rays having energy corresponding to the charge $Q_{in}$, however, the bias voltage of the imaging element 230 changes in proportion to $(V_{Ref}-Q_{in}/C_{int})$. Since the dark charge relates to the depth of the vacant layer in the pn junction section, the dark charge changes depending upon the bias voltage of the imaging element 230. In the conventional technique, therefore, the output offset voltage caused by the dark charge cannot be completely canceled even if the output offset voltage is subtracted from the output voltage obtained when the imaging element is irradiated with X-rays. Therefore, it is difficult to accurately grasp the stored charge quantity, i.e., the energy quantity of X-rays with which the imaging element is irradiated.

On the other hand, when X-rays are incident on the imaging element 30 in Embodiment 1, the imaging element 30 converts the incident electromagnetic wave to a current. However, this current is stored not in the parasitic capacitance 31 but in the capacitor section 42 as charge. Therefore, the maximum value of the stored charge quantity obtained by the imaging element 30 is not restricted by the capacitance value of the parasitic capacitance 31. The output voltage $V_0$ based upon the charge $Q_{in}$ stored in the capacitor section 42 can be obtained by $$V_0 = Q_{in}/C_{int}$$

However, the dynamic range of the input voltage to the operational amplifier 41 and the dynamic range of the output voltage from the operational amplifier 41 are restricted only by $(V_{cc}-V_{Ref})$. It is possible to easily obtain suitable coexistence of the dynamic range of the input voltage and the dynamic range of the output voltage. In addition, the bias voltage of the imaging element does not depend upon $Q_{in}$, but is fixed to the voltage (the reference voltage $V_{Ref}$) of the first input section (the non-inverting input section) of the operational amplifier. Therefore, the dark charge in the imaging element becomes constant, and it becomes possible to grasp pure charge from the imaging element which does not include influence of the dark current by subtracting the output voltage from the imaging element unit 20 obtained in a case where the imaging element unit 20 is not irradiated with the electromagnetic wave, from the output voltage from the imaging element unit 20 obtained in a case where the imaging element unit 20 is irradiated with the electromagnetic wave.

Embodiment 2

Figure 7:
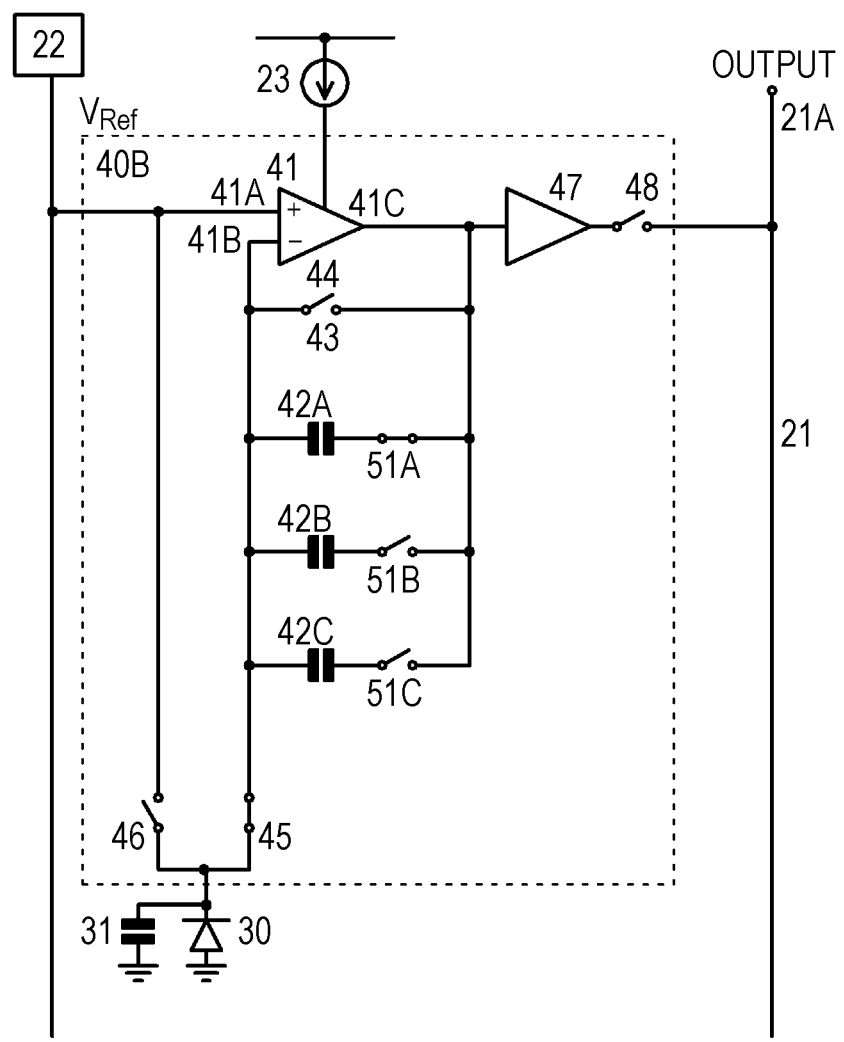
FIG. 7 is an equivalent circuit diagram of a portion of an imaging apparatus in Embodiment 2.

Embodiment 2 is a modification of Embodiment 1. An equivalent circuit diagram is illustrated in FIG. 7. In an imaging apparatus or a current/voltage conversion circuit 40B in Embodiment 2, the current/voltage conversion circuit 40B includes a plurality of capacitor sections (in the illustrated example, three capacitor sections 42A, 42B and 42C) and a plurality of changeover switch circuits (in the illustrated example, three changeover switch circuits 51A, 51B and 51C). The plurality of capacitor sections 42A, 42B and 42C are connected to an output section 41C of the operational amplifier 41 respectively via the changeover switch circuits 51A, 51B and 51C, and connected to a second input section 41B of the operational amplifier 41. According to such a configuration, a change of sensitivity of the current/voltage conversion circuit 41 can be conducted easily.

Except the points described heretofore, the configuration and structure of the imaging apparatus or the current/voltage conversion circuit in Embodiment 2 can be made similar to the configuration and structure of the imaging apparatus or the current/voltage conversion circuit described in Embodiment 1. Therefore, detailed description will be omitted. Furthermore, the configuration in Embodiment 2 can be applied to Embodiment 3 to Embodiment 8.

Embodiment 3

Figure 8:
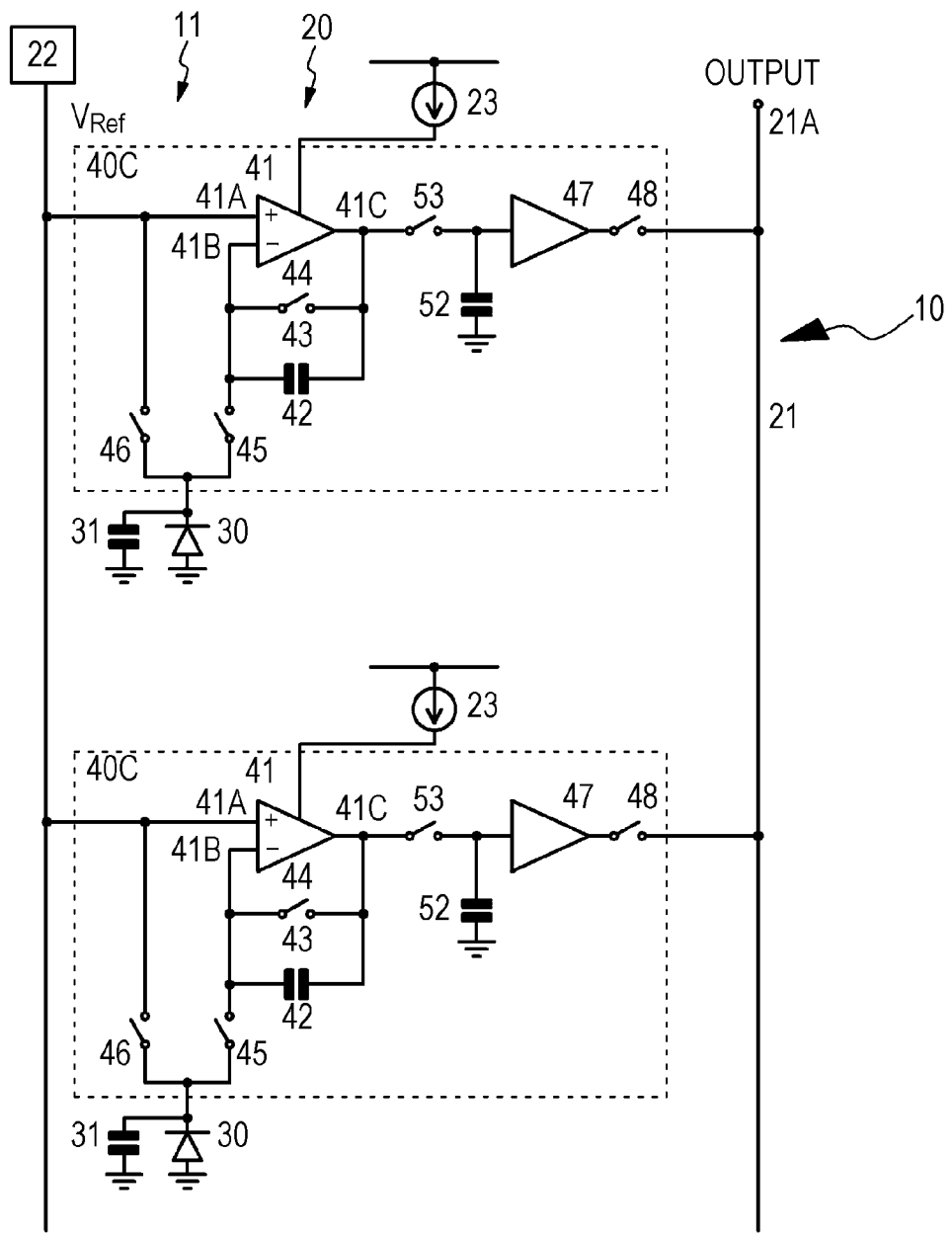
FIG. 8 is an equivalent circuit diagram of a portion of an imaging apparatus in Embodiment 3.

Embodiment 3 is also a modification of Embodiment 1. An equivalent circuit diagram (an equivalent circuit diagram of two imaging element units connected to one output wiring line) is illustrated in FIG. 8. A current/voltage conversion circuit 40C in an imaging apparatus in Embodiment 3 further includes a second capacitor section 52 and a third switch circuit 53 which conducts the same operation as that of the first switch circuit 45. A first end of the second capacitor section 52 is connected to the output section 41C of the operational amplifier 41 via the third switch circuit 53. Furthermore, the first end of the second capacitor section 52 is connected to the input section of the buffer circuit 47.

Except the points described heretofore, the configuration and structure of the imaging apparatus or the current/voltage conversion circuit in Embodiment 3 can be made similar to the configuration and structure of the imaging apparatus or the current/voltage conversion circuit described in Embodiment 1 to Embodiment 2. Therefore, detailed description will be omitted. In Embodiment 3, it is possible to attempt to further reduce power dissipated in the current/voltage conversion circuit as compared with Embodiment 1 as described later by adding the second capacitor section as load capacitance of the operational amplifier.

Figure 12:
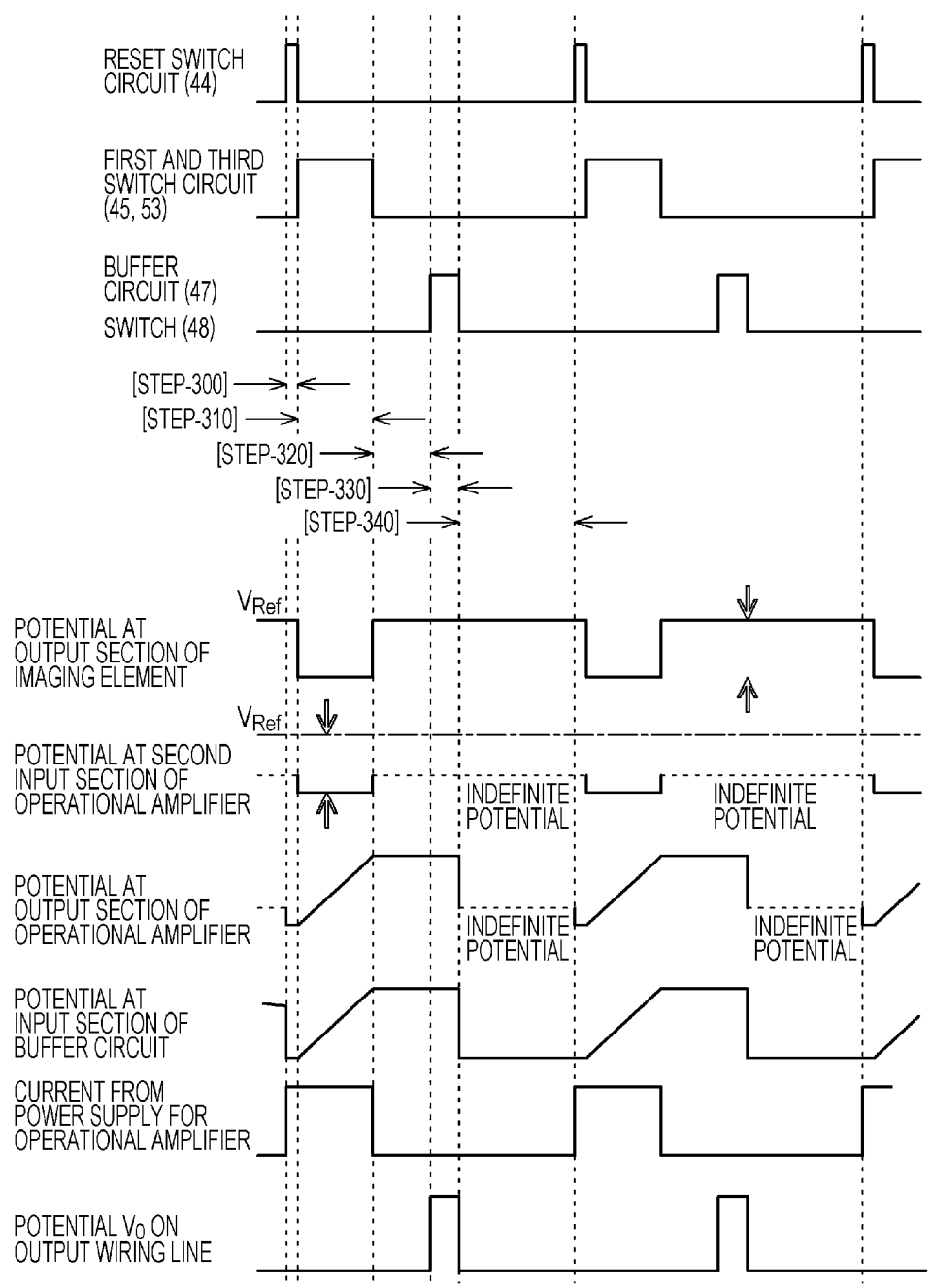
FIG. 12 is a diagram illustrating potentials at respective nodes in the imaging element unit included in the imaging apparatus in Embodiment 3.

Hereafter, operation of the imaging apparatus and the current/voltage conversion circuit in Embodiment 3 will be described with reference to FIG. 9A, FIG. 9B, FIG. 10A, FIG. 10B, FIG. 11A and FIG. 11B which are equivalent circuit diagrams of the current/voltage conversion circuit and FIG. 12 which indicates potential at respective nodes in an imaging element unit included in the imaging apparatus in Embodiment 3.

[Step-300: Reset Mode]

First, initialization of the capacitor section 42 is conducted. Specifically, the capacitor section 42 is reset in the same way as [step-100] in Embodiment 1 by bringing the reset switch circuit 44 into the on state and bringing the third switch circuit 53 into an off state (see FIG. 9A). If a predetermined time elapses and resetting of the capacitor section 42 is completed, the reset switch circuit 44 is brought into the off state (see FIG. 9B). [Step-300] to [step-310] are conducted in all imaging element units simultaneously.

At [step-300], noise occurs in the second switch circuit 46. This noise is stored in the parasitic capacitance 31 (capacitance value: $C_{pd}$) the imaging element 30 has, as charge ($=k \cdot T/C_{pd}$). At the time of start of next [step-310], the charge ($=k \cdot T/C_{pd}$) is increased by ($C_{pd}/C_{int}$) times and stored in the capacitor section 42.

[Step-310: Sampling Mode]

Then, the third switch circuit 53 is brought into an on state, and in addition, the first switch circuit 45 is brought into the on state and the second switch circuit 46 is brought into the off state. The incident electromagnetic wave is converted to a current by the imaging element 30 in the same way as [step-110] in Embodiment 1. Charge is stored in the capacitor section 42, and further in the second capacitor section 52 by the current from the imaging element 30 (see FIG. 10A). Potential at the first end of the second capacitor section 52 which is load capacitance of the operational amplifier 41 becomes the sum of the reference voltage $V_{Ref}$ and a potential difference between both ends of the capacitor section 42.

At this [step-310], input referred noise $NZ_1$ generated by the operational amplifier 41 is increased by ($C_{pd}/C_{int}$) times and stored in the capacitor section 42. Furthermore, noise is generated in the third switch circuit 53. This noise is stored in the second capacitor section 52 as charge ($=k \cdot T/C_{dum}$). Note that, "$C_{dum}$" is a capacitance value of the second capacitor section 52.

[Step-320: Hold Mode]

At a time point when a predetermined time has elapsed, the first switch circuit 45 is brought into the off state and the second switch circuit 46 is brought into the on state. As a result, the imaging element 30 is disconnected from the current/voltage conversion circuit 40C and the output section (cathode) of the imaging element 30 is connected to the power supply 22. The third switch circuit 53 is brought into the off state. In addition, supply of the current from the power supply 23 for operational amplifier to the operational amplifier 41 is stopped (see FIG. 10B). As a result, it is possible to attempt to further reduce power dissipated in the whole of the current/voltage conversion circuit 40C as compared with Embodiment 1. [Step-320] and subsequent steps are conducted in the M imaging element units connected to one output wiring line 21 successively.

[Step-330: Output Mode]

If it is turn of the imaging element unit 20 to output, the buffer circuit 47 and the output switch circuit 48 are brought into the on state (see FIG. 11A). As a result, the current/voltage conversion circuit 40C is connected to the output wiring line 21, and an output voltage $V_0$ based upon charge (input charge quantity) stored in the second capacitor section 52 is output to the output wiring line 21. In other words, the output voltage $V_0$ based upon the energy quantity of the incident electromagnetic wave is output to the output wiring line 21.

At [step-330], input referred noise $NZ_3$ generated by the buffer circuit 47 appear on the output terminal 21A of the output wiring line 21 via a low pass filter component of an output resistor of the buffer circuit 47 and parasitic capacitance of the output wiring line 21.

[Step-340: Sleep Mode]

Then, the buffer circuit 47 and the output switch circuit 48 are brought into the off state (see FIG. 11B). At this [step-340], power dissipated in the imaging element unit 20 becomes approximately zero.

Noise $NZ_0$ in one operation period which is the sum total of noise in respective modes is given by Equation (3-1) below.

$$NZ_0^2 = (k \cdot T / C_{pd}) \times (C_{pd} / C_{int})^2 + \\ NZ_1^2 \times (C_{pd}/C_{int})^2 + k \cdot T / C_{dum} + NZ_3^2 \times \alpha^2 \quad (3\text{-}1)$$

If it is supposed here that $\alpha^2 \approx 0$, Equation (3-1) becomes following Equation (3-2).

$$NZ_0^2 = (k \cdot T / C_{pd}) \times (C_{pd}/C_{int})^2 + NZ_1^2 \times (C_{pd}/C_{int})^2 + k \cdot T/C_{dum} \quad (3\text{-}2)$$

Comparing Equation (1-3) with Equation (3-2), noise increases by $k \cdot T/C_{dum}$ in Embodiment 3. Furthermore, the moment changeover from [step-320] to [step-330] is conducted, the buffer circuit 47 changes over from the off state to the on state. Therefore, it is necessary to store charge in capacitance in the input section of the buffer circuit 47. This charge is supplied from the second capacitor section 52. The capacitance value $C_{dum}$ of the second capacitor section 52 should be determined to be a suitable value on the basis of allowable noise.

Furthermore, the sum total of power dissipated in the M imaging element units connected to the output wiring line and included in the imaging apparatus in Embodiment 3 is indicated by dotted lines in FIG. 6. At [step-320] to [step-340] in which the M imaging element units operate in the order of the first imaging element unit 20, the second imaging element unit 20, the third imaging element unit 20, . . . , the m-th imaging element unit 20, the (m+1)-st imaging element unit 20, . . . , the M-th imaging element unit 20 after [step-300] and [step-310] common to the M imaging element units (that is, in which the M imaging elements operate simultaneously) are completed, the sum total of power dissipated in the M imaging element units is approximately "0" except the operation of the buffer circuit at [step-330]. It is possible to attempt to further reduce the sum total of power dissipated in the M imaging element units as compared with Embodiment 1.

Embodiment 4

Figure 13:
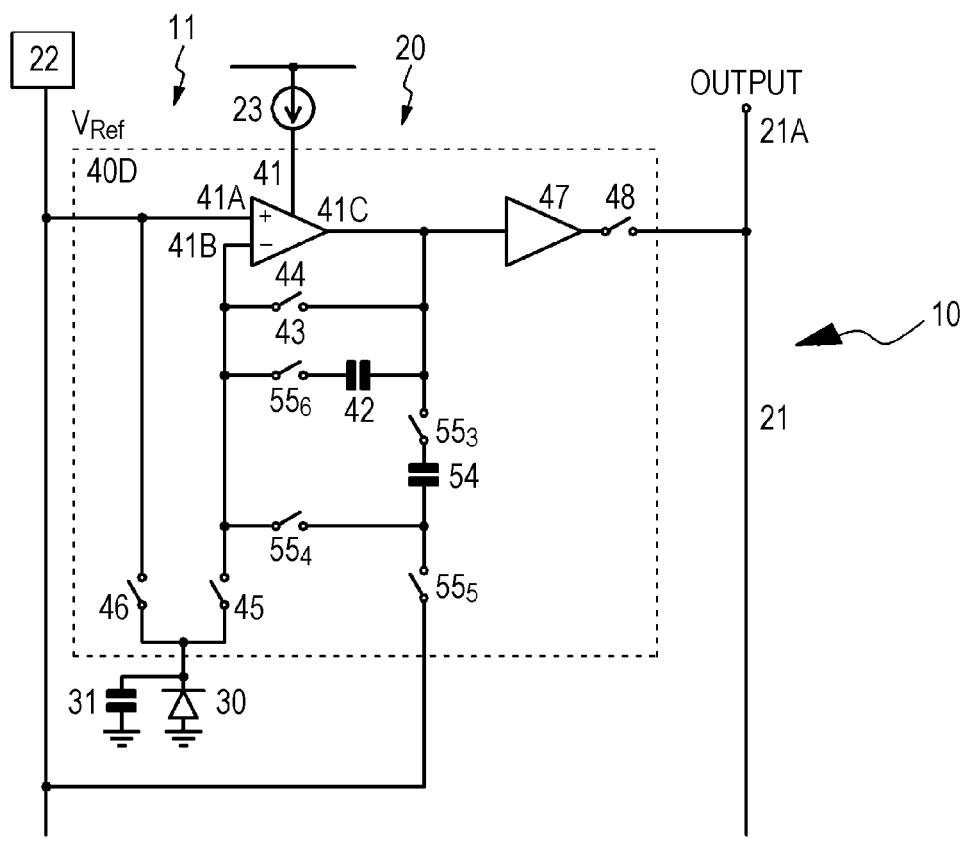
FIG. 13 is an equivalent circuit diagram of a portion of an imaging apparatus in Embodiment 4.
Figure 14:
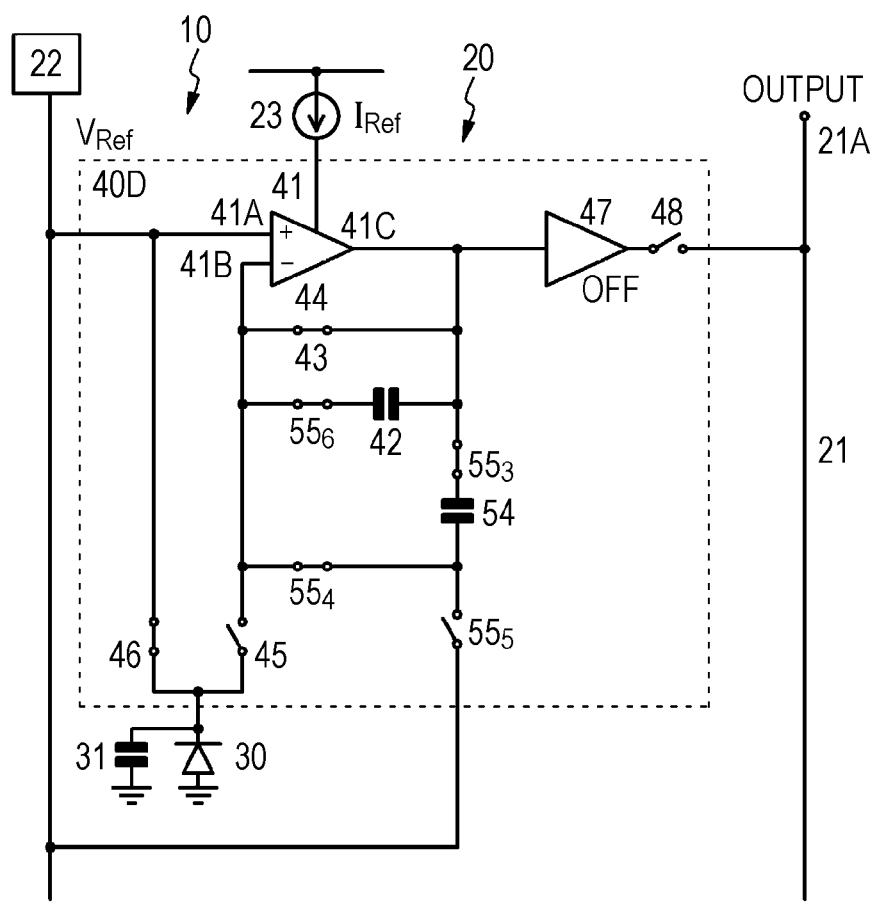
FIG. 14 is an equivalent circuit diagram for explaining an operation of an imaging element unit included in the imaging apparatus in Embodiment 4.

Embodiment 4 is also a modification of Embodiment 1. An equivalent circuit diagram (an equivalent circuit diagram of one imaging element unit connected to one output wiring line) is illustrated in FIG. 13. A current/voltage conversion circuit 40D in an imaging apparatus in Embodiment 4 further includes a second capacitor section 54, a third switch circuit $55_3$, a fourth switch circuit $55_4$, a fifth switch circuit $55_5$, and a sixth switch circuit $55_6$. A first end of the second capacitor section 54 is connected to the output section 41C of the operational amplifier 41 via the third switch circuit $55_3$. A second end of the second capacitor section 54 is connected to the second input section 41B of the operational amplifier 41 via the fourth switch circuit $55_4$, and connected to the power supply 22 via the fifth switch circuit $55_5$. In addition, the sixth switch circuit $55_6$ is connected between the second end of the capacitor section 42, and the first switch circuit 45 and the second input section 41B of the operational amplifier 41.

Except the points described heretofore, the configuration and structure of the imaging apparatus or the current/voltage conversion circuit in Embodiment 4 can be made similar to the configuration and structure of the imaging apparatus or the current/voltage conversion circuit described in Embodiment 1 to Embodiment 2. Therefore, detailed description will be omitted. In Embodiment 4, it is possible to attempt to further reduce power dissipated in the current/voltage conversion circuit and reduce noise as compared with Embodiment 1 as described later, by adding the second capacitor section and providing the second capacitor section with a mode in which the second capacitor section is caused to function as load capacitance of the operational amplifier and a mode in which the second capacitor section is connected in parallel with the capacitor section.

Figure 21:
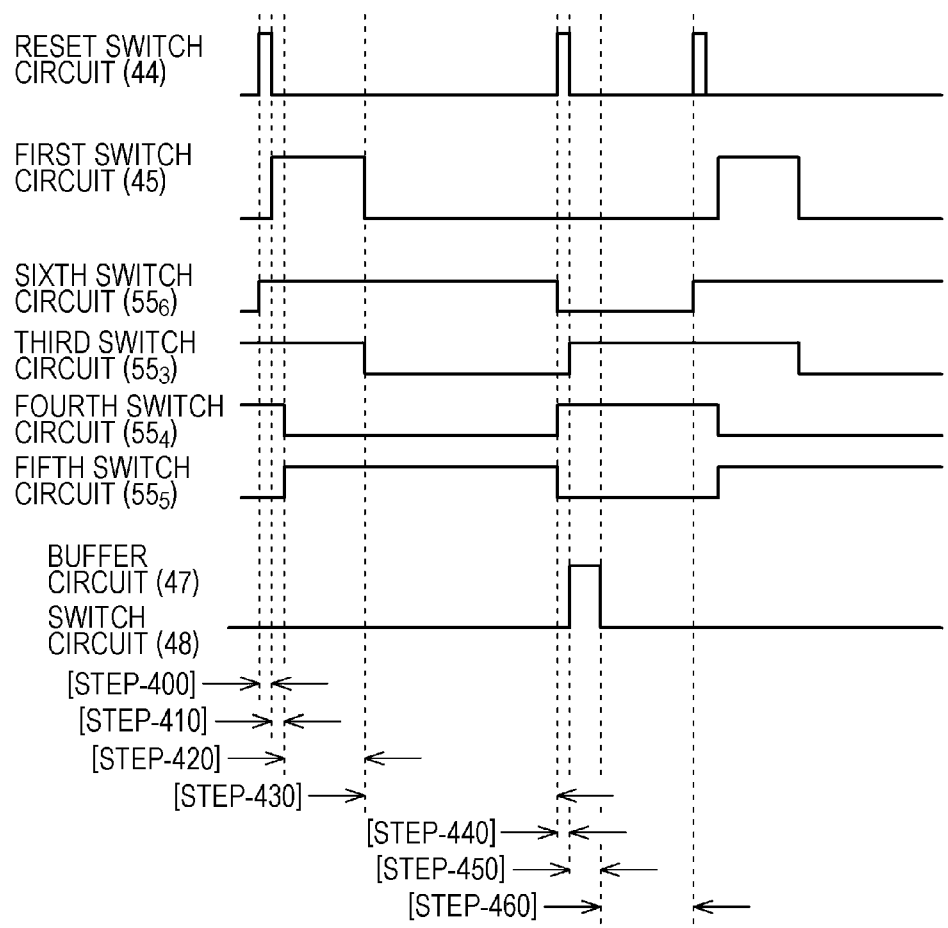
FIG. 21 is a diagram illustrating operations of respective switch circuits in the imaging element unit included in the imaging apparatus in Embodiment 4.
Figure 22:
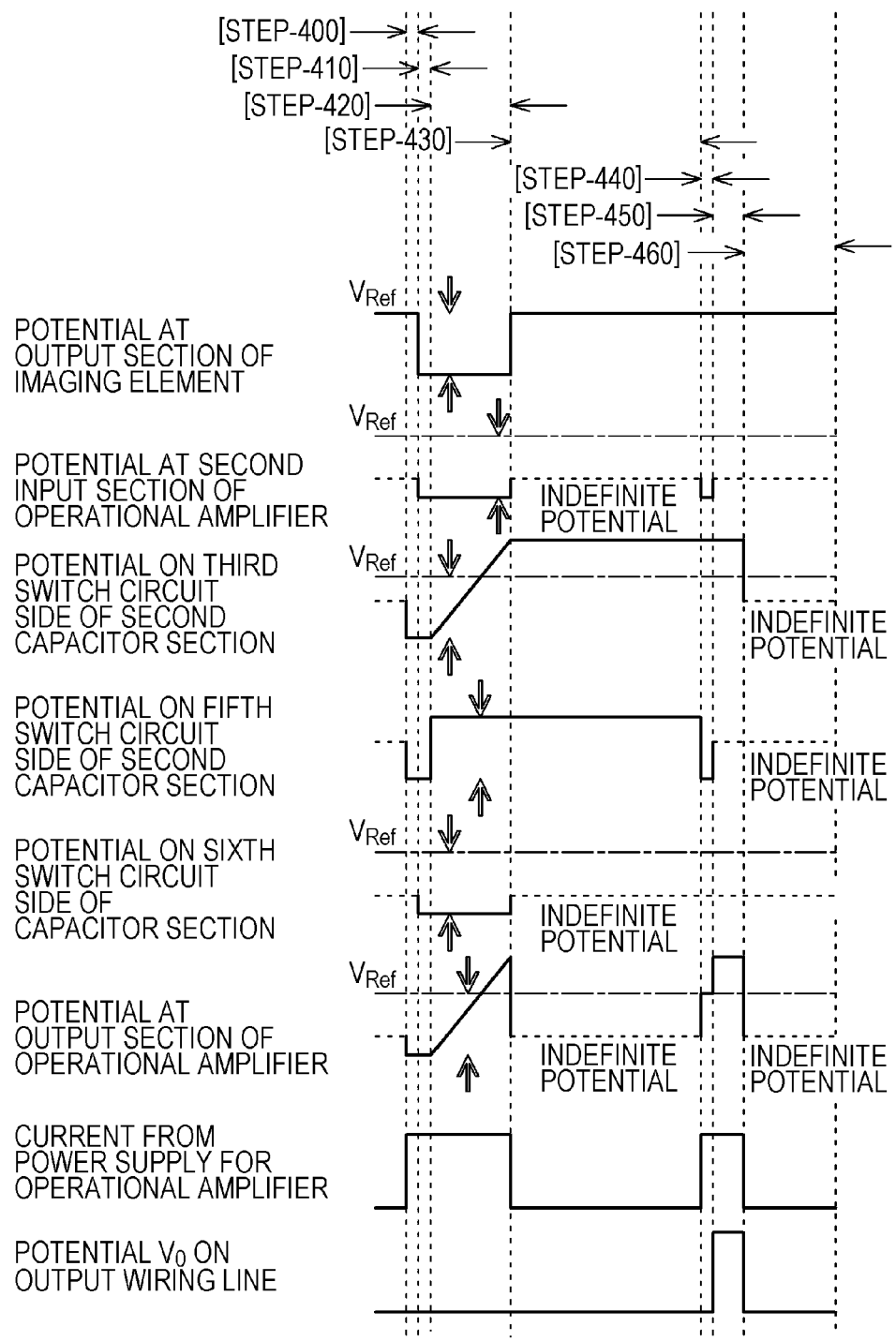
FIG. 22 is a diagram illustrating potentials at respective nodes in the imaging element unit included in the imaging apparatus in Embodiment 4.

Hereafter, operation of the imaging apparatus and the current/voltage conversion circuit in Embodiment 4 will be described with reference to FIGS. 14 to 20 which are equivalent circuit diagrams of the current/voltage conversion circuit, FIG. 21 which indicates operations of respective switch circuits in the imaging element unit included in the imaging apparatus in Embodiment 4, and FIG. 22 which indicates potentials at respective nodes in the imaging element unit included in the imaging apparatus in Embodiment 4.

[Step-400: Reset Mode]

First, initialization of the capacitor section 42 is conducted. Specifically, the capacitor section 42 is reset in the same way as [step-100] in Embodiment 1 by bringing the reset switch circuit 44, the third switch circuit $55_3$, the fourth switch circuit $55_4$, and the sixth switch circuit $55_6$ into the on state and bringing the fifth switch circuit $55_5$ and the output switch circuit 48 into the off state (see FIG. 14). [Step-400] to [step-420] are conducted in all imaging element units simultaneously.

At this [step-400], noise occurs in the second switch circuit 46. This noise is stored in the parasitic capacitance 31 (capacitance value: $C_{pd}$) the imaging element 30 has, as charge (=$k \cdot T/C_{pd}$). At the time of start of next [step-410], the charge (=$k \cdot T/C_{pd}$) is increased by $\{(C_{pd}/(C_{int}+C_{dum})\} \times \{(C_{dum}/(C_{int}+C_{dum})\}$ times and stored in the capacitor section 42, and is increased by $\{(C_{pd}/(C_{int}+C_{dum})\} \times \{(C_{int}/(C_{int}+C_{dum})\}$ times and stored in the second capacitor section 54. Note that, "$C_{dum}$" is the capacitance value of the second capacitor section 54.

[Step-410: Pre-Sampling Mode]

Figure 15:
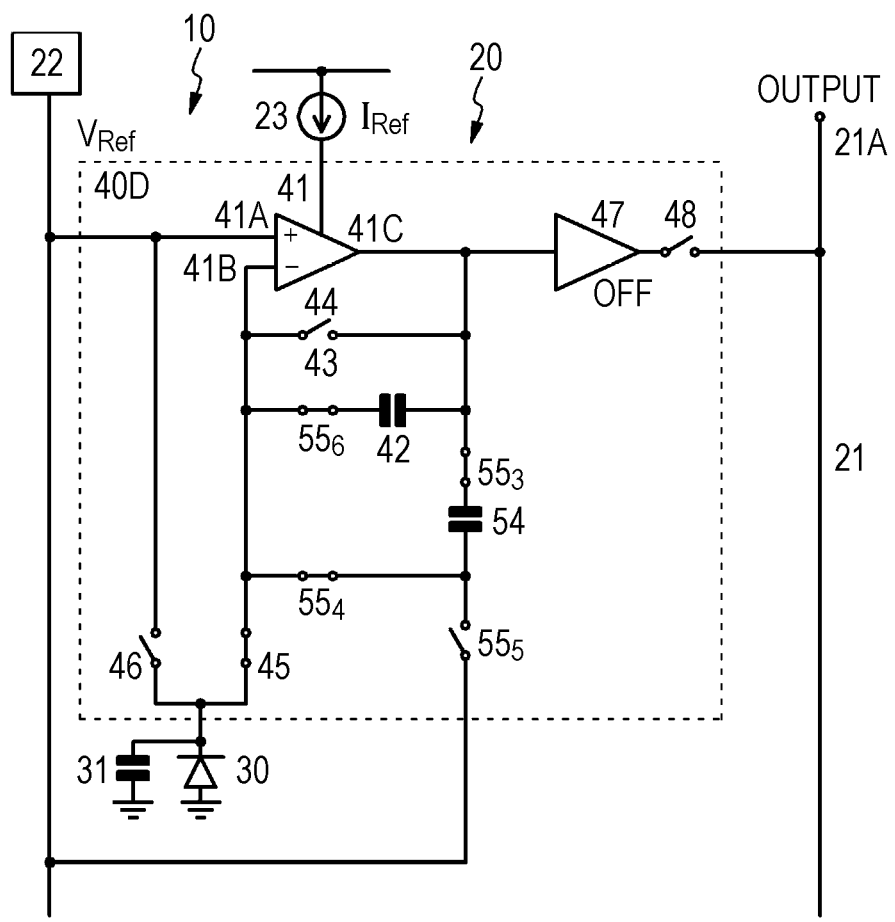
FIG. 15 is an equivalent circuit diagram for explaining the operation of the imaging element unit included in the imaging apparatus in Embodiment 4 subsequent to FIG. 14.
Figure 16:
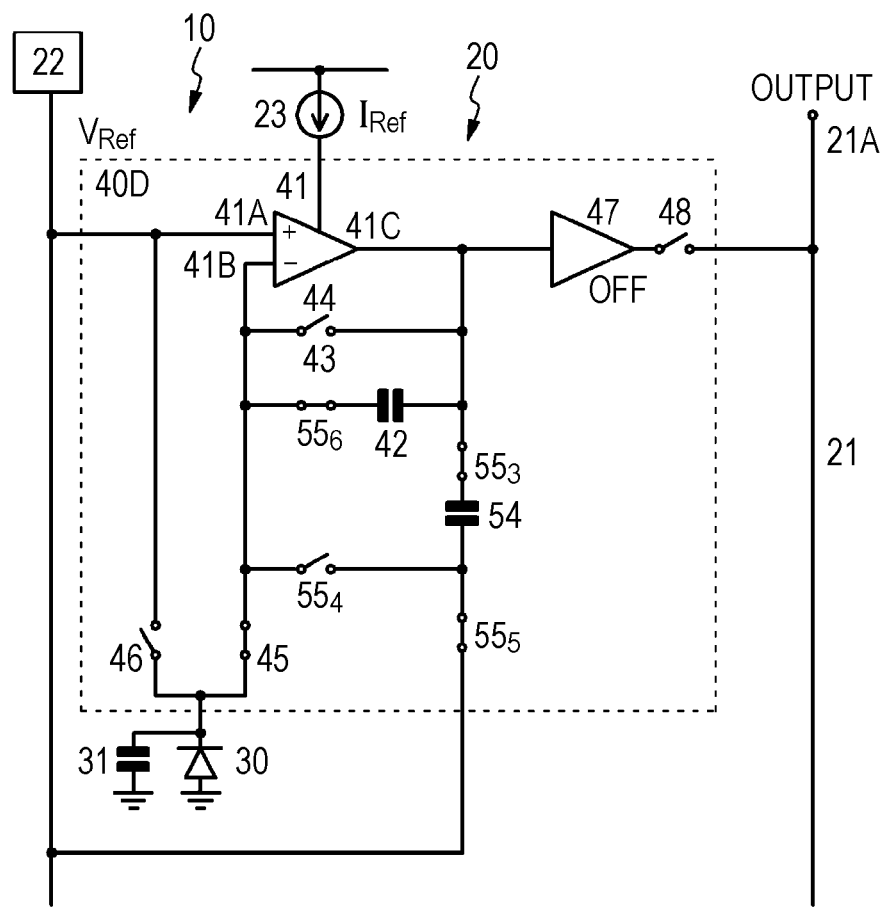
FIG. 16 is an equivalent circuit diagram for explaining the operation of the imaging element unit included in the imaging apparatus in Embodiment 4 subsequent to FIG. 15.
Figure 17:
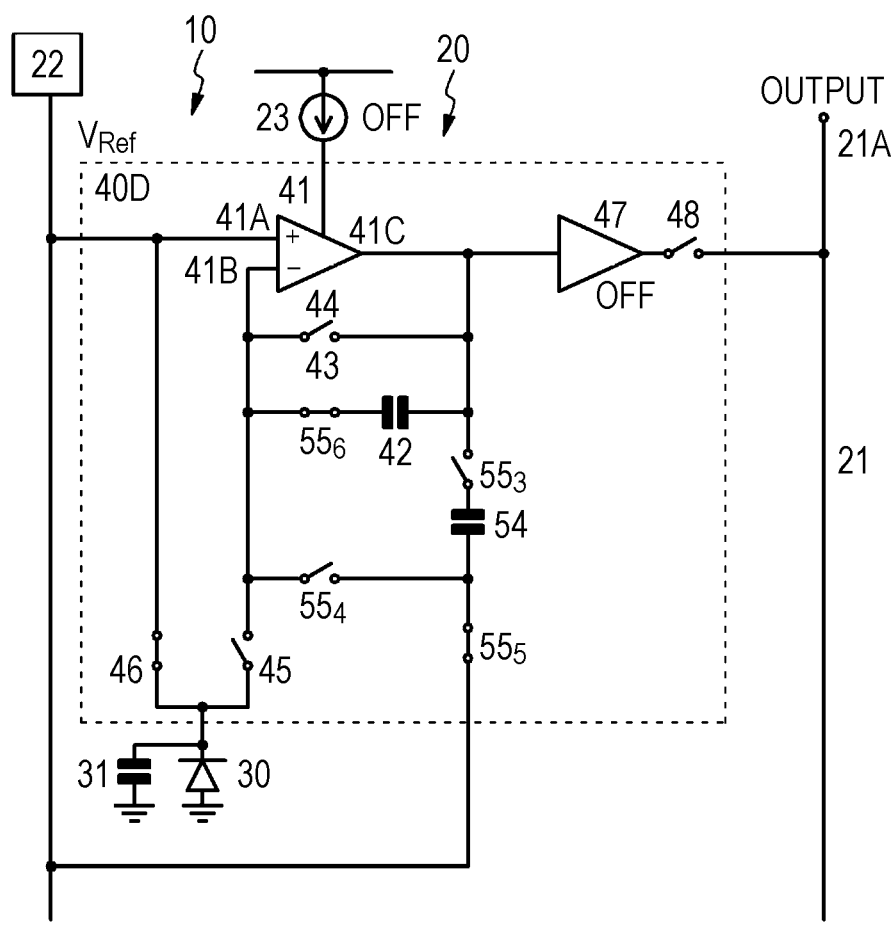
FIG. 17 is an equivalent circuit diagram for explaining the operation of the imaging element unit included in the imaging apparatus in Embodiment 4 subsequent to FIG. 16.
Figure 18:
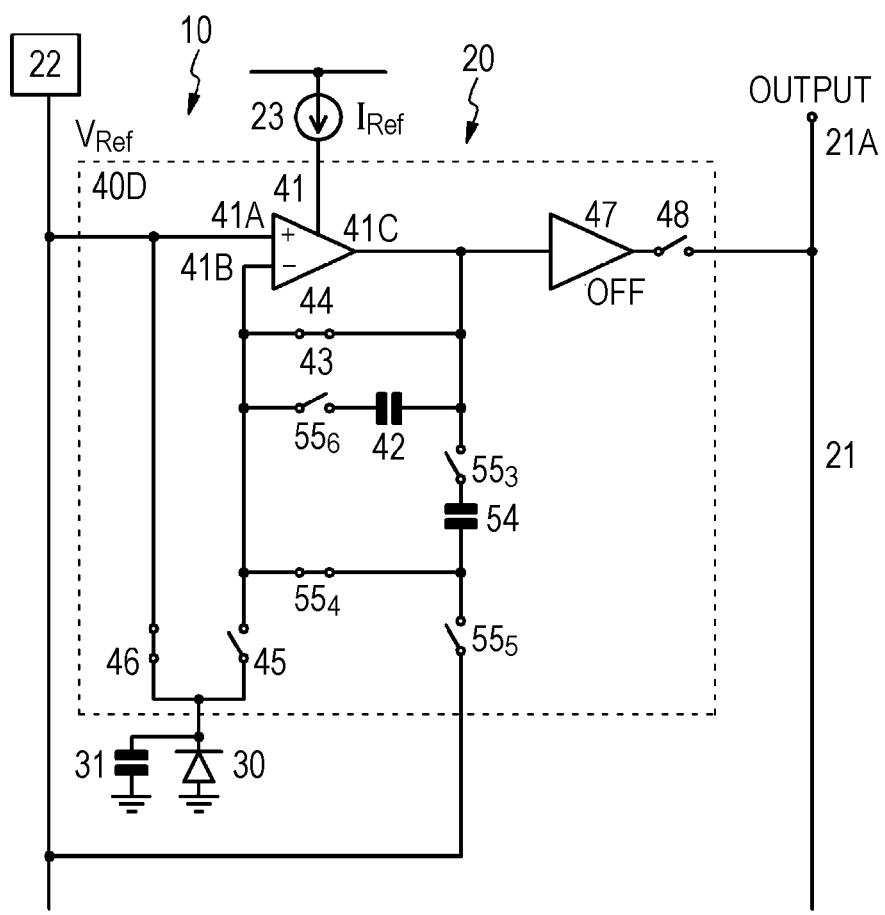
FIG. 18 is an equivalent circuit diagram for explaining the operation of the imaging element unit included in the imaging apparatus in Embodiment 4 subsequent to FIG. 17.
Figure 19:
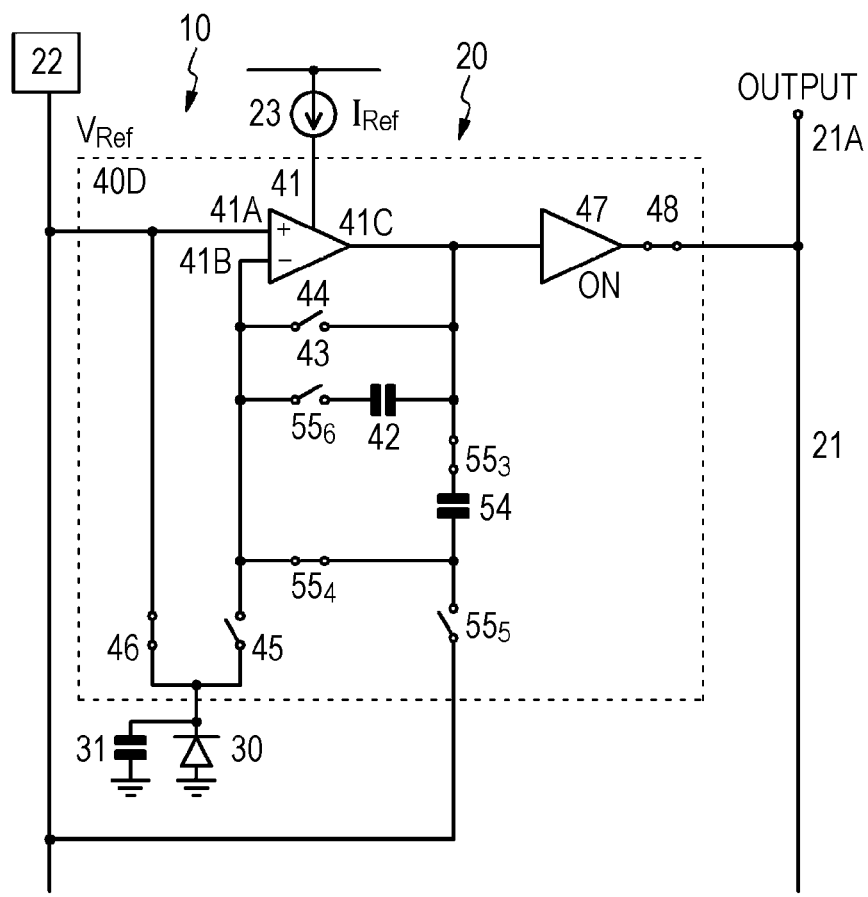
FIG. 19 is an equivalent circuit diagram for explaining the operation of the imaging element unit included in the imaging apparatus in Embodiment 4 subsequent to FIG. 18.

If a predetermined time elapses and resetting of the capacitor section 42 is completed, the reset switch circuit 44 is brought into an off state, the first switch circuit 45 is brought into an on state, and the second switch circuit 46 is brought into an off state (see FIG. 15). At [step-410], noise (charge) stored in the parasitic capacitance 31 at [step-400] is divided and stored in the capacitor section 42 and the second capacitor section 54. As described later, noise transferred to the capacitor section 42 is added to the input charge. However, noise transferred to the second capacitor section 54 is not added to the input charge. At [step-410], input referred noise $NZ_1$ generated by the operational amplifier 41 is increased by $\{(C_{pd}/(C_{int}+C_{dum})\} \times \{(C_{int}/(C_{int}+C_{dum})\}$ times and stored in the second capacitor section 54.

[Step-420: Sampling Mode]

Then, the fourth switch circuit $55_4$ is brought into the off state and the fifth switch circuit $55_5$ is brought into the on state (see FIG. 16) and the electromagnetic wave is incident on the imaging element 30. As a result, the incident electromagnetic wave is converted to a current by the imaging element 30, and charge is stored in the capacitor section 42 by the current from the imaging element 30. Charge corresponding to a potential difference across the capacitor section 42 is stored in the second capacitor section 54 which is the load capacitance of the operational amplifier 41. In other words, potential at a first end of the second capacitor section 54 becomes the sum of the reference voltage $V_{Ref}$ and the potential difference across the capacitor section 42. A current/voltage conversion gain of the operational amplifier 41 depends upon the capacitance value $C_{int}$ of the capacitor section 42.

At this [step-420], the input referred noise $NZ_2$ generated by the operational amplifier 41 is increased by ($C_{pd}/C_{int}$) times and stored in the capacitor section 42 and the second capacitor section 54. Furthermore, noise generated in the third switch circuit $55_3$ and the fifth switch circuit $55_5$ is stored in the second capacitor section 54 as charge ($=k\cdot T/C_{dum}$).

[Step-430: Hold Mode]

At a time point when a predetermined time has elapsed, the first switch circuit 45 is brought into the off state and the second switch circuit 46 is brought into the on state. As a result, the imaging element 30 is disconnected from the current/voltage conversion circuit 40D and the output section (cathode) of the imaging element 30 is connected to the power supply 22. The third switch circuit $55_3$ is brought into the off state. In addition, supply of the current from the power supply 23 for operational amplifier to the operational amplifier 41 is stopped (see FIG. 17). As a result, it is possible to attempt to further reduce power dissipated in the whole of the current/voltage conversion circuit 40D as compared with Embodiment 1. [Step-430] and subsequent steps are conducted in the M imaging element units connected to one output wiring line 21 successively.

[Step-440: Pre-Output Mode]

If it is turn of the imaging element unit 20 to output, supply of a current from the power supply 23 for operational amplifier to the operational amplifier 41 is resumed. Furthermore, the fifth switch circuit $55_5$ and the sixth switch circuit $55_6$ are brought into the off state, and the reset switch circuit 44 and the fourth switch circuit $55_4$ are brought into the on state (see FIG. 18). As a result, potential at the second input section 41B and the output section 41C of the operational amplifier 41 becomes $V_{Ref}$. Furthermore, as a result, potential at each node can be set to a predetermined value before transition from [step-450] described later to [step-460].

[Step-450: Output Mode]

Then, the reset switch circuit 44 is brought into the on state and the third switch circuit $55_3$ is brought into the on state. In addition, the buffer circuit 47 and the output switch circuit 48 are brought into the on state (see FIG. 19). As a result, the current/voltage conversion circuit 40D is connected to the output wiring line 21, and an output voltage $V_0$ based upon charge (input charge quantity) stored in the second capacitor section 54 is output to the output wiring line 21. In other words, the output voltage $V_0$ based upon the energy quantity of the incident electromagnetic wave is output to the output wiring line 21. Specifically, the sum of the reference voltage $V_{Ref}$ and a voltage at the first end of the capacitor section 42 is output to the output wiring line 21 as the output voltage $V_0$.

At this [step-450], input referred noise $NZ_3$ and $NZ_4$ generated by the operational amplifier 41 and the buffer circuit 47 appear on the output terminal 21A of the output wiring line 21 via a low pass filter component of the output resistor of the buffer circuit 47 and parasitic capacitance of the output wiring line 21.

[Step-460: Sleep Mode]

Figure 20:
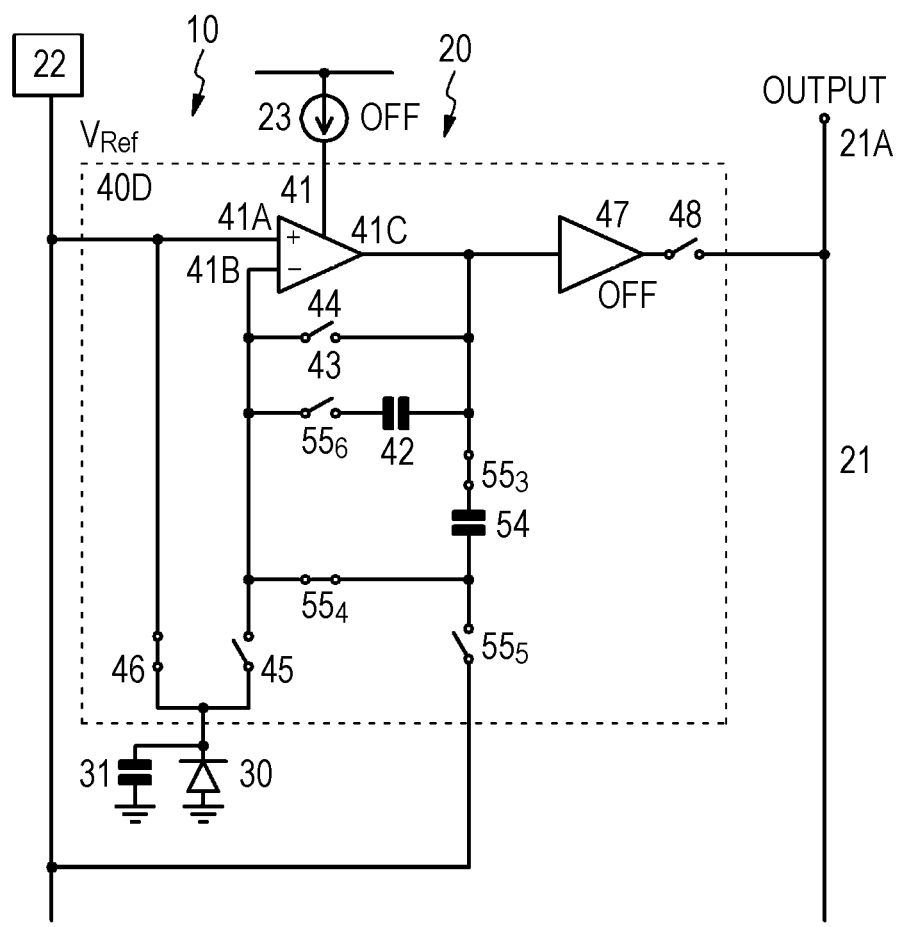
FIG. 20 is an equivalent circuit diagram for explaining the operation of the imaging element unit included in the imaging apparatus in Embodiment 4 subsequent to FIG. 19.

Then, the buffer circuit 47 and the output switch circuit 48 are brought into the off state, and supply of the current from the power supply 23 for operational amplifier to the operational amplifier 41 is stopped (see FIG. 20). At this [step-460], power dissipated in the imaging element unit 20 becomes approximately zero.

Noise $NZ_0$ in the output voltage $V_0$ in one operation period which is the sum total of noise in respective modes is given by Equation (4-1) below.

$$NZ_0^2 = (k \cdot T / C_{pd}) \times [\{C_{pd}/(C_{int}+C_{dum})\} \times \{C_{int}/(C_{int}+C_{dum})\}]^2 + \quad (4\text{-}1)$$
$$NZ_1^2 \times [\{C_{pd}/(C_{int}+C_{dum})\} \times \{C_{int}/(C_{int}+C_{dum})\}]^2 +$$
$$NZ_2^2 \times (C_{pd}/C_{int})^2 + k \cdot T / C_{dum} + (NZ_3^2 + NZ_4^2) \times \alpha^2$$

If it is supposed here that $\alpha^2 \approx 0$ and $C_{int} \ll C_{dum}$, $\{C_{int}/(C_{int}+C_{dum})\}]^2 \approx 0$, therefore, Equation (4-1) becomes following Equation (4-2).

$$NZ_0^2 = NZ_2^2 \times (C_{pd}/C_{int})^2 + k \cdot T/C_{dum} \quad (4\text{-}2)$$

Comparing Equation (3-2) with Equation (4-2), it is appreciated that noise decreases by $(k \cdot T/C_{pd}) \times (C_{pd}/C_{int})^2$ in Embodiment 4.

The essence of noise reduction in Embodiment 4 is in that charge ($=k \cdot T/C_{pd}$) caused by noise generated in the second switch circuit 46 at [step-400] is divided and stored in the capacitor section 42 and the second capacitor section 54 at [step-410]. In other words, the output voltage $V_0$ based upon charge (input charge quantity) stored in the second capacitor section 54 is output to the output wiring line 21. At this time, however, only noise corresponding to $\{C_{int}/(C_{int}+C_{dum})\}$ included in noise generated in the second switch circuit 46 is output together with the output voltage $V_0$, and noise corresponding to $\{C_{dum}/(C_{int}+C_{dum})\}$ included in the noise generated in the second switch circuit 46 is discarded. Therefore, it is not indispensable to provide the second capacitor section 54 with a mode in which the second capacitor section 54 is caused to function as load capacitance of the operational amplifier 41 and a mode in which the second capacitor section 54 is connected in parallel with the capacitor section 42. It is also possible to adopt a form in which two capacitor sections are provided and one of the capacitor sections is caused to function as load capacitance of the operational amplifier 41 and the other of the capacitor sections is used as a capacitor section connected in parallel with the capacitor section 42.

Noise $NZ_0$ in one operation period which is the sum total of noise in respective modes in Embodiment 1, Embodiment 3, and Embodiment 4 is put together as follows:

$$NZ_0^2 = (k \cdot T / C_{pd}) \times (C_{pd}/C_{int})^2 + NZ_1^2 \times (C_{pd}/C_{int})^2 \quad (1\text{-}3)$$
$$= (k \cdot T / C_{pd}) \times (C_{pd}/C_{int})^2 + NZ_1^2 \times$$
$$(C_{pd}/C_{int})^2 \times k \cdot T / C_{dum} \quad (3\text{-}2)$$
$$= NZ_2^2 \times (C_{pd}/C_{int})^2 + k \cdot T / C_{dum} \quad (4\text{-}2)$$

The value of $C_{pd}$ depends upon the area of the imaging element in the semiconductor manufacture process, and it is now supposed that the value of $C_{pd}$ is 2 pF. Furthermore, the value of $C_{int}$ is a value (current/voltage conversion gain) depending upon system setting in the imaging apparatus, and it is now supposed that $C_{int}$ is 0.2 pF. In addition, $C_{dum}$ is a value which can be arbitrarily set, and it is now supposed that $C_{dum}$ is 2 pF. Furthermore, it is supposed that $T = 300°$ K and Boltzmann coefficient $k = 1.38 \times 10^{-23}$ m$^2 \cdot$kg$\cdot$s$^{-2} \cdot$K$^{-1}$. Substituting these values into Equation (1-3) and Equation (4-2), it follows that $NZ_0^2$:

$$2.07 \times 10^{-7} + NZ_1^2 \times 100 \quad (1\text{-}3)$$
$$2.07 \times 10^{-9} + NZ_2^2 \times 100 \quad (4\text{-}2)$$

In general, it is not so difficult to make the value of $(NZ_1^2 \times 100)$ and the value of $(NZ_2^2 \times 100)$ the order of $10^{-7}$. As compared with Equation (1-3), therefore, the value of the sum total of noise in Equation (4-2) can be made smaller.

At [step-400: reset mode], it is also possible to bring the first switch circuit 45 into the on state and bring the second switch circuit 46 into the off state instead of bringing the first switch circuit 45 into the off state and bringing the second switch circuit 46 into the on state. In other words, when the first switch circuit 45 is brought into the on state and the second switch circuit 46 is brought into the off state at [step-410: pre-sampling mode] in the case where the first switch circuit 45 is brought into the off state and the second switch circuit 46 is brought into the on state at [step-400], the potential at the output section of the imaging element 30 changes from $V_{Ref}$ to ($V_{Ref}$+offset voltage of the operational amplifier 41). As a result of transfer of charge corresponding to the potential change to the capacitor section 42 and the second capacitor section 54, there is a fear that the dynamic range will be narrowed. On the other hand, in the case where the first switch circuit 45 is brought into the on state and the second switch circuit 46 is brought into the off state at [step-400], there is no change in the states of the first switch circuit 45 and the second switch circuit 46 at [step-410]. In other words, at the time of transition from [step-400] to [step-410], a change does not occur in potential at the output section of the imaging element 30. Therefore, there is no fear that the dynamic range will be narrowed. Note that, in this case, $(k \cdot T/C_{pd})$ in the first term of Equation (4-1) becomes $[k \cdot T/C_{pd}$+(input referred noise generated in the operational amplifier 41)$^2$]. Eventually, however, this equation becomes Equation (4-2) and consequently noise does not increase especially.

Embodiment 5

Figure 23:
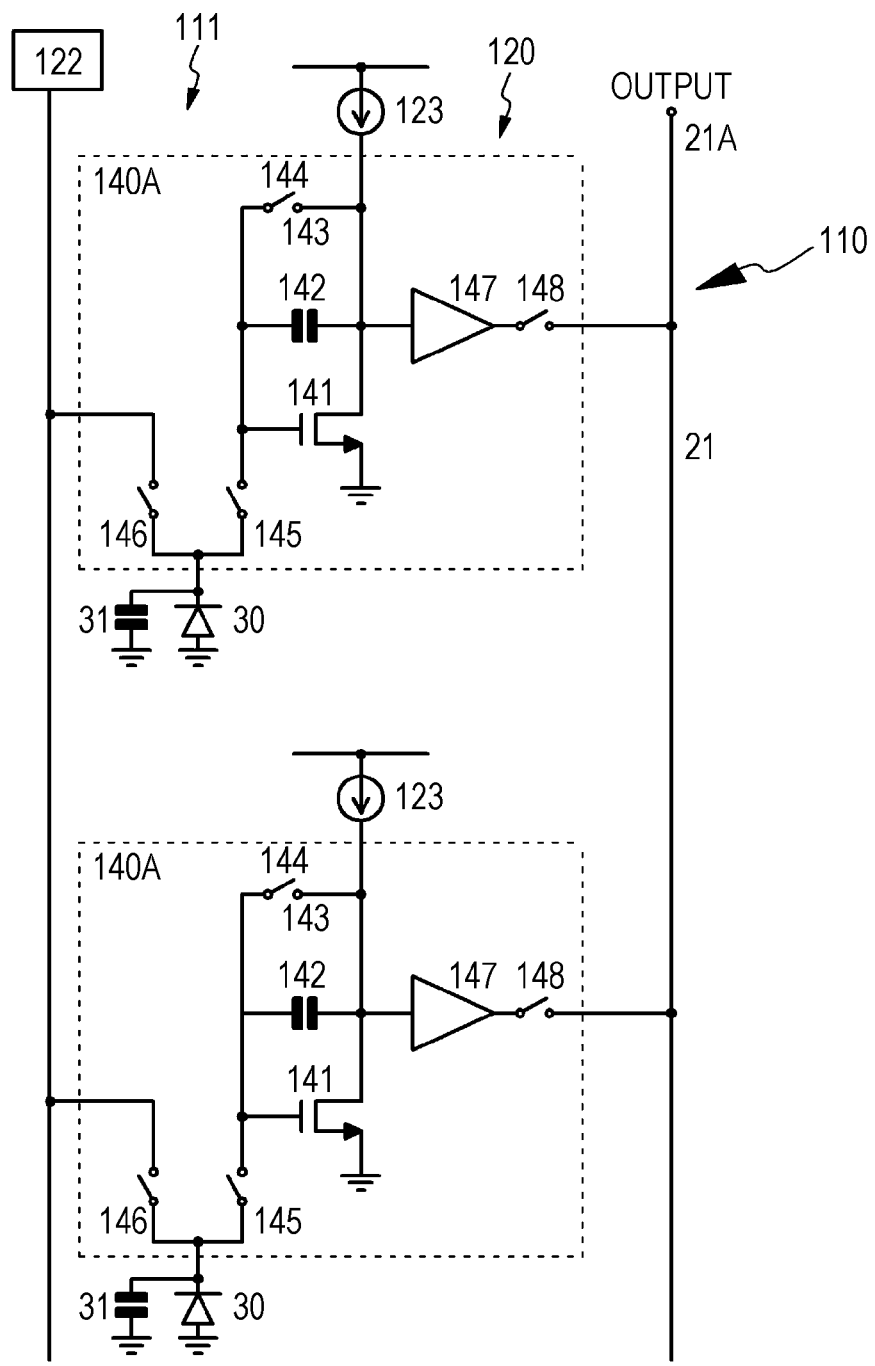
FIG. 23 is an equivalent circuit diagram of a portion of an imaging apparatus in Embodiment 5.

Embodiment 5 relates to an imaging apparatus according to the present disclosure, more specifically, relates to an imaging apparatus according to the second aspect of the present disclosure and a current/voltage conversion circuit according to the second aspect of the present disclosure. An equivalent circuit diagram of a portion of an imaging apparatus in Embodiment 5 (an equivalent circuit diagram of two imaging element units connected to one output wiring line) is illustrated in FIG. 23.

An imaging apparatus (specifically, an X-ray flat plane detector) 110 in Embodiment 5 includes an imaging panel 111 in which imaging element units 120 each included in one pixel or a plurality of pixels (specifically in Embodiment 5, one pixel) are arranged in a two-dimensional matrix form, and each imaging element unit 120 includes (a) an imaging element 30 which converts an incident electromagnetic wave (specifically, X-rays) to a current (charge), and (b) a current/voltage conversion circuit 140A which converts a current (charge) from the imaging element 30 to a voltage.

The current/voltage conversion circuit 140A includes a field effect transistor 141 and a capacitor section 142. A first end of the capacitor section 142 is connected to a one source/drain region of the field effect transistor 141. A second end of the capacitor section 142 is connected to a gate electrode of the field effect transistor 141 and an output section of the imaging element 30. The one source/drain region of the field effect transistor 141 is connected to a first power supply 123 and an output section of the current/voltage conversion circuit 140A. Furthermore, the current/voltage conversion circuit 140A further includes a short-circuiting circuit 143 having a reset switch circuit 144. The capacitor section 142 is connected in parallel with the short-circuiting circuit 143.

The current/voltage conversion circuit 140A further includes a first switch circuit 145 and a second switch circuit 146.

The output section of the imaging element 30 is connected to the second end of the capacitor section 142 via the first switch circuit 145 and connected to a second power supply 122 via the second switch circuit 146.

The first switch circuit 145 and the second switch circuit 146 operate complementarily.

Furthermore, the current/voltage conversion circuit 140A in Embodiment 5 is connected to the imaging element 30 which converts an incident electromagnetic wave (specifically, X-rays) to a current (charge). The current/voltage conversion circuit 140A in Embodiment 5 is a current/voltage conversion circuit which converts a current (charge) from the imaging element 30 to a voltage. The current/voltage conversion circuit 140A in Embodiment 5 includes (A) the field effect transistor 141, (B) the capacitor section 142, and (C) the first switch circuit 145 and the second switch circuit 146 which operate complementarily.

The first end of the capacitor section 142 is connected to the one source/drain region of the field effect transistor 141, and the second end of the capacitor section 142 is connected to the gate electrode of the field effect transistor 141.

The one source/drain region of the field effect transistor 141 is connected to the first power supply 123 and the output section of the current/voltage conversion circuit 140A.

The output section of the imaging element 30 is connected to the second end of the capacitor section 142 via the first switch circuit 145, and connected to the second power supply 122 via the second switch circuit 146. Note that, the current/voltage conversion circuit 140A further includes (D) the short-circuiting circuit 143 having the reset switch circuit 144.

The capacitor section 142 is connected in parallel with the short-circuiting circuit 143.

An incident electromagnetic wave is converted to a current by the imaging element 30. Charge is stored in the capacitor section 142 by the current from the imaging element 30. Furthermore, the current/voltage conversion circuit 140A further includes a buffer circuit 147 connected to the one source/drain region of the field effect transistor 141 and the output section of the current/voltage conversion circuit 140A. In other words, an input section of the buffer circuit 147 is connected to the one source/drain region of the field effect transistor 141, and an output section of the buffer circuit 147 is connected to the output section of the current/voltage conversion circuit 140A via an output switch circuit 148, and further connected to an output wiring line 21.

The imaging element unit 120 is integrally shaped. In other words, the imaging element 30 and the current/voltage conversion circuit 140A are integrally formed. Note that, a concrete configuration and a structure of the imaging element unit will be described in Embodiment 8. Furthermore, as for components themselves such as circuits and parts included in the imaging apparatus 110, the imaging element 30, and the current/voltage conversion circuit 140A, well-known circuits and parts can be used. As for components such as circuits and parts that drive the imaging apparatus 110 or the imaging element unit 120 as well, well-known circuits and parts can be used. Therefore, detailed description will be omitted.

Hereafter, operation of the imaging apparatus and the current/voltage conversion circuit in Embodiment 5 will be described with reference to FIG. 24A, FIG. 24B, FIG. 25A, FIG. 25B, and FIG. 26 which are equivalent circuit diagrams of the current/voltage conversion circuit.

[Step-500: Reset Mode]

First, initialization of the capacitor section 142 is conducted. Specifically, the first power supply 123 is brought into an on state, and the reset switch circuit 144 is brought into an on state (see FIG. 24A). As a result, the capacitor section 142 is brought into a short-circuiting state via the short-circuiting circuit 143, and the capacitor section 142 is reset. If a predetermined time elapses and resetting of the capacitor section 142 is completed, the reset switch circuit 144 is brought into the off state. Note that, at [step-500], the imaging element 30 is disconnected from the current/voltage conversion circuit 140A and the output section (cathode) of the imaging element 30 is connected to the second power supply 122 by bringing the first switch circuit 145 into an off state and bringing the second switch circuit 146 into an on state. Even if an electromagnetic wave (specifically, X-rays) is incident on the imaging element 30, therefore, charge is not stored in the capacitor section 142. Furthermore, the buffer circuit 147 is in an off state and the buffer circuit 147 is not driven, and the output switch circuit 148 is in an off state and the current/voltage conversion circuit 140A is disconnected from the output wiring line 21. [Step-500] to [Step-510] are conducted simultaneously in all imaging element units.

[Step-510: Sampling Mode]

Then, the imaging element 30 is disconnected from the second power supply 122, and the output section of the imaging element 30 is connected to the one source/drain region of the field effect transistor 141 and the second end of the capacitor section 142 by bringing the reset switch circuit 144 into the off state, bringing the first switch circuit 145 into the on state and bringing the second switch circuit 146 into the off state (see FIG. 24B). As a result, the incident electromagnetic wave is converted to a current by the imaging element 30, and charge is stored in the capacitor section 142 by the current from the imaging element 30.

[Step-520: Hold Mode]

At a time point when a predetermined time has elapsed, the imaging element 30 is disconnected from the current/voltage conversion circuit 140A and the output section (cathode) of the imaging element 30 is connected to the second power supply 122 by bringing the first switch circuit 145 into the off state and bringing the second switch circuit 146 into the on state (see FIG. 25A). Even if an electromagnetic wave (specifically, X-rays) is incident on the imaging element 30, therefore, charge is not stored in the capacitor section 142. [Step-520] and subsequent steps are conducted in the M imaging element units connected to the one output wiring line 21, in order.

M imaging element units 120 are connected to the output wiring line 21. An output voltage $V_O$ from a first imaging element unit 120, a second imaging element unit 120, a third imaging element unit 120, . . . , an m-th imaging element unit 120, an (m+1)-st imaging element unit 120, . . . , an M-th imaging element unit 120 in order is output to the output wiring line 21. Furthermore, in N output wiring lines 21, successive output of the output voltage $V_O$ to the output wiring line 21 is conducted. At [step-520], charge stored in the capacitor section 142 is held until [step-530] described below since [step-510] is completed.

[Step-530: Output Mode]

If it is turn of the imaging element unit 120 to output, the buffer circuit 147 and the output switch circuit 148 are brought into the on state (see FIG. 25B). As a result, the current/voltage conversion circuit 140A is connected to the output wiring line 21, and an output voltage based upon charge stored in the capacitor section 142 is output to the output wiring line 21. In other words, the output voltage based upon the energy quantity of the incident electromagnetic wave is output to the output wiring line 21.

[Step-540: Sleep Mode]

Figure 26:
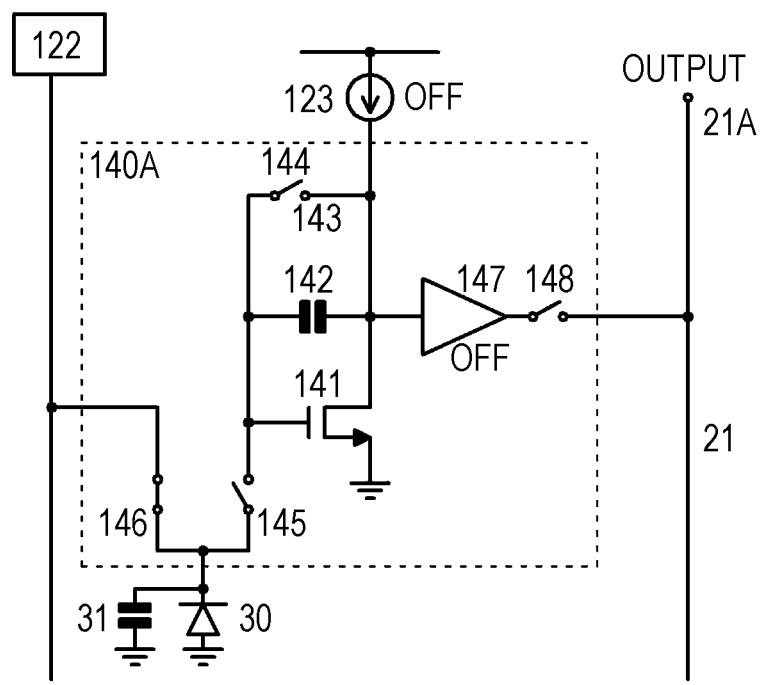
FIG. 26 is an equivalent circuit diagram for explaining the operation of the imaging element unit included in the imaging apparatus in Embodiment 5 subsequent to FIG. 25B.

Then, the buffer circuit 147 and the output switch circuit 148 are brought into the off state, and the first power supply 123 is brought into an off state (see FIG. 26).

Each imaging element unit in the imaging panel in Embodiment 5 includes one imaging element and one current/voltage conversion circuit. Furthermore, the current/voltage conversion circuit in Embodiment 5 is provided to correspond to one imaging element. Unlike the conventional technique, therefore, a problem such as noise occurrence in the current/voltage conversion circuit caused by a row wiring line does not occur. A high S/N ratio can be obtained, and reduction of the irradiation quantity of the electromagnetic wave (X-rays) can be attempted. In addition, it is possible to provide an imaging element unit which is strong against external disturbance as well.

In Embodiment 5 to Embodiment 7 as well, it is possible to use a configuration in which the current/voltage conversion circuit includes a plurality of capacitor sections and a changeover switch circuit and each of the plurality of capacitor sections is connected to the one source/drain region and the gate electrode of the field effect transistor via the changeover switch circuit, in the same way as the description in Embodiment 2.

Embodiment 6

Figure 27:
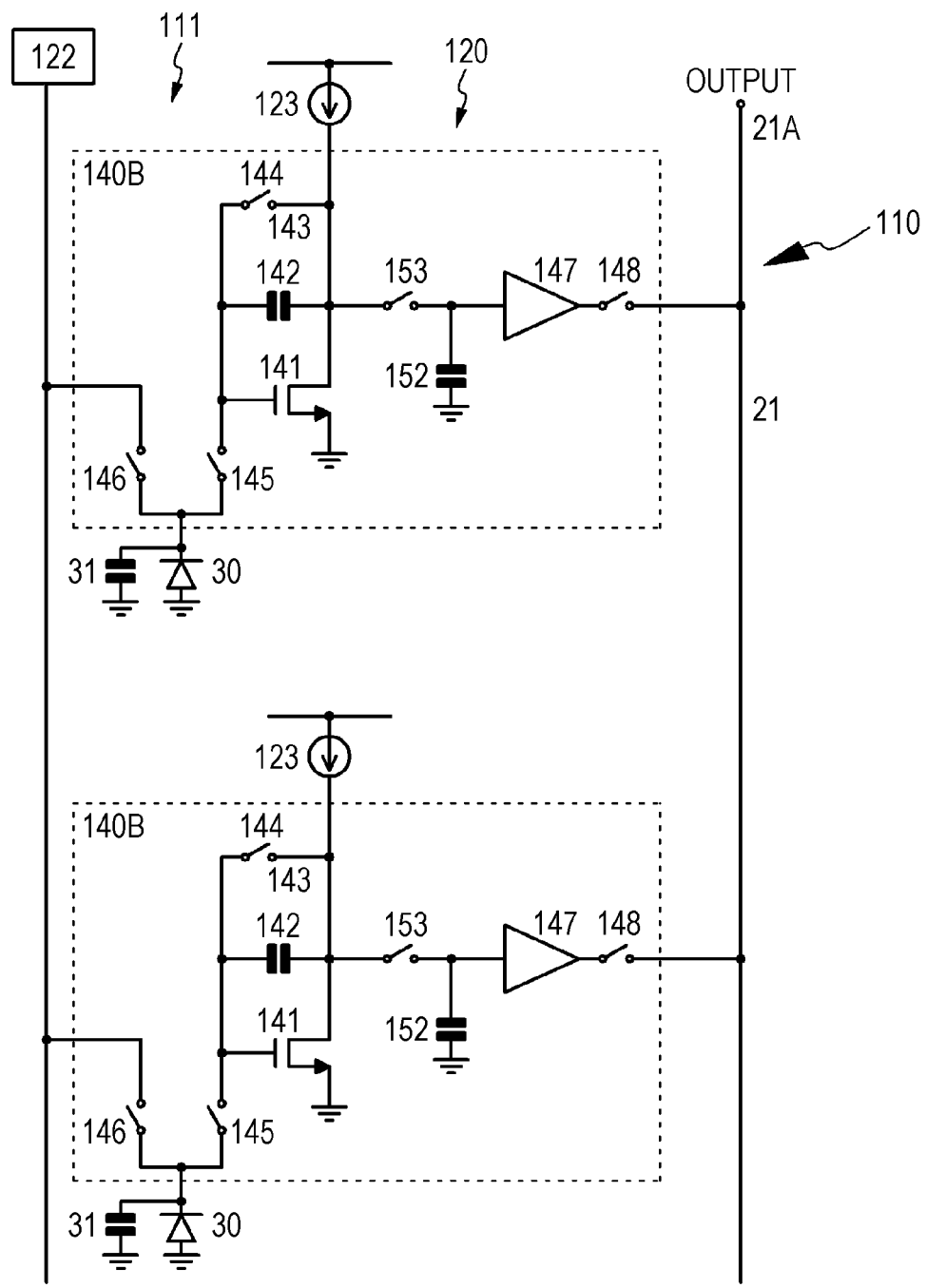
FIG. 27 is an equivalent circuit diagram of a portion of an imaging apparatus in Embodiment 6.

Embodiment 6 is a modification of Embodiment 5. An equivalent circuit diagram (an equivalent circuit diagram of two imaging element units connected to one output wiring line) is illustrated in FIG. 27. A current/voltage conversion circuit 140B in an imaging apparatus in Embodiment 6 further includes a second capacitor section 152 and a third switch circuit 153 which conducts the same operation as that of the first switch circuit 145. A first end of the second capacitor section 152 is connected to the one source/drain region of the field effect transistor 141 via the third switch circuit 153. Furthermore, the first end of the second capacitor section 152 is connected to the input section of the buffer circuit 147.

Except the points described heretofore, the configuration and structure of the imaging apparatus or the current/voltage conversion circuit in Embodiment 6 can be made similar to the configuration and structure of the imaging apparatus or the current/voltage conversion circuit described in Embodiment 5. Therefore, detailed description will be omitted.

Hereafter, operation of the imaging apparatus and the current/voltage conversion circuit in Embodiment 6 will be described with reference to FIG. 28A, FIG. 28B, FIG. 29A, FIG. 29B, and FIG. 30 which are equivalent circuit diagrams of the current/voltage conversion circuit.

[Step-600: Reset Mode]

First, initialization of the capacitor section 142 is conducted. Specifically, the capacitor section 142 is reset in the same way as [step-500] in Embodiment 5 by bringing the first power supply 123 into the on state, bringing the reset switch circuit 144 into the on state and bringing the third switch circuit 153 into an off state (see FIG. 28A). If a predetermined time elapses and resetting of the capacitor section 142 is completed, the reset switch circuit 144 is brought into the off state. [Step-600] to [step-610] are conducted in all imaging element units simultaneously.

[Step-610: Sampling Mode]

Then, the third switch circuit 153 is brought into an on state, and in addition, the first switch circuit 145 is brought into the on state and the second switch circuit 146 is brought into the off state. The incident electromagnetic wave is converted to a current by the imaging element 30 in the same way as [step-510] in Embodiment 5. Charge is stored in the capacitor section 142, and further in the second capacitor section 152 by the current from the imaging element 30 (see FIG. 28B). Potential at the first end of the second capacitor section 152 becomes $[(Q_{in}/C_{int})+V_{gs}]$. Note that, $V_{gs}$ is potential between the gate and source of the field effect transistor 141.

[Step-620: Hold Mode]

At a time point when a predetermined time has elapsed, the first power supply 123 is brought into the off state, the first switch circuit 145 is brought into the off state and the second switch circuit 146 is brought into the on state. As a result, the imaging element 30 is disconnected from the current/voltage conversion circuit 140B and the output section (cathode) of the imaging element 30 is connected to the second power supply 122. The third switch circuit 153 is brought into the off state (see FIG. 29A). [Step-620] and subsequent steps are conducted in the M imaging element units connected to one output wiring line 21 successively.

[Step-630: Output Mode]

If it is turn of the imaging element unit 120 to output, the buffer circuit 147 and the output switch circuit 148 are brought into the on state (see FIG. 29B). As a result, the current/voltage conversion circuit 140B is connected to the output wiring line 21, and an output voltage based upon charge (input charge quantity) stored in the second capacitor section 152 is output to the output wiring line 21. In other words, the output voltage based upon the energy quantity of the incident electromagnetic wave is output to the output wiring line 21.

[Step-640: Sleep Mode]

Figure 30:
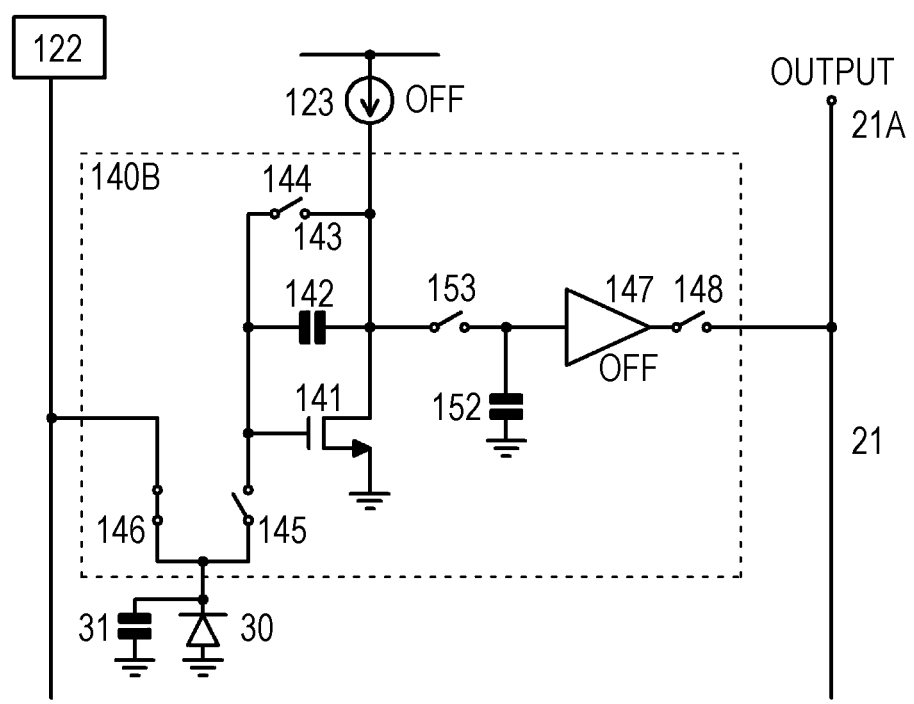
FIG. 30 is an equivalent circuit diagram for explaining the operation of the imaging element unit included in the imaging apparatus in Embodiment 6 subsequent to FIG. 29B.

Then, the buffer circuit 147 and the output switch circuit 148 are brought into the off state (see FIG. 30).

Embodiment 7

Figure 31:
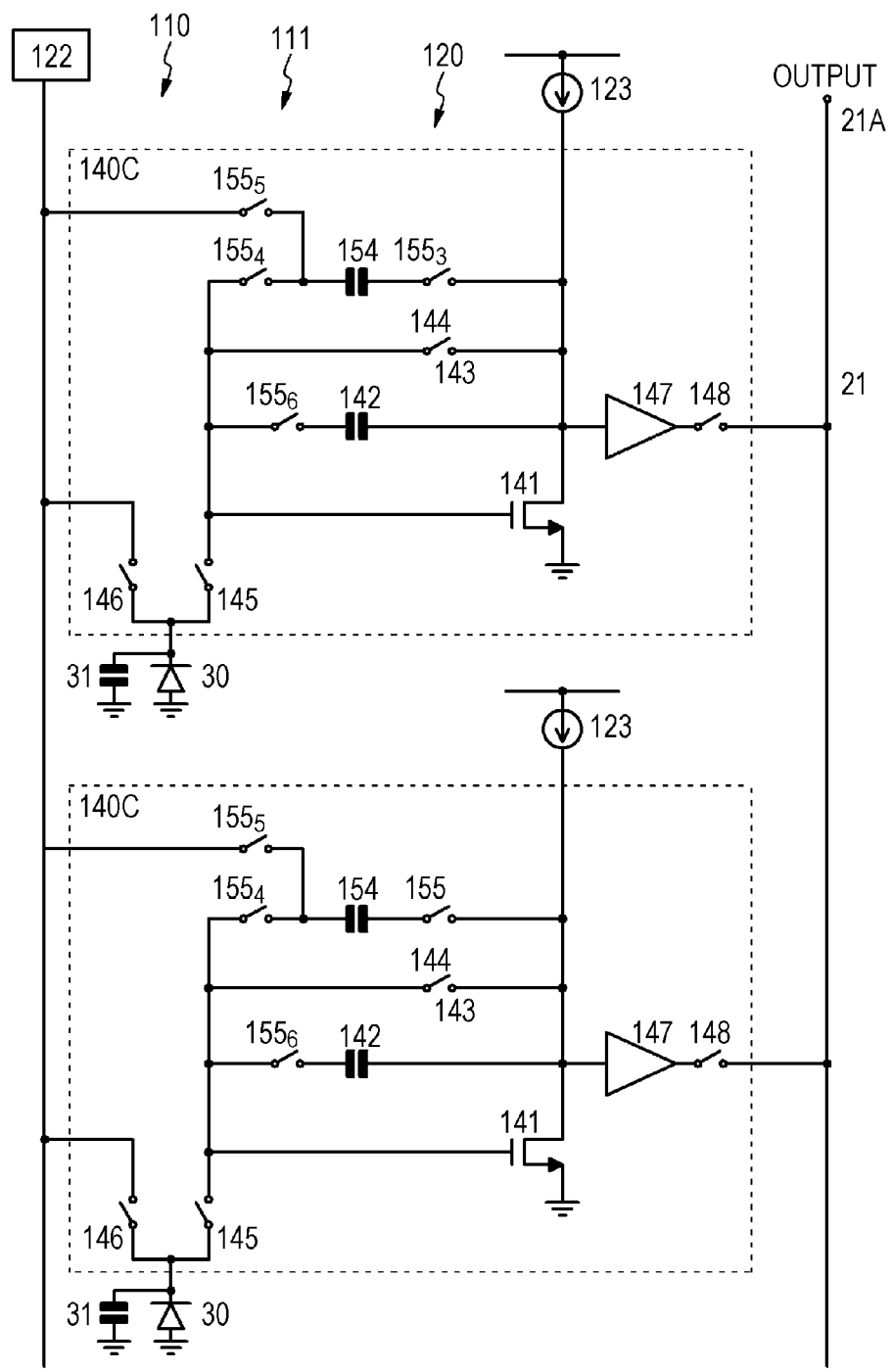
FIG. 31 is an equivalent circuit diagram of a portion of an imaging apparatus in Embodiment 7.
Figure 32:
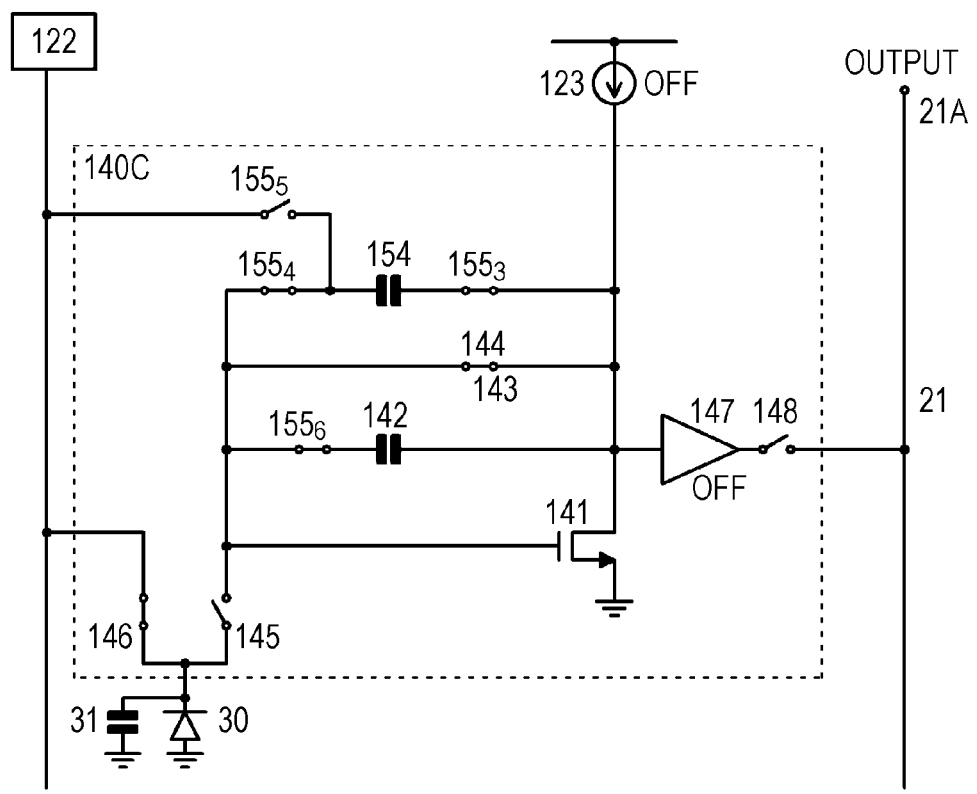
FIG. 32 is an equivalent circuit diagram for explaining an operation of an imaging element unit included in the imaging apparatus in Embodiment 7.

Embodiment 7 is also a modification of Embodiment 5. An equivalent circuit diagram (an equivalent circuit diagram of two imaging element units connected to one output wiring line) is illustrated in FIG. 31. A current/voltage conversion circuit 140C in an imaging apparatus in Embodiment 7 further includes a second capacitor section 154, a third switch circuit $155_3$, a fourth switch circuit $155_4$, a fifth switch circuit $155_5$, and a sixth switch circuit $155_6$. A first end of the second capacitor section 154 is connected to the one source/drain region of the field effect transistor 141 via the third switch circuit $155_3$. A second end of the second capacitor section 154 is connected to the gate electrode of the field effect transistor 141 via the fourth switch circuit $155_4$, and connected to a third power supply via the fifth switch circuit $155_5$. In addition, the sixth switch circuit $155_6$ is disposed between the second end of the capacitor section 142, and the first switch circuit 145 and the gate electrode of the field effect transistor 141. Note that, in Embodiment 7, the second power supply and the third power supply are the same power supply, and they are collectively referred to as second power supply 122.

Except the points described heretofore, the configuration and structure of the imaging apparatus or the current/voltage conversion circuit in Embodiment 7 can be made similar to the configuration and structure of the imaging apparatus or the current/voltage conversion circuit described in Embodiment 5. Therefore, detailed description will be omitted.

Hereafter, operation of the imaging apparatus and the current/voltage conversion circuit in Embodiment 7 will be described with reference to FIGS. 32 to 38 which are equivalent circuit diagrams of the current/voltage conversion circuit.

[Step-700: Reset Mode]

First, initialization of the capacitor section 142 is conducted. Specifically, the capacitor section 142 is reset in the same way as [step-500] in Embodiment 5 by bringing the first power supply 123 into the on state, bringing the reset switch circuit 144, the third switch circuit $155_3$, the fourth switch circuit $155_4$, and the sixth switch circuit $155_6$ into the on state and bringing the fifth switch circuit $155_5$ and the output switch circuit 148 into the off state (see FIG. 32). [Step-700] to [step-720] are conducted in all imaging element units simultaneously. At [Step-700], noise is generated in the second switch circuit 146.

[Step-710: Pre-Sampling Mode]

Figure 33:
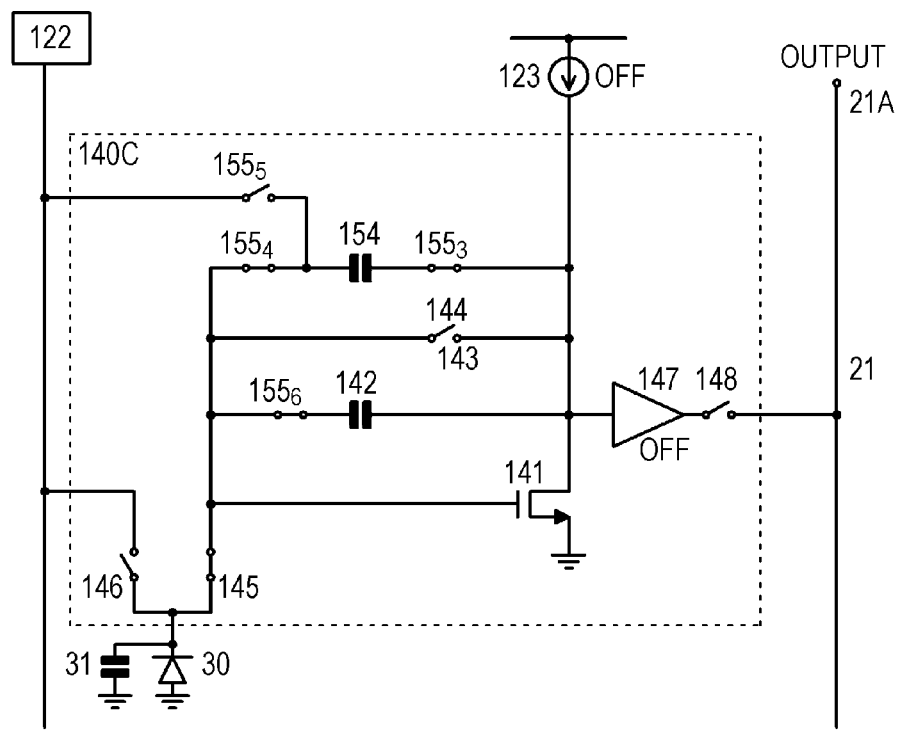
FIG. 33 is an equivalent circuit diagram for explaining the operation of the imaging element unit included in the imaging apparatus in Embodiment 7 subsequent to FIG. 32.
Figure 34:
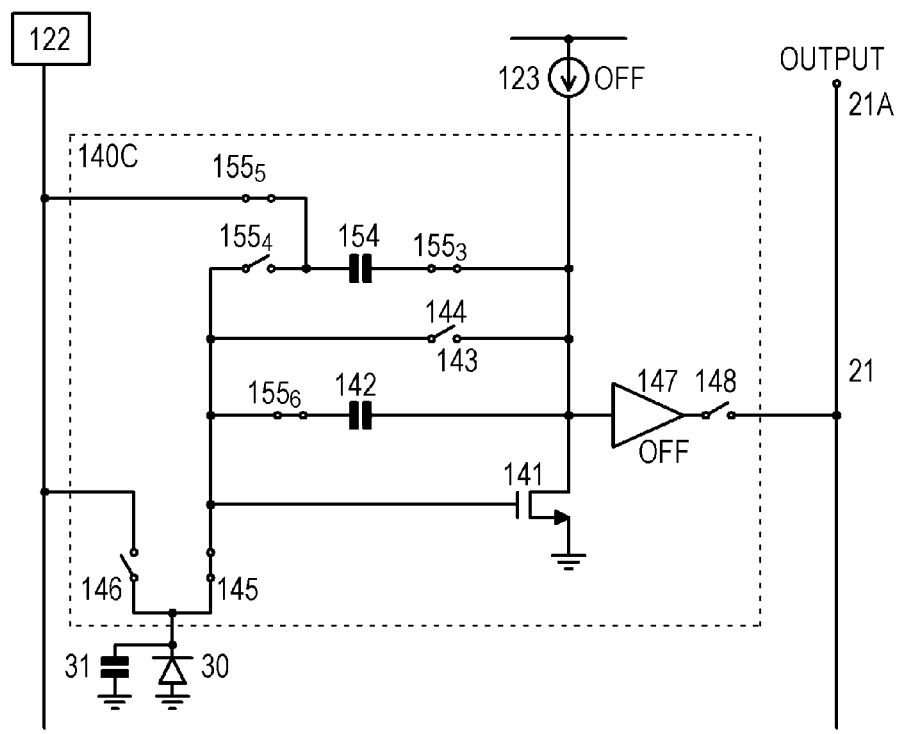
FIG. 34 is an equivalent circuit diagram for explaining the operation of the imaging element unit included in the imaging apparatus in Embodiment 7 subsequent to FIG. 33.
Figure 35:
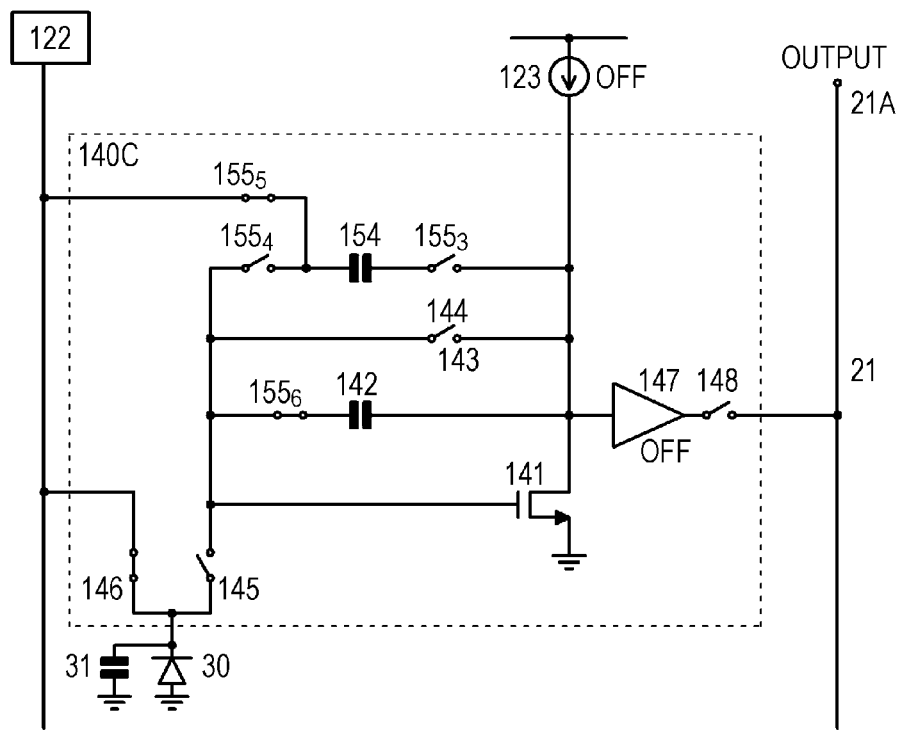
FIG. 35 is an equivalent circuit diagram for explaining the operation of the imaging element unit included in the imaging apparatus in Embodiment 7 subsequent to FIG. 34.

If a predetermined time elapses and resetting of the capacitor section 142 is completed, the reset switch circuit 144 is brought into an off state, the first switch circuit 145 is brought into an on state, and the second switch circuit 146 is brought into an off state (see FIG. 33). At this [step-710], noise (charge) stored in the parasitic capacitance 31 at [step-700] is divided and stored in the capacitor section 142 and the second capacitor section 154.

[Step-720: Sampling Mode]

Then, the fourth switch circuit $155_4$ is brought into the off state and the fifth switch circuit $155_5$ is brought into the on state (see FIG. 34) and the electromagnetic wave is incident on the imaging element 30. As a result, the incident electromagnetic wave is converted to a current by the imaging element 30, and charge is stored in the capacitor section 142, and further in the second capacitor section 154 by the current from the imaging element 30. Charge corresponding to a potential difference across the capacitor section 142 is stored in the second capacitor section 154.

[Step-730: Hold Mode]

At a time point when a predetermined time has elapsed, the first switch circuit 145 is brought into the off state and the second switch circuit 146 is brought into the on state. As a result, the imaging element 30 is disconnected from the current/voltage conversion circuit 140C and the output section (cathode) of the imaging element 30 is connected to the second power supply 122. The third switch circuit $155_3$ is brought into the off state (see FIG. 35). [Step-730] and subsequent steps are conducted in the M imaging element units connected to one output wiring line 21 successively.

[Step-740: Pre-Output Mode]

Figure 36:
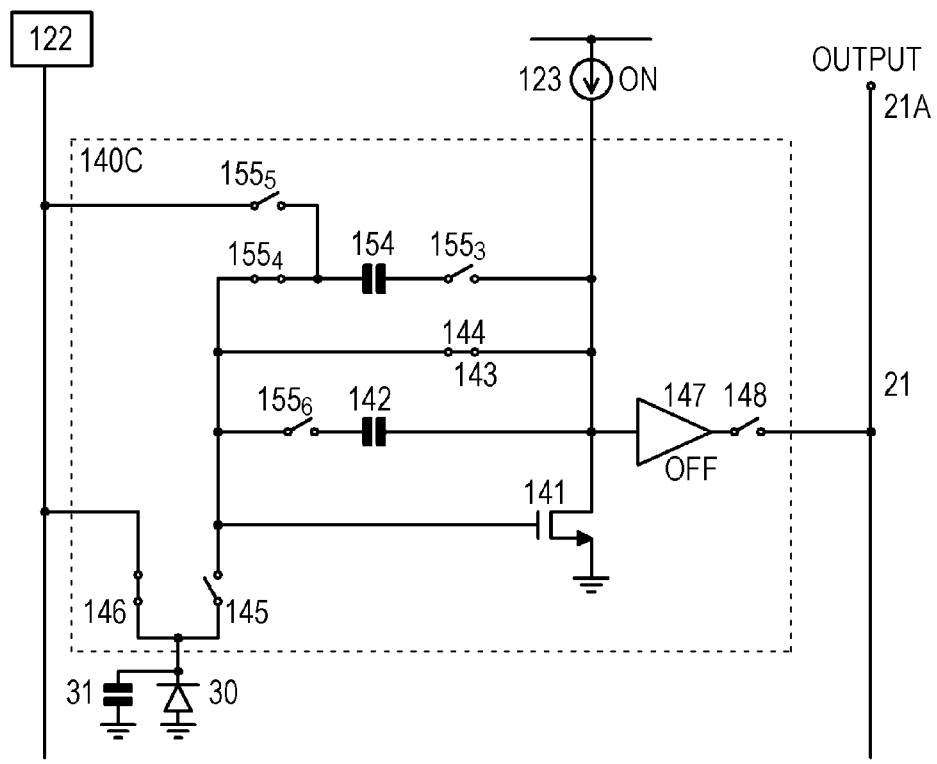
FIG. 36 is an equivalent circuit diagram for explaining the operation of the imaging element unit included in the imaging apparatus in Embodiment 7 subsequent to FIG. 35.
Figure 37:
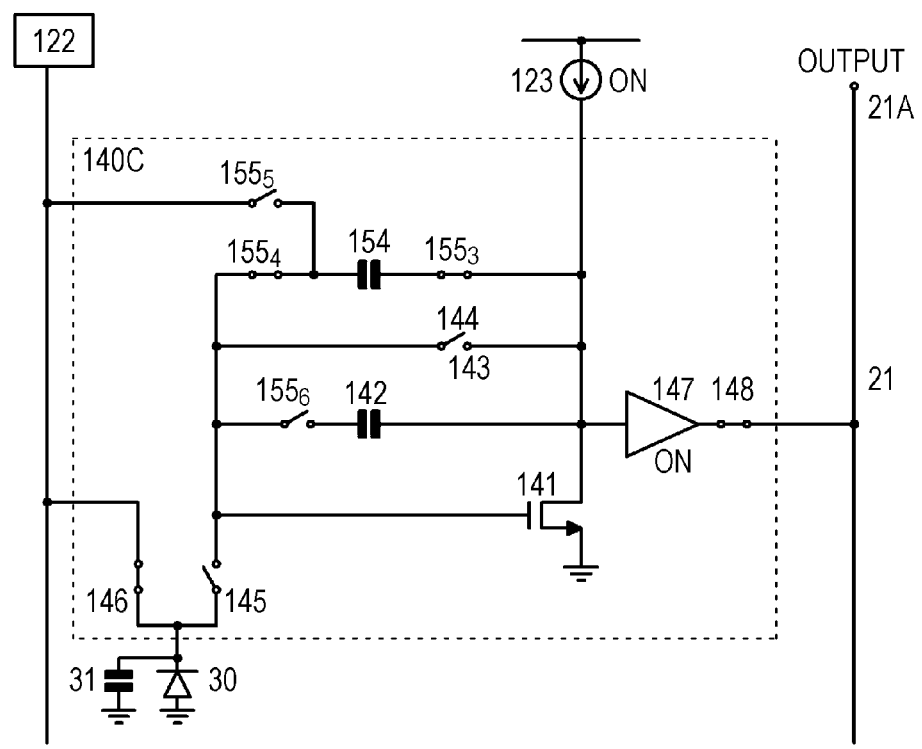
FIG. 37 is an equivalent circuit diagram for explaining the operation of the imaging element unit included in the imaging apparatus in Embodiment 7 subsequent to FIG. 36.

If it is turn of the imaging element unit 20 to output, the fifth switch circuit $155_5$ and the sixth switch circuit $155_6$ are brought into the off state, and the reset switch circuit 144 and the fourth switch circuit $155_4$ are brought into the on state (see FIG. 36). As a result, potential at each node can be set to a predetermined value before transition from [step-750] described later to [step-760].

[Step-750: Output Mode]

Then, the reset switch circuit 144 is brought into the off state and the third switch circuit $155_3$ is brought into the on state. In addition, the buffer circuit 147 and the output switch circuit 148 are brought into the on state (see FIG. 37). As a result, an output voltage $V_O$ based upon charge (input charge quantity) stored in the second capacitor section 154 is output to the output wiring line 21. In other words, the output voltage $V_O$ based upon the energy quantity of the incident electromagnetic wave is output to the output wiring line 21.

[Step-760: Sleep Mode]

Figure 38:
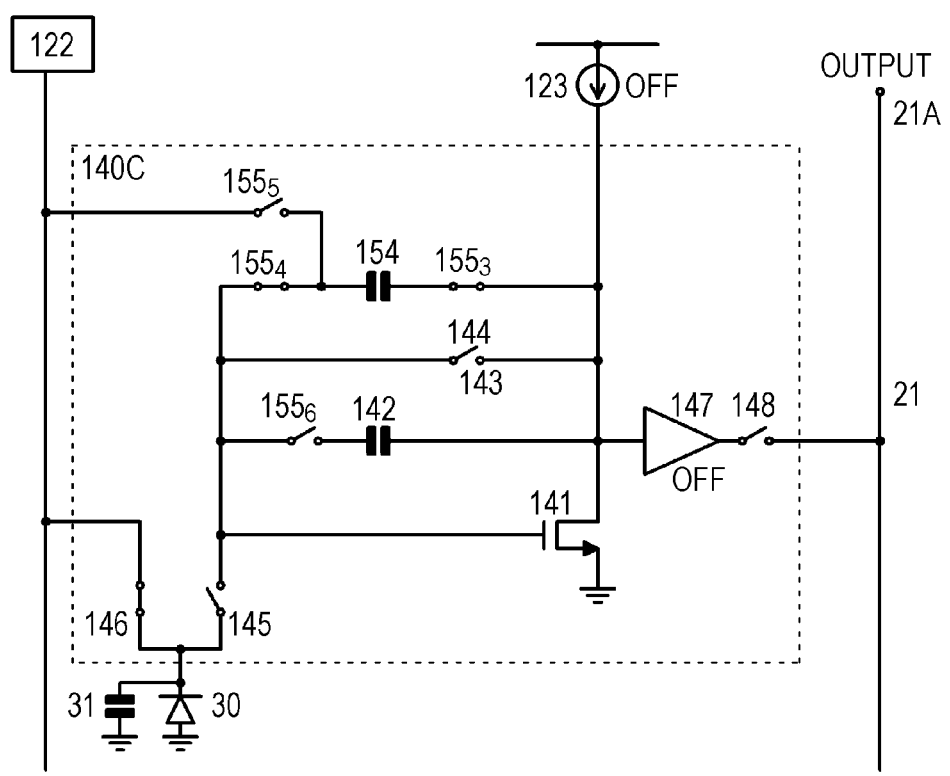
FIG. 38 is an equivalent circuit diagram for explaining the operation of the imaging element unit included in the imaging apparatus in Embodiment 7 subsequent to FIG. 37.

Then, the buffer circuit 147 and the output switch circuit 148 are brought into the off state, and the first power supply 123 is brought into the off state (see FIG. 38).

Embodiment 8

Figure 39:
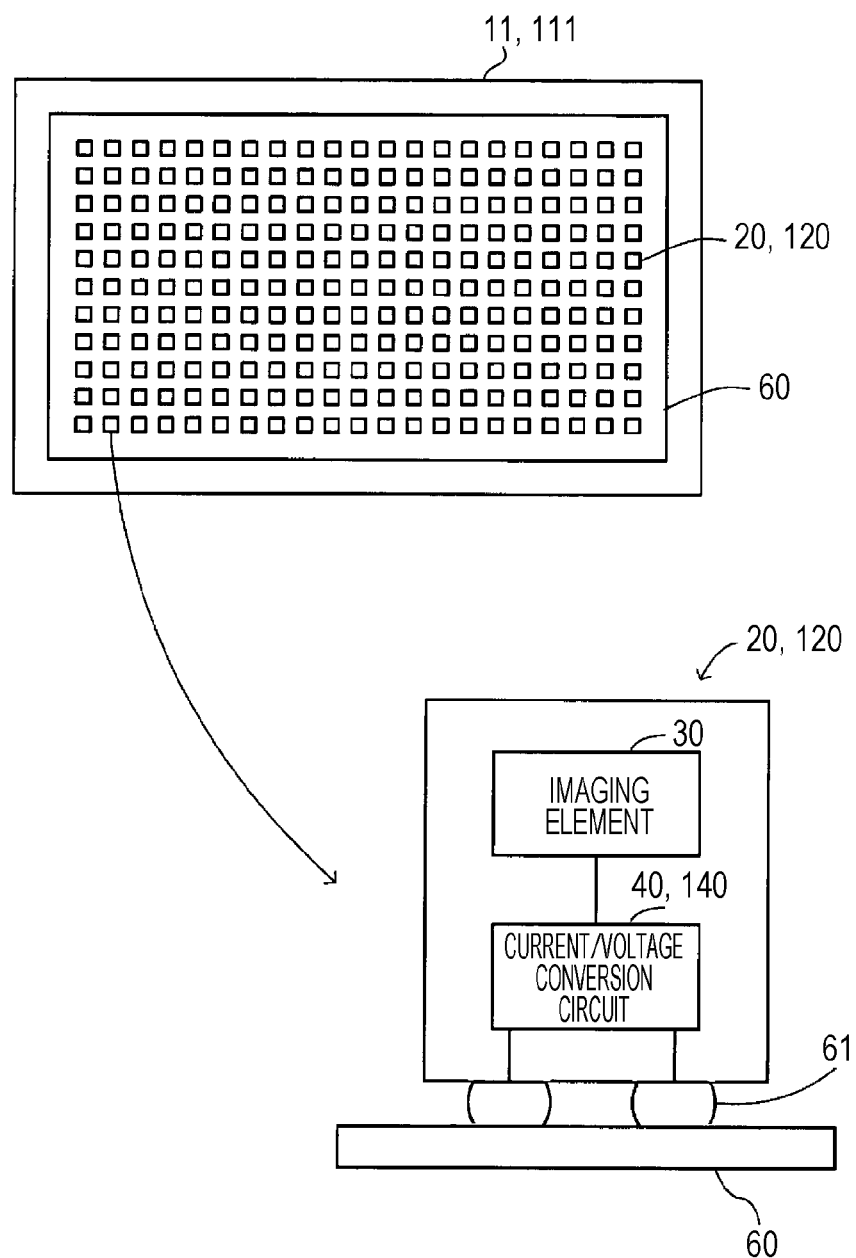
FIG. 39 is a diagram illustrating a configuration example of an imaging panel and a state in which an imaging element unit corresponding to one pixel is bonded to a wiring layer, in Embodiment 8.

In Embodiment 8, details of the imaging element unit will be described. A configuration example of the imaging panel 11, 111 and a state in which imaging element units 20, 120 corresponding to one pixel is bonded to a wiring layer 60 are illustrated in FIG. 39. Note that, in some drawings, the imaging element unit 20, 120 is collectively represented by the reference numeral 20.

As described earlier, the imaging element unit 20, 120 includes the imaging element 30 (for example, a photodiode) and the current/voltage conversion circuit 40, 140. The imaging element unit 20, 120 is a minute light receiving chip obtained by integrally shaping the imaging element 30 and the current/voltage conversion circuit 40, 140 with resin with one pixel taken as unit.

Specifically, the imaging element unit 20, 120 takes a plane shape of a rectangle that is 200 μm or less in side. Furthermore, solder bumps 61 which are projection-shaped solder terminals are formed for the imaging element unit 20, 120. In other words, solder bumps 61 are formed on a bonding face of the imaging element unit 20, 120. The current/voltage conversion circuit 40, 140 is connected to the wiring layer 60 via the solder bumps 61. A wiring line 63 which connects the current/voltage conversion circuit 40, 140 to an external processing section (for example, an A/D conversion section or the like) is formed in the wiring layer 60. The imaging element unit 20, 120 is subjected to FC bonding (flip chip bonding) to the wiring layer 60 via the solder bumps 61 by taking a pixel as the unit. The wiring layer 60 includes, for example, a flexible print wiring plate. When electrically connecting a chip surface to a substrate, connection is not conducted by a wire in the FC bonding unlike wire bonding. In the FC bonding, connection is conducted by solder bumps arranged in an array. According to such a configuration, it becomes possible to make the area of the imaging panel 11, 111 large and, in addition, it becomes possible to manufacture the imaging panel 11, 111 cheaply.

Figure 40A:
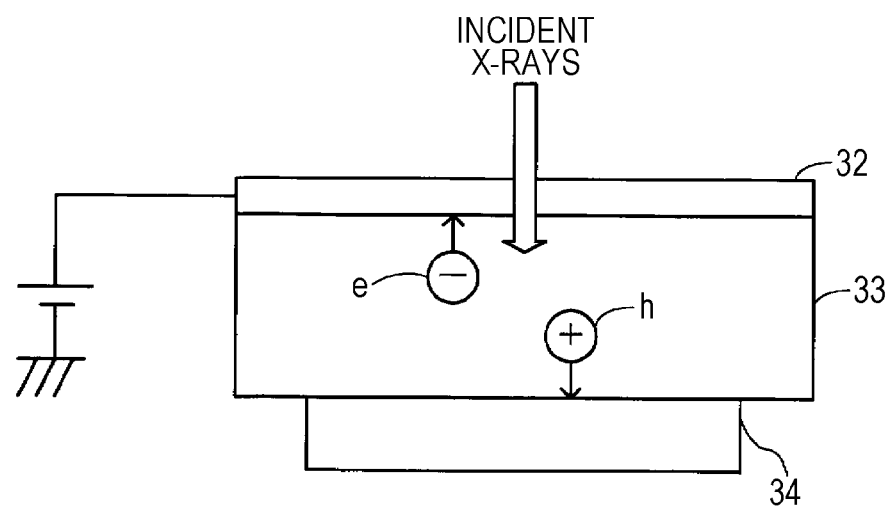
FIGS. 40A and 40B are conceptual sectional views of an imaging element.

FIG. 40A is a conceptual sectional view of a part. In an X-ray flat panel detector (FPD) of direct conversion system, an imaging element 30 has a structure in which a bias electrode 32, an X-ray conversion layer 33 formed of semiconductor crystal such as amorphous selenium semiconductor (a-Se), and a pixel electrode 34 are laminated. X-rays emitted from an X-ray generation apparatus (not illustrated) are transmitted through a subject (not illustrated) such as a living body, then passed through the bias electrode 32, and incident on the X-ray conversion layer 33. In the X-ray conversion layer 33, charge (pairs of holes and electrons) corresponding to an incident X-ray quantity is generated. Positive potential is given to the bias electrode 32. Therefore, an electron e having negative charge moves to the bias electrode 32 side, and a hole h having positive charge moves to the pixel electrode 34 side. The pixel electrode 34 is connected to the first switch circuit 45 and the second switch circuit 46. The hole h which has moved to the pixel electrode 34 side charges the capacitor section 42 via the first switch circuit 45.

Figure 40B:
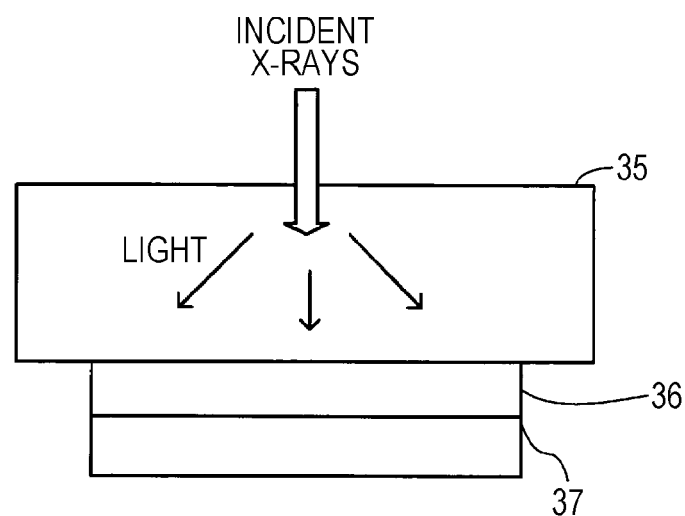

FIG. 40B is a conceptual sectional view of a part. In an X-ray flat panel detector (FPD) of indirect conversion system, the imaging element 30 has a structure in which a scintillator layer 35, a photodiode 36, and a pixel electrode 37 are laminated. X-rays emitted from an X-ray generation apparatus (not illustrated) are transmitted through a subject (not illustrated) such as a living body, then incident on the scintillator layer 35. In the scintillator layer 35, the incident X-rays are converted to an optical signal. Whether the optical signal is strong or weak is converted to an electric signal representing whether charge is large or small by the photodiode 36. The pixel electrode 37 is connected to the first switch circuit 45 and the second switch circuit 46. Generated charge charges the capacitor section 42 via the first switch circuit 45.

Figure 41:
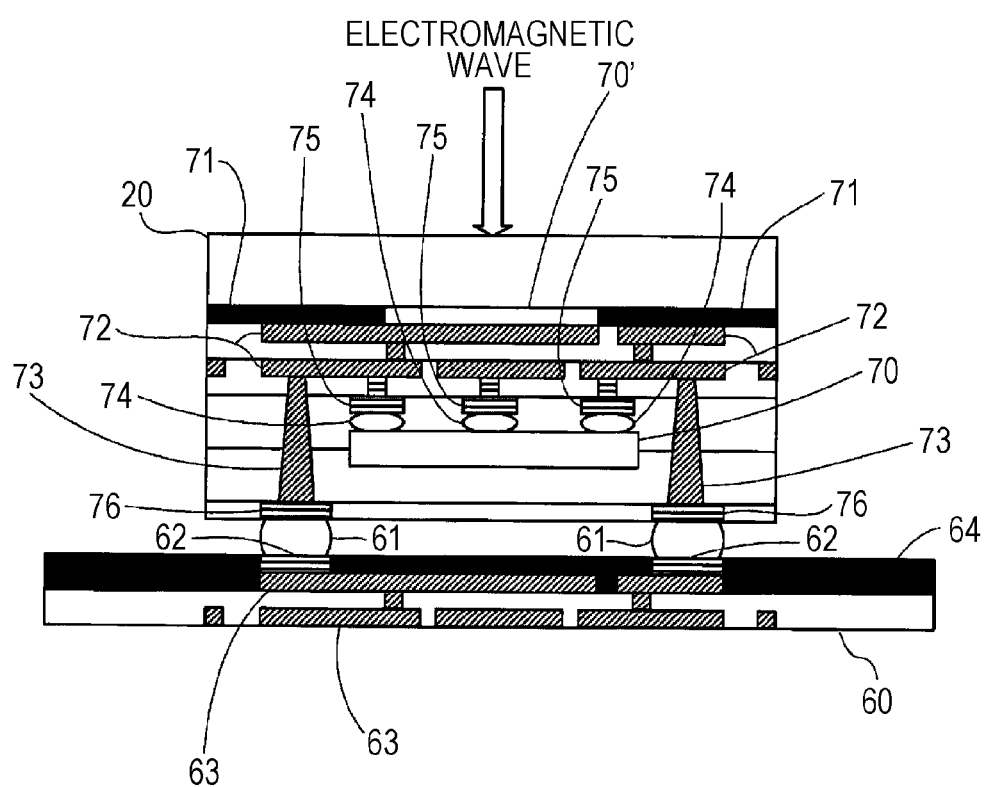
FIG. 41 is a schematic sectional view of an imaging element unit.

FIG. 41 illustrates a state in which the imaging element unit 20, 120 is bonded to the wiring layer 60. Note that, the imaging element unit 20, 120 illustrated in FIG. 41 includes a light receiving IC (Integrated Circuit) 70 in which the imaging element 30 and the current/voltage conversion circuit 40, 140 are formed as one chip.

The imaging element unit 20, 120 further includes light shielding films 71, wiring lines 72, via holes 73, under bump metals (UBM) 75 and 76, and solder bumps 61, besides the light receiving IC 70. Here, the light shielding films 71 cover faces of the light receiving IC 70 other than a light receiving face 70'. The light receiving IC 70 is solder-bonded by solder bumps 74 for light receiving IC, and is connected to the wiring lines 72 via the solder bumps 74 for light receiving IC and the under bump metals 75. Note that, under bump metals 62, 75 and 76 are metal layers which become underlying layers for solder bumps to prevent diffusion of solder and secure favorable joining with solder. The under bump metals 62, 75 and 76 include, for example, nickel (Ni) or the like. Furthermore, the wiring lines 72 are connected to first ends of the via holes 73. Second ends of the via holes 73 are connected to the under bump metals 76. Note that, the via holes 73 are filled with conductive metal on the basis of the via fill plating method.

The imaging element unit 20, 120 is FC-bonded to the wiring layer 60 via the solder bumps 61 and the under bump metals 62 formed on the wiring lines 63. As for the wiring lines 63, the under bump metals 62 are provided on solder places of the wiring lines 63. A light shielding film 64 is formed on the surface of the wiring lines 63. Furthermore, multi-layer wiring lines 63 are formed in the wiring layer 60.

If an electromagnetic wave (X-rays) is incident on the light receiving face 70' of the imaging element unit 20, 120, the imaging element (not illustrated) in the light receiving IC 70 converts the electromagnetic wave to a current signal, and the current/voltage conversion circuit (not illustrated) in the light receiving IC 70 converts the current signal to a voltage signal. The voltage signal generated in the imaging element unit 20, 120 is sent to a processing section in a subsequent stage via the wiring line 63 in the wiring layer 60.

Figure 42A:
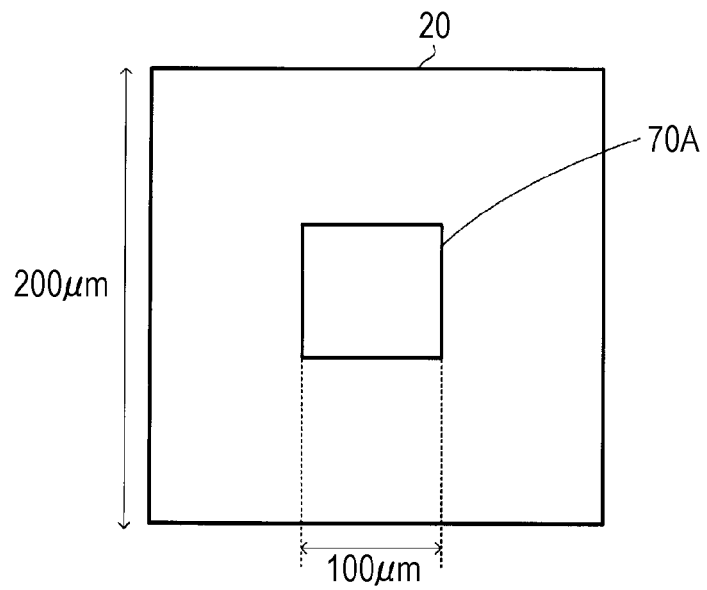
FIGS. 42A and 42B are schematic views of an imaging element unit obtained when the imaging element unit is viewed from above and from below.
Figure 42B:
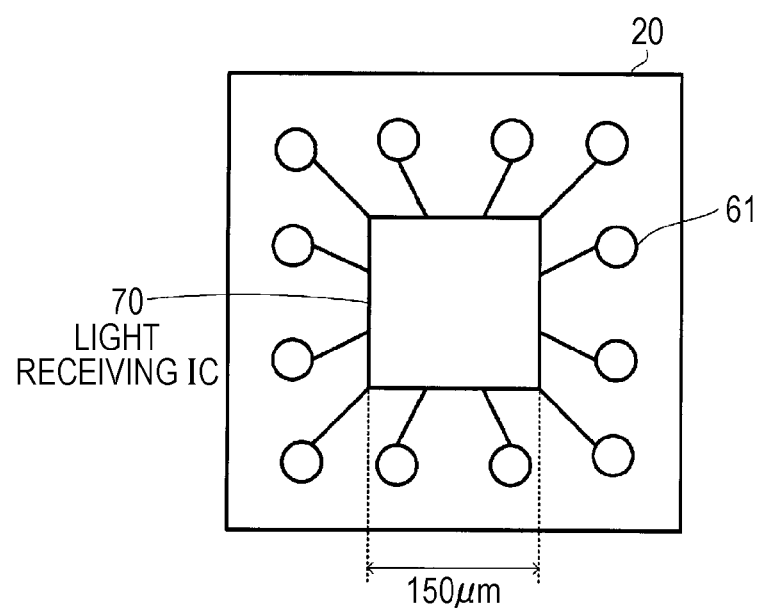

FIG. 42A is a schematic view of the imaging element unit 20, 120 obtained when the imaging element unit 20, 120 is viewed from above. The imaging element unit 20, 120 is a minute chip having a rectangular plane shape, which is, for example, 200 µm or less in each side. Furthermore, the light receiving face 70' takes a rectangular shape, which is, for example, 100 µm or less in each side. FIG. 42B is a schematic view of the imaging element unit 20, 120 obtained when the imaging element unit 20, 120 is viewed from below. For example, twelve solder bumps 61 are formed on the back of the imaging element unit 20, 120. Each of the solder bumps 61 has a diameter of, for example, 15 µm or less. The light receiving IC 70 is a minute chip having a rectangular plane shape, which is, for example, 150 µm or less in each side. Note that, the imaging element unit 20, 120 has a thickness (excluding a thickness of the solder bumps 61) of, for example, 20 µm or less. However, these numerical values are examples.

Figure 43:
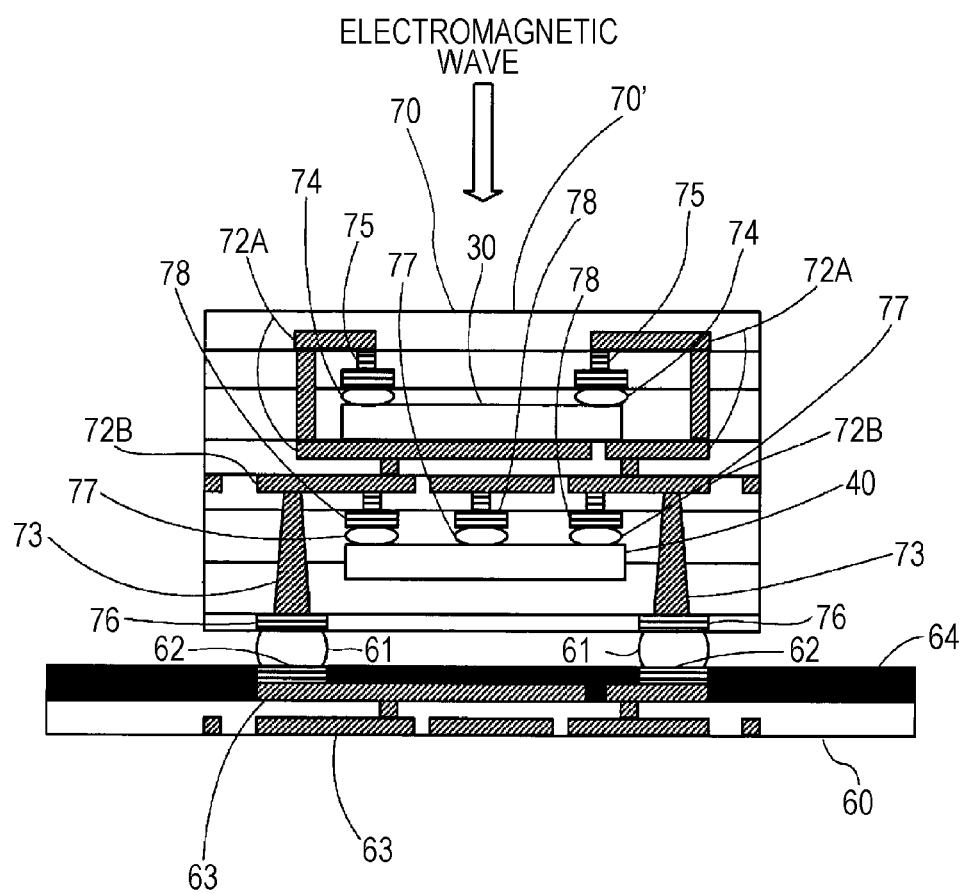
FIG. 43 is a conceptual sectional view of a modification of an imaging element unit.

FIG. 43 illustrates a schematic sectional view of a modification of the imaging element unit. In the modification of the imaging element unit, the imaging element unit has a two-layer structure. In other words, the imaging element 30 is disposed in an upper layer on which the electromagnetic wave is incident, and the current/voltage conversion circuit 40, 140 is disposed in a lower layer.

Here, the imaging element unit 20, 120 includes wiring lines 72A and 72B, under bump metals 75, 76 and 78, and solder bumps 74 and 77 for light receiving IC, besides the imaging element 30 and the current/voltage conversion circuit 40, 140. The imaging element 30 is solder-bonded by the solder bumps 74 for light receiving IC, and is connected to the wiring lines 72A via the solder bumps 74 for light receiving IC and the under bump metals 75. Furthermore, the current/voltage conversion circuit 40, 140 is solder-bonded by the solder bumps 77 for light receiving IC, and connected to the wiring lines 72B via the solder bumps 77 for light receiving IC and the under bump metals 78. The wiring lines 72A and the wiring lines 72B are connected to each other. The wiring lines 72B are further connected to via holes 73. The via holes 73 are connected to the under bump metals 76. Note that, the via holes 73 are filled with conductive metal on the basis of the via fill plating method. The imaging element unit 20, 120 is FC-bonded to the wiring layer 60 via the solder bumps 61 and the under bump metals 62.

In the imaging element unit 20, 120, the imaging element 30 is disposed in the upper layer on which light is incident in this way. As a result, it is possible to make a light receiving area on one chip large and it becomes possible to improve the light receiving efficiency. Furthermore, the pitch of the imaging element units can be made narrow. Therefore, it becomes possible to increase the number of imaging element units that can be bonded per unit area and it becomes possible to improve the resolution of the imaging panel. For example, the bonding pitch at the time when the imaging element units 20, 120 are FC-bonded to the wiring layer 60 is 420 µm or less.

Figure 44:
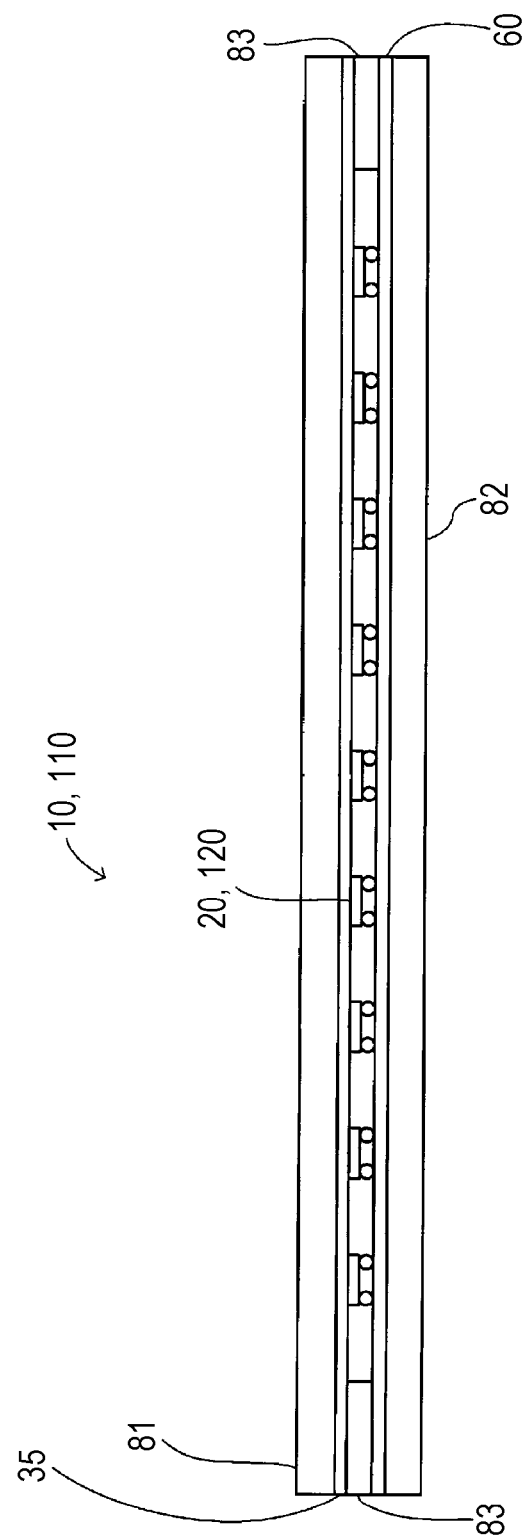
FIG. 44 is a schematic sectional view illustrating a configuration example of an imaging apparatus (X-ray flat panel detector).

A configuration example of the imaging apparatus (X-ray flat panel detector) 10, 110 of the indirect conversion system is illustrated in FIG. 44. The imaging apparatus (X-ray flat panel detector) 10, 110 includes a first substrate 81 having glass which is 0.7 mm in thickness and a second substrate 82 having glass which is 0.7 mm in thickness. Outer edge sections of the first substrate 81 and the second substrate 82 are sealed by sealing members 83. The imaging element units 20, 120 having the scintillator layer 35 are disposed between the first substrate 81 and the second substrate 82. The imaging element units 20, 120 are FC-bonded to the wiring layer 60 as described above. The scintillator layer 35 is formed on a face of the first substrate 81 opposed to the imaging element unit 20, 120.

In the conventional imaging apparatus (X-ray flat panel detector), a TFT array, imaging elements and so forth are formed on a glass substrate, and then a scintillator layer is formed on the imaging element array by using a vacuum process.

On the other hand, in the imaging apparatus (X-ray flat panel detector) 10, 110 illustrated in FIG. 44, the imaging element 30 and the current/voltage conversion circuit 40, 140 are integrally shaped. The light receiving ICs 70 of the imaging element units 20, 120 with solder bumps 61 formed are arranged on the wiring layer 60 with a pixel taken as the unit, and are FC-bonded by the solder bumps 61. Therefore, it is possible to cope with an increased area easily. Furthermore, since manufacture is conducted on the basis of FC bonding, a large scale, expensive bonding apparatus is not needed and it is possible to manufacture (mass-produce) an imaging apparatus (X-ray flat panel detector) having a large area inexpensively.

If each of the first substrate 81 and the second substrate 82 includes a film, it is possible to provide the imaging apparatus (X-ray flat panel detector) 10, 110 with flexibility. For example, the first substrate 81 may include a polyethylene-telephthalate film (PET film) and the second substrate 82 may include a polyimide film having heat resistance.

X-rays are usually emitted from a point light source such as an X-ray generation apparatus. Since the conventional imaging apparatus (X-ray flat panel detector) is produced by high temperature evaporation manufacture, a flat glass plate is used and the conventional imaging apparatus cannot be curved. As the irradiation position moves farther away from a center position irradiated with X-rays, the distance over which X-rays proceed until X-rays arrive at the irradiated face of the imaging apparatus changes. In a case where imaging is conducted with a large area, therefore, accurate image information is obtained in the center position irradiated with X-rays and in positions around the center position. As the irradiation position moves farther away from the center position and positions around the center position, however, the image becomes unclear. In a case where imaging is conducted with a large area by using the conventional imaging apparatus, therefore, imaging is conducted in a plurality of different places and one view is generated by coupling joints between a plurality of imaging views with image processing.

On the other hand, the imaging apparatus according to the present disclosure can be curved. Therefore, it becomes possible to curve the imaging apparatus to make arrival distance from the X-ray source to the irradiated face of the imaging apparatus equal as far as possible. Even in a case where imaging is conducted with a large area, therefore, it is not necessary to conduct imaging in a plurality of places and conduct works to couple a plurality of imaging views, unlike the conventional imaging apparatus. It becomes possible to easily obtain accurate image information by conducting imaging once.

Figure 45:
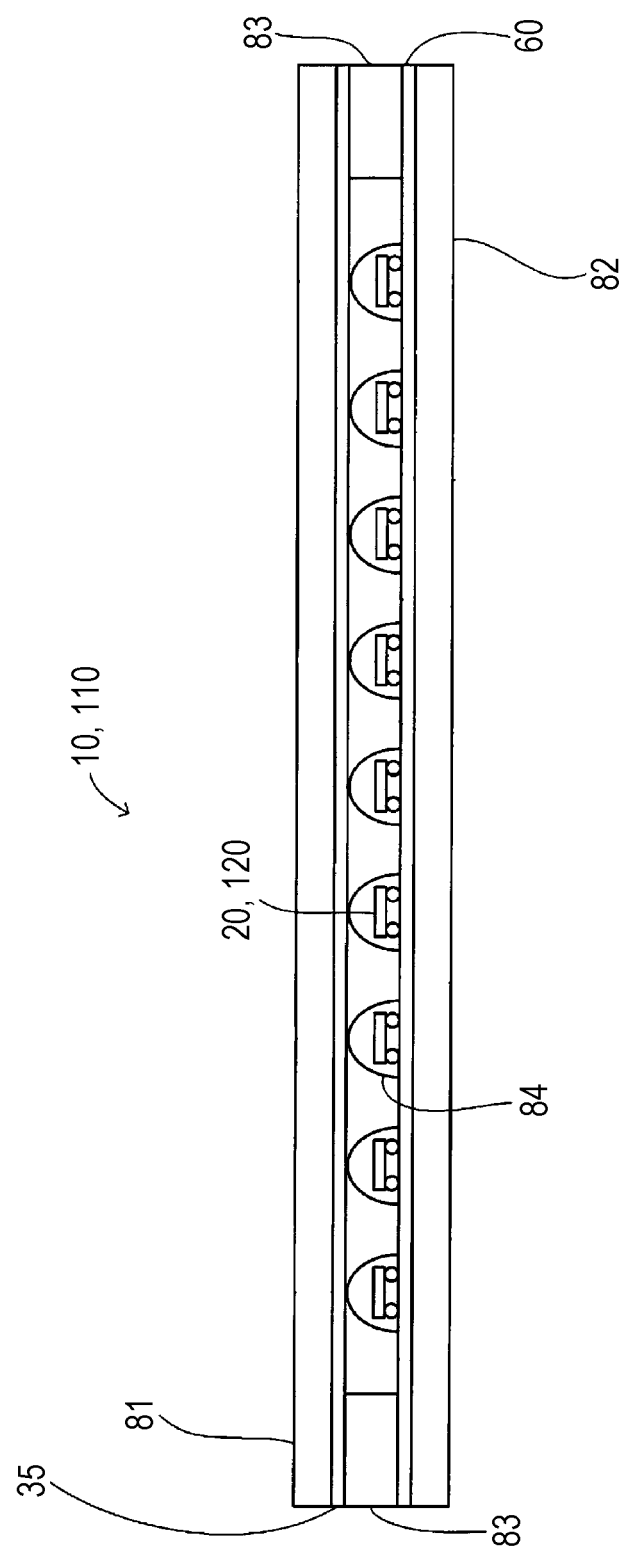
FIG. 45 is a schematic sectional view illustrating a modification of the configuration example of the imaging apparatus (X-ray flat panel detector).
Figure 46:
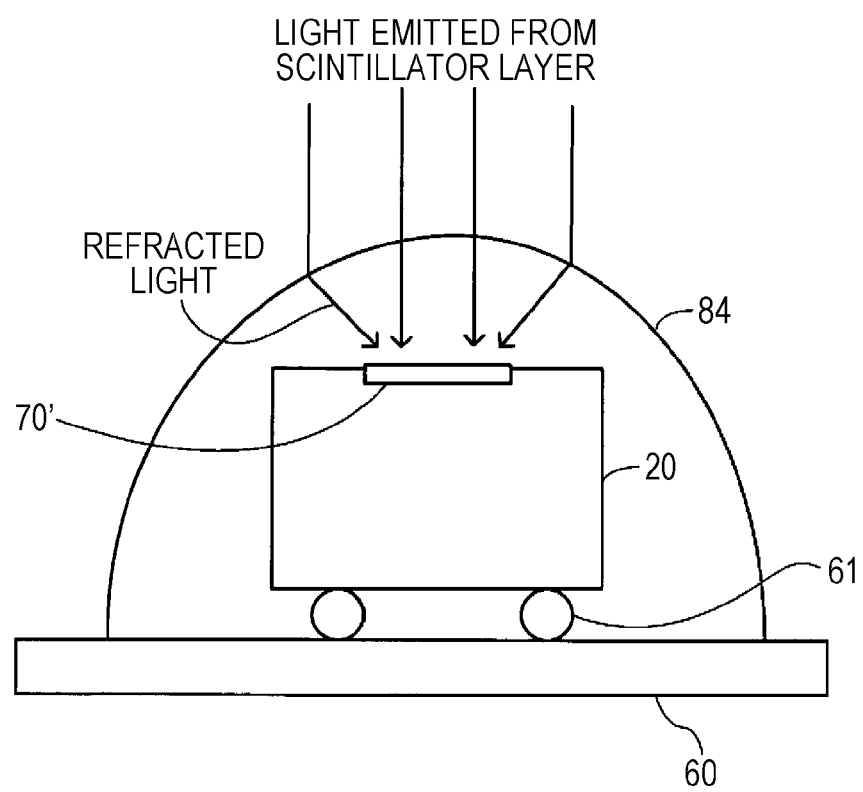
FIG. 46 is an enlarged view of one imaging element unit in the modification of the configuration example of the imaging apparatus (X-ray flat panel detector) illustrated in FIG. 45.

A modification of the imaging apparatus (X-ray flat panel detector) 10, 110 is illustrated in FIG. 45. In this modification, a lens is formed on the light receiving face of the imaging element unit 20, 120. Specifically, the imaging element unit 20, 120 is FC-bonded to the wiring layer 60, and then potting working (resin filling working) of transparent resin 84 on each of the imaging element units 20, 120 by using, for example, a dispenser. Lenses can be formed by using the transparent resin 84. An enlarged view of one imaging element unit 20, 120 is illustrated in FIG. 46. Light emitted from the scintillator layer 35 is refracted by the transparent resin 84 and focused on the light receiving face 70' of the imaging element unit 20, 120. As a result, the light receiving efficiency can be improved.

Figure 47:
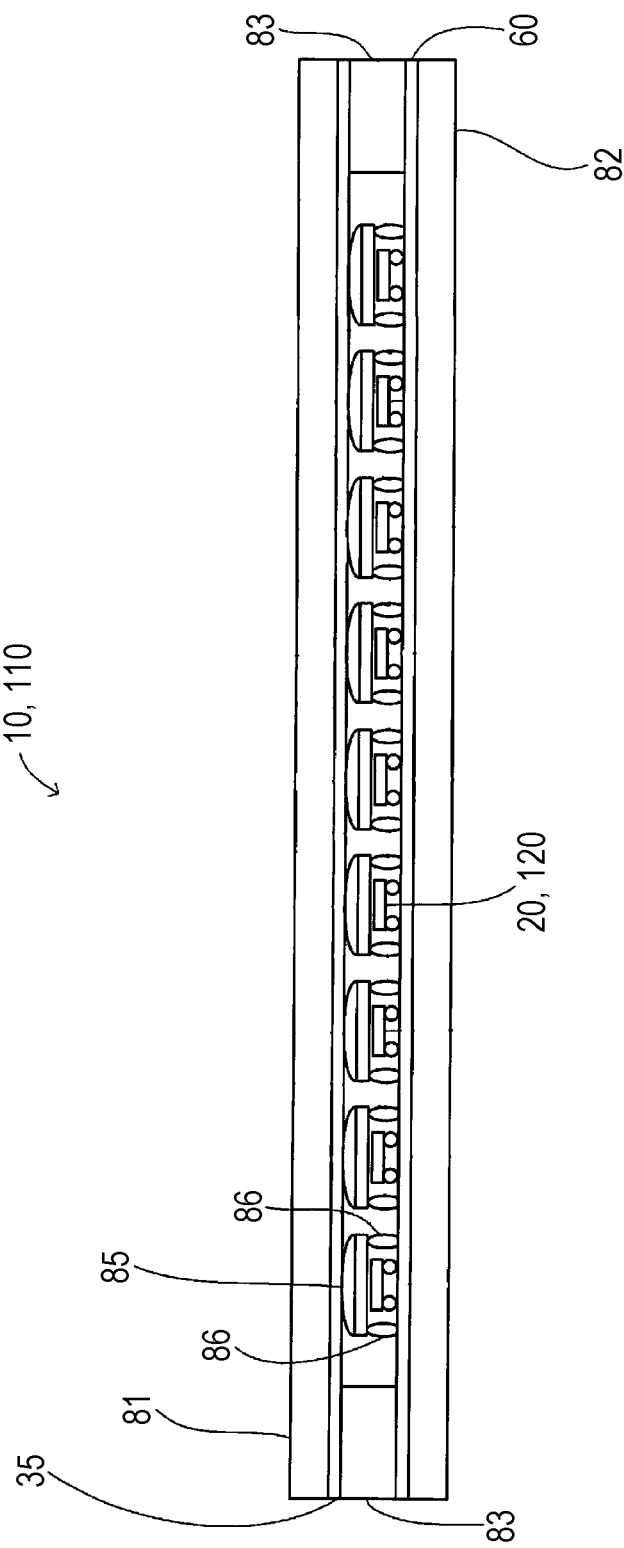
FIG. 47 is a schematic sectional view illustrating a different modification of the configuration example of the imaging apparatus (X-ray flat panel detector).

A different modification of the imaging apparatus (X-ray flat panel detector) 10, 110 is illustrated in FIG. 47. In this modification, a lens section 85 is disposed over each of the imaging element units 20, 120. For the lens section 85 obtained by shaping glass, plastics, or the like, solder bumps 86 for lens section are formed. The lens section 85 is FC-bonded onto the wiring layer 60 to cover the imaging element unit 20, 120. The lens section 85 focuses light emitted from the scintillator layer 35 onto the light receiving face of the imaging element unit 20, 120. Note that, it is important to align a central optical axis of the lens section 85 with a center of the light receiving face of the imaging element unit 20, 120. In this case, the lens section 85 is solder-bonded to the wiring layer 60 via the solder bumps 86 for lens section, and consequently the position is automatically corrected by a self alignment effect of solder. Note that, the self alignment effect means a phenomenon in which a part is moved by surface tension of solder and the part is automatically moved to, for example, a vicinity of the center of a land. According to action of the self alignment effect of solder, it is possible to align the central optical axis of the lens section 85 with the center of the light receiving face of the imaging element unit 20, 120 with an error of, for example, ±1 μm or less by only passage through a reflow furnace. It is possible to automatically correct the positions.

Figure 48:
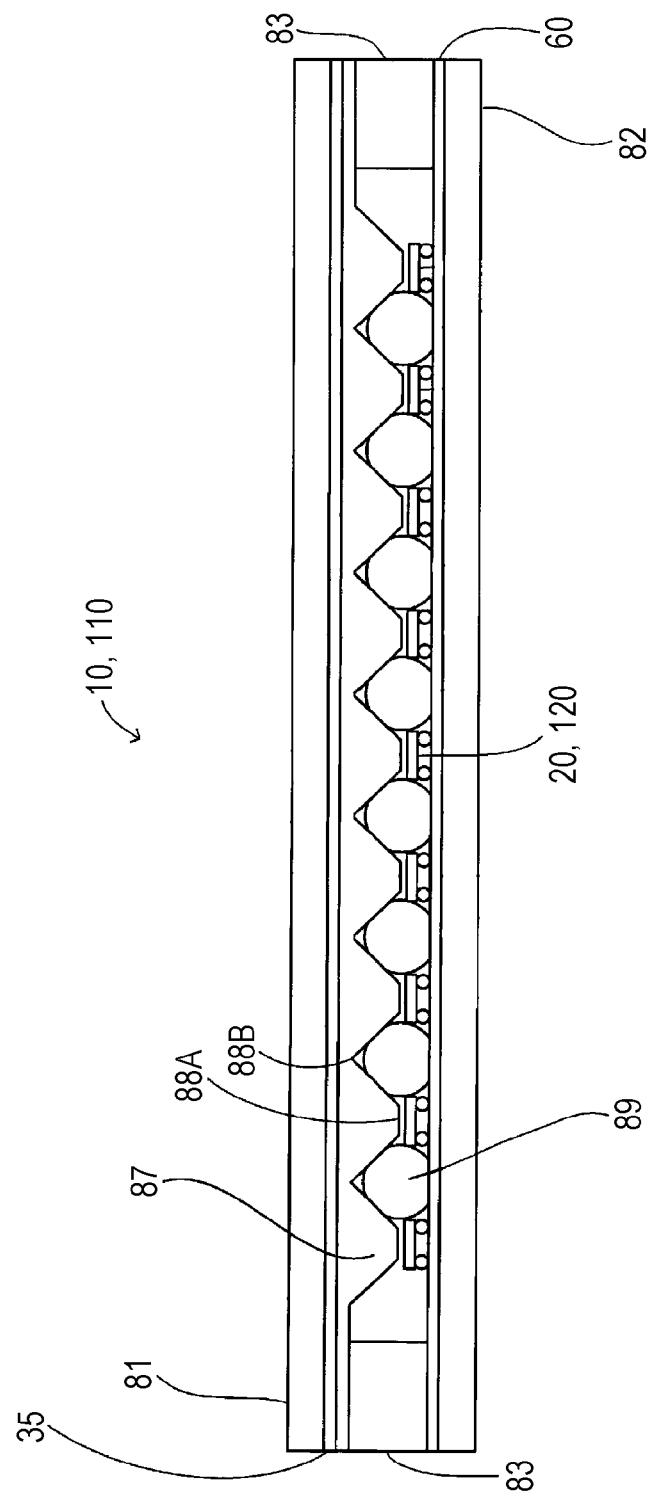
FIG. 48 is a schematic sectional view illustrating a further different modification of the configuration example of the imaging apparatus (X-ray flat panel detector).
Figure 49:
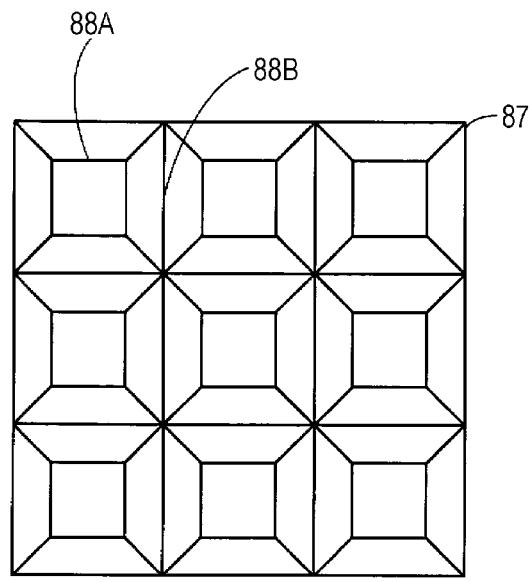
FIG. 49 is a schematic view obtained by viewing a portion of a concave-convex shaped portion of a PET substrate from above in the further different modification of the configuration example of the imaging apparatus (X-ray flat panel detector) illustrated in FIG. 48.

A further different modification of the imaging apparatus (X-ray flat panel detector) 10, 110 is illustrated in FIG. 48. In this modification, a substrate having convex sections and concave sections is disposed over the light receiving face of the imaging element unit. Specifically, a PET substrate 87 is provided between the scintillator layer 35 and the imaging element unit 20, 120. A concave-convex shape is formed every imaging element unit 20, 120 on a face of the PET substrate 87 opposed to the imaging element unit 20, 120. In other words, a convex section 88A and a concave section 88B are formed on the face of the PET substrate 87 opposed to the imaging element unit 20, 120. A view obtained by viewing a portion of the concave-convex shaped portion of the PET substrate 87 from the imaging element unit side is illustrated in FIG. 49. The convex section 88A is disposed to totally reflect the light emitted from the scintillator layer 35 and focus the totally reflected light onto the light receiving face of the imaging element unit 20, 120. Furthermore, a solder bump 89 for bonding having a large diameter is formed between the concave section 88B formed between two convex sections 88A, and the wiring layer 60. The PET substrate 87 is bonded onto the wiring layer 60 via the solder bump 89 for bonding. Note that, positioning of a tip section of the convex section 88A and the light receiving face of the imaging element unit 20, 120 becomes important. However, the solder bump 89 for bonding is formed between the concave section 88B and the wiring layer 60. Therefore, positions are automatically corrected by the alignment effect of solder. In other words, by acting the self alignment effect of solder, it is possible to align the tip section of the convex section 88A with the center of the light receiving face of the imaging element unit 20, 120 by only passage through a reflow furnace. It is possible to automatically correct the positions.

Heretofore, the present disclosure has been described on the basis of favorable Embodiments. However, the present disclosure is not restricted to these Embodiments. The configurations and structures of the current/voltage conversion circuit, the imaging apparatus, or the imaging element unit in the Embodiments are examples. The configurations and structures can be changed suitably.

Note that, the present disclosure can take configurations described hereafter.

[1]<<Imaging Apparatus>>

An imaging apparatus including an imaging panel formed by arranging imaging element units included in one pixel or a plurality of pixels, in a two-dimensional matrix form, each of the imaging element units including:

an imaging element configured to convert an incident electromagnetic wave to a current; and a current/voltage conversion circuit configured to convert the current from the imaging element to a voltage.

[2] Imaging apparatus stated in [1] wherein one imaging element unit includes $m_0$ pixels (where $m_0$ is an integer of at least 2 and $1 \times 10^3$ or less).

[3] The imaging apparatus stated in [1] or [2], wherein the current/voltage conversion circuit includes an operational amplifier and a capacitor section, the operational amplifier includes an output section connected to an output section of the current/voltage conversion circuit, and a first input section and a second input section, and a first end of the capacitor section is connected to the output section of the operational amplifier, and a second end of the capacitor section is connected to the second input section of the operational amplifier and an output section of the imaging element.

[4] The imaging apparatus stated in [3], wherein the current/voltage conversion circuit further includes a short-circuiting circuit having a reset switch circuit, and the capacitor section is connected in parallel with the short-circuiting circuit.

[5] The imaging apparatus stated in [3] or [4], wherein charge is stored in the capacitor section by the current from the imaging element.

[6] The imaging apparatus stated in any one of [3] to [5], wherein the current/voltage conversion circuit includes a plurality of capacitor sections and a changeover switch circuit, and each of the plurality of capacitor sections is connected to the output section of the operational amplifier and the second input section of the operational amplifier via the changeover switch circuit.

[7] The imaging apparatus stated in any one of [3] to [6], wherein the current/voltage conversion circuit further includes a first switch circuit and a second switch circuit, the first input section of the operational amplifier is connected to a first power supply, the output section of the imaging element is connected to the second end of the capacitor section via the first switch circuit and connected to a second power supply via the second switch circuit, and the first switch circuit and the second switch circuit operate complementarily.

[8] The imaging apparatus stated in [7], wherein the current/voltage conversion circuit further includes a second capacitor section and a third switch circuit which conducts same operation as the first switch circuit, and a first end of the second capacitor section is connected to the output section of the operational amplifier via the third switch circuit.

[9] The imaging apparatus stated in [7], wherein
the current/voltage conversion circuit further includes a second capacitor section, a third switch circuit, a fourth switch circuit, a fifth switch circuit, and a sixth switch circuit,
a first end of the second capacitor section is connected to the output section of the operational amplifier via the third switch circuit,
a second end of the second capacitor section is connected to the second input section of the operational amplifier via the fourth switch circuit and connected to the first power supply via the fifth switch circuit, and
the sixth switch circuit is connected between the second end of the capacitor section, and the first switch circuit and the second input section of the operational amplifier.

[10] The imaging apparatus stated in any one of [3] to [9], wherein the current/voltage conversion circuit further includes a buffer circuit connected to the output section of the operational amplifier and the output section of the current/voltage conversion circuit.

[11] The imaging apparatus stated in [1], wherein
the current/voltage conversion circuit includes a field effect transistor and a capacitor section,
a first end of the capacitor section is connected to a one source/drain region of the field effect transistor, and a second end of the capacitor section is connected to a gate electrode of the field effect transistor and an output section of the imaging element, and
the one source/drain region of the field effect transistor is connected to a first power supply and an output section of the current/voltage conversion circuit.

[12] The imaging apparatus stated in [11], wherein
the current/voltage conversion circuit further includes a short-circuiting circuit having a reset switch circuit, and
the capacitor section is connected in parallel with the short-circuiting circuit.

[13] The imaging apparatus stated in [11] or [12], wherein charge is stored in the capacitor section by the current from the imaging element.

[14] The imaging apparatus stated in any one of [11] to [13], wherein
the current/voltage conversion circuit includes a plurality of capacitor sections and a changeover switch circuit, and
each of the plurality of capacitor sections is connected to the one source/drain region and the gate electrode of the field effect transistor via the changeover switch circuit.

[15] The imaging apparatus stated in any one of [11] to [14], wherein
the current/voltage conversion circuit further includes a first switch circuit and a second switch circuit,
the output section of the imaging element is connected to the second end of the capacitor section via the first switch circuit and connected to a second power supply via the second switch circuit, and
the first switch circuit and the second switch circuit operate complementarily.

[16] The imaging apparatus stated in [15], wherein
the current/voltage conversion circuit further includes a second capacitor section and a third switch circuit which conducts same operation as the first switch circuit, and
a first end of the second capacitor section is connected to the one source/drain region of the field effect transistor via the third switch circuit.

[17] The imaging apparatus stated in [15], wherein
the current/voltage conversion circuit further includes a second capacitor section, a third switch circuit, a fourth switch circuit, a fifth switch circuit, and a sixth switch circuit,
a first end of the second capacitor section is connected to the one source/drain region of the field effect transistor via the third switch circuit,
a second end of the second capacitor section is connected to the gate electrode of the field effect transistor via the fourth switch circuit and connected to a third power supply via the fifth switch circuit, and
the sixth switch circuit is connected between the second end of the capacitor section, and the first switch circuit and the gate electrode of the field effect transistor.

[18] The imaging apparatus stated in any one of [11] to [17], wherein the current/voltage conversion circuit further includes a buffer circuit connected to the one source/drain region of the field effect transistor and the output section of the current/voltage conversion circuit.

[19] The imaging apparatus stated in any one of [1] to [18], wherein the imaging element unit is shaped integrally.

[20] The imaging apparatus stated in any one of [1] to [19], wherein the imaging element and the current/voltage conversion circuit are laminated.

[21] The imaging apparatus stated in [20], wherein a lens is formed on a light receiving face of the imaging element unit.

[22] The imaging apparatus stated in [20], wherein a lens is formed over a light receiving face of the imaging element unit.

[23] The imaging apparatus stated in [20], wherein a substrate having convex sections and concave sections is disposed over a light receiving face of the imaging element unit.

[24] The imaging apparatus stated in any one of [1] to [23], wherein
solder bumps are formed for the imaging element unit, and
the imaging element unit is bonded to a wiring layer via the solder bumps.

[25] The imaging apparatus stated in [24], further including a first substrate and a second substrate, wherein
a wiring layer is formed on the second substrate,
a scintillator layer is formed on the first substrate, and
a plurality of imaging element units are disposed between the wiring layer and the scintillator layer.

[26]<<Current/voltage conversion circuit: first aspect>>

A current/voltage conversion circuit connected to an imaging element configured to convert an incident electromagnetic wave to a current, and configured to convert the current from the imaging element to a voltage, the current/voltage conversion circuit including:
an operational amplifier including an output section connected to an output section of the current/voltage conversion circuit, and a first input section and a second input section;
a capacitor section connected at a first end of the operational amplifier to the output section of the operational amplifier and at a second end thereof to the second input section of the operational amplifier; and
a first switch circuit and a second switch circuit configured to operate complementarily,
the first input section of the operational amplifier being connected to a first power supply, and
an output section of the imaging element being connected to the second end of the capacitor section via the first switch circuit and connected to a second power supply via the second switch circuit.

[27] The current/voltage conversion circuit stated in [26], further including a short-circuiting circuit having a reset switch circuit, wherein
the capacitor section is connected in parallel with the short-circuiting circuit.

[28] <<Current/voltage conversion circuit: second aspect>>
A current/voltage conversion circuit connected to an imaging element configured to convert an incident electromagnetic wave to a current, and configured to convert the current from the imaging element to a voltage, the current/voltage conversion circuit including:
a field effect transistor;
a capacitor section; and
a first switch circuit and a second switch circuit configured to operate complementarily,
a first end of the capacitor section being connected to a one source/drain region of the field effect transistor, a second end of the capacitor section being connected to a gate electrode of the field effect transistor,
the one source/drain region of the field effect transistor being connected to a first power supply and an output section of the current/voltage conversion circuit, and
an output section of the imaging element being connected to the second end of the capacitor section via the first switch circuit and connected to a second power supply via the second switch circuit.

[29] The current/voltage conversion circuit stated in [28], further including a short-circuiting circuit having a reset switch circuit, wherein
the capacitor section is connected in parallel with the short-circuiting circuit.

[30] The current/voltage conversion circuit stated in any one of [26] to [29], wherein charge is stored in the capacitor section by the current from the imaging element.

[31] The current/voltage conversion circuit stated in any one of [26] to [30], wherein the current/voltage conversion circuit is shaped integrally with the imaging element.

REFERENCE SIGNS LIST 10, 110 Imaging apparatus (X-ray flat panel detector)
11, 111 Imaging panel
20, 120 Imaging element unit
21 Output wiring line
21A Output terminal of output wiring line
22 Power supply (first power supply and second power supply)
23 Power supply for operational amplifier
122 Second power supply or third power supply
123 First power supply
30 Imaging element
31 Parasitic capacitance of imaging element
32 Bias electrode
33 X-ray conversion layer
34, 37 Pixel electrode
35 Scintillator layer
36 Photodiode
40A, 40B, 40C, 40D, 140A, 140B, 140C current/voltage conversion circuit (charge/voltage conversion circuit)
41 Operational amplifier
41A First input section (non-inverting input section)
41B Second input section (inverting input section)
41C Output section
141 Field effect transistor
42, 42A, 42B, 42C, 142 Capacitor section
43, 143 Short-circuiting circuit
44, 144 Reset switch circuit
45, 145 First switch circuit
46, 146 Second switch circuit
47, 147 Buffer circuit
48, 148 Output switch circuit
51A, 51B, 51C Changeover switch circuit
52, 54, 152 Second capacitor section
53, $53_3$, $155_3$ Third switch circuit
$55_4$, $155_4$ Fourth switch circuit
$55_5$, $155_5$ Fifth switch circuit
$55_6$, $155_6$ Sixth switch circuit
60 Wiring layer
61 Solder bump
62, 75, 76 Under bump metal
63, 72 Wiring lines
64, 71 Light shielding film
70 Light receiving IC
70' Light receiving face of light receiving IC
73 Via hole
74 Solder bump for light receiving IC
81 First substrate
82 Second substrate
83 Sealing member
84 Transparent resin
85 Lens section
86 Solder bump for lens section
87 PET substrate
88A Convex section
88B Concave section
89 Solder bump for bonding

The invention claimed is:

1. An imaging apparatus comprising:
a plurality of imaging element units arranged in rows and columns,
each of the imaging element units including an imaging element configured to convert an incident electromagnetic wave to a current, and
each of the imaging element units further including a current/voltage conversion circuit configured to convert the current from the imaging element to a voltage, wherein
the current/voltage conversion circuit includes an operational amplifier and a capacitor section,
the operational amplifier includes an output section connected to an output section of the current/voltage conversion circuit, and includes a first input section and a second input section, and
a first end of the capacitor section is connected to the output section of the operational amplifier, and a second end of the capacitor section is connected to the second input section of the operational amplifier and an output section of the imaging element.

2. The imaging apparatus according to claim 1, wherein charge is stored in the capacitor section by the current from the imaging element.

3. The imaging apparatus according to claim 1, wherein the current/voltage conversion circuit includes a plurality of capacitor sections and a changeover switch circuit, and
each of the plurality of capacitor sections is connected to the output section of the operational amplifier and the second input section of the operational amplifier via the changeover switch circuit.

4. An imaging apparatus comprising:
a plurality of imaging element units arranged in rows and columns,
at least one of the imaging element units including
an imaging element configured to convert an incident electromagnetic wave to a current, and
a current/voltage conversion circuit configured to convert the current from the imaging element to a voltage, wherein
the current/voltage conversion circuit includes an operational amplifier and a capacitor section,
the operational amplifier includes an output section connected to an output section of the current/voltage conversion circuit, and includes a first input section and a second input section,
a first end of the capacitor section is connected to the output section of the operational amplifier, and a second end of the capacitor section is connected to the second input section of the operational amplifier and an output section of the imaging element,
the current/voltage conversion circuit further includes a first switch circuit and a second switch circuit,
the first input section of the operational amplifier is connected to a first power supply,
the output section of the imaging element is connected to the second end of the capacitor section via the first switch circuit and connected to a second power supply via the second switch circuit, and
the first switch circuit and the second switch circuit operate complementarily.

5. The imaging apparatus according to claim 4, wherein the current/voltage conversion circuit further includes a second capacitor section and a third switch circuit which conducts same operation as the first switch circuit, and
a first end of the second capacitor section is connected to the output section of the operational amplifier via the third switch circuit.

6. The imaging apparatus according to claim 4, wherein the current/voltage conversion circuit further includes a second capacitor section, a third switch circuit, a fourth switch circuit, a fifth switch circuit, and a sixth switch circuit,
a first end of the second capacitor section is connected to the output section of the operational amplifier via the third switch circuit,
a second end of the second capacitor section is connected to the second input section of the operational amplifier via the fourth switch circuit and connected to the first power supply via the fifth switch circuit, and
the sixth switch circuit is connected between the second end of the capacitor section, and
the first switch circuit and the second input section of the operational amplifier.

7. The imaging apparatus according to claim 4, wherein the current/voltage conversion circuit further includes a buffer circuit connected to the output section of the operational amplifier and the output section of the current/voltage conversion circuit.

8. The imaging apparatus according to claim 4, wherein the imaging element unit is shaped integrally.

9. A current/voltage conversion circuit connected to an imaging element configured to convert an incident electromagnetic wave to a current, and configured to convert the current from the imaging element to a voltage, the current/voltage conversion circuit comprising:
an operational amplifier including an output section connected to an output section of the current/voltage conversion circuit, and a first input section and a second input section;
a capacitor section connected at a first end of the operational amplifier to the output section of the operational amplifier and at a second end thereof to the second input section of the operational amplifier; and
a first switch circuit and a second switch circuit configured to operate complementarily,
the first input section of the operational amplifier being connected to a first power supply, and
an output section of the imaging element being connected to the second end of the capacitor section via the first switch circuit and connected to a second power supply via the second switch circuit.

10. The current/voltage conversion circuit according to claim 9, wherein charge is stored in the capacitor section by the current from the imaging element.

11. The current/voltage conversion circuit according to claim 9, wherein the current/voltage conversion circuit is shaped integrally with the imaging element.

* * * * *